United States Patent
Widjaja

(10) Patent No.: US 10,515,968 B2
(45) Date of Patent: *Dec. 24, 2019

(54) DUAL-PORT SEMICONDUCTOR MEMORY AND FIRST IN FIRST OUT (FIFO) MEMORY HAVING ELECTRICALLY FLOATING BODY TRANSISTOR

(71) Applicant: Zeno Semiconductor, Inc., Sunnyvale, CA (US)

(72) Inventor: Yuniarto Widjaja, Cupertino, CA (US)

(73) Assignee: Zeno Semiconductor, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/105,730

(22) Filed: Aug. 20, 2018

(65) Prior Publication Data
US 2019/0006367 A1    Jan. 3, 2019

Related U.S. Application Data

(60) Continuation of application No. 15/730,525, filed on Oct. 11, 2017, now Pat. No. 10,079,236, which is a (Continued)

(51) Int. Cl.
G11C 11/34    (2006.01)
H01L 27/108    (2006.01)
(Continued)

(52) U.S. Cl.
CPC .......... H01L 27/10802 (2013.01); G11C 7/00 (2013.01); G11C 8/10 (2013.01);
(Continued)

(58) Field of Classification Search
CPC .......... H01L 27/10802; H01L 27/1023; H01L 27/105; G11C 7/00; G11C 8/10;
(Continued)

(56) References Cited

U.S. PATENT DOCUMENTS 4,300,212 A    11/1981    Simko
4,559,638 A    12/1985    Bluzer et al.
(Continued)

OTHER PUBLICATIONS

Ban et al., A Scaled Floating Body Cell (FBC) Memory with High-k+Metal Gate on Thin-Silicon and Thin-BOX for 16-nm Technology Node and Beyond, Symposium on VLSI Technology, 2008, pp. 92-93.
(Continued)

*Primary Examiner* — Viet Q Nguyen
(74) *Attorney, Agent, or Firm* — Law Office of Alan W. Cannon

(57) ABSTRACT

Multi-port semiconductor memory cells including a common floating body region configured to be charged to a level indicative of a memory state of the memory cell. The multi-port semiconductor memory cells include a plurality of gates and conductive regions interfacing with said floating body region. Arrays of memory cells and method of operating said memory arrays are disclosed for making a memory device.

20 Claims, 67 Drawing Sheets

Related U.S. Application Data continuation of application No. 15/414,009, filed on Jan. 24, 2017, now Pat. No. 9,812,456, which is a division of application No. 14/563,133, filed on Dec. 8, 2014, now Pat. No. 9,589,963, which is a continuation of application No. 14/282,850, filed on May 20, 2014, now Pat. No. 8,934,296, which is a continuation of application No. 14/046,986, filed on Oct. 6, 2013, now Pat. No. 8,767,458, which is a continuation of application No. 13/296,402, filed on Nov. 15, 2011, now Pat. No. 8,582,359.

(60) Provisional application No. 61/413,992, filed on Nov. 16, 2011.

(51) Int. Cl.
| | |
|---|---|
| G11C 8/10 | (2006.01) |
| G11C 8/16 | (2006.01) |
| G11C 11/405 | (2006.01) |
| G11C 11/40 | (2006.01) |
| G11C 11/403 | (2006.01) |
| H01L 27/102 | (2006.01) |
| G11C 7/00 | (2006.01) |
| H01Q 1/22 | (2006.01) |
| H01L 27/105 | (2006.01) |

(52) U.S. Cl.
CPC ............... *G11C 8/16* (2013.01); *G11C 11/40* (2013.01); *G11C 11/403* (2013.01); *G11C 11/405* (2013.01); *H01L 27/1023* (2013.01); *H01Q 1/2283* (2013.01); *H01L 27/105* (2013.01)

(58) Field of Classification Search
CPC ......... G11C 8/16; G11C 11/40; G11C 11/403; G11C 11/405
USPC .................................................. 365/185.05
See application file for complete search history.

(56) References Cited

U.S. PATENT DOCUMENTS

| | | | |
|---|---|---|---|
| 4,959,812 A | 9/1990 | Momodomi et al. | |
| 5,029,129 A | 7/1991 | Wai Wong | |
| 5,032,538 A | 7/1991 | Bozler et al. | |
| 5,294,819 A | 3/1994 | Simko | |
| 5,519,831 A | 5/1996 | Holzhammer | |
| 5,581,504 A | 12/1996 | Chang et al. | |
| 5,767,549 A | 6/1998 | Chen et al. | |
| 5,784,311 A | 7/1998 | Assaderaghi et al. | |
| 5,999,444 A | 12/1999 | Fujiwara et al. | |
| 6,005,818 A | 12/1999 | Ferrant et al. | |
| 6,097,059 A | 8/2000 | Yamada | |
| 6,141,248 A | 10/2000 | Forbes et al. | |
| 6,163,048 A | 12/2000 | Hirose et al. | |
| 6,166,407 A | 12/2000 | Ohta | |
| 6,229,161 B1 | 5/2001 | Nemati et al. | |
| 6,341,087 B1 | 1/2002 | Kunikiyo et al. | |
| 6,356,485 B1 | 3/2002 | Proebsting et al. | |
| 6,376,876 B1 | 4/2002 | Shin et al. | |
| 6,424,002 B1 | 7/2002 | Kondo et al. | |
| 6,538,954 B2 | 3/2003 | Kunikyo | |
| 6,542,411 B2 | 4/2003 | Tanikawa et al. | |
| 6,566,707 B1 | 5/2003 | Sudo et al. | |
| 6,614,684 B1 | 9/2003 | Shukuri et al. | |
| 6,653,175 B1 | 11/2003 | Nemati et al. | |
| 6,661,042 B2 | 12/2003 | Hsu | |
| 6,686,624 B2 | 2/2004 | Hsu | |
| 6,724,657 B2 | 4/2004 | Shukuri et al. | |
| 6,791,882 B2 | 9/2004 | Seki et al. | |
| 6,801,452 B2 | 10/2004 | Miwa et al. | |
| 6,885,581 B2 | 4/2005 | Nemati et al. | |
| 6,913,964 B2 | 7/2005 | Hsu | |
| 6,925,006 B2 | 8/2005 | Fazan et al. | |
| 6,937,516 B2 | 8/2005 | Fazen et al. | |
| 6,954,377 B2 | 10/2005 | Choi et al. | |
| 6,956,256 B2 | 10/2005 | Forbes | |
| 6,969,662 B2 | 11/2005 | Fazan et al. | |
| 7,061,806 B2 | 6/2006 | Tang et al. | |
| 7,081,653 B2 | 7/2006 | Kawanaka | |
| 7,085,156 B2 | 8/2006 | Ferrant et al. | |
| 7,118,986 B2 | 10/2006 | Steigerwalt et al. | |
| 7,170,807 B2 | 1/2007 | Fazan et al. | |
| 7,196,926 B1 | 3/2007 | Kim | |
| 7,224,019 B2 | 5/2007 | Hieda et al. | |
| 7,224,020 B2 | 5/2007 | Wang et al. | |
| 7,230,846 B2 | 6/2007 | Keshavarzi et al. | |
| 7,259,420 B2 | 8/2007 | Anderson et al. | |
| 7,259,992 B2 | 8/2007 | Shirota | |
| 7,285,820 B2 | 10/2007 | Park et al. | |
| 7,285,832 B2 | 10/2007 | Hoefler et al. | |
| 7,301,803 B2 | 11/2007 | Okhonin et al. | |
| 7,329,580 B2 | 2/2008 | Cho et al. | |
| 7,359,229 B2 | 4/2008 | Ferrant et al. | |
| 7,378,702 B2 | 5/2008 | Lee | |
| 7,391,640 B2 | 6/2008 | Tang et al. | |
| 7,440,333 B2 | 10/2008 | Hsia et al. | |
| 7,447,068 B2 | 11/2008 | Tsai et al. | |
| 7,450,423 B2 | 11/2008 | Lai et al. | |
| 7,473,611 B2 | 1/2009 | Cho et al. | |
| 7,504,302 B2 | 3/2009 | Mathew et al. | |
| 7,541,636 B2 | 6/2009 | Ranica et al. | |
| 7,542,345 B2 | 6/2009 | Okhonin et al. | |
| 7,579,241 B2 | 8/2009 | Hieda et al. | |
| 7,609,551 B2 | 10/2009 | Shino et al. | |
| 7,622,761 B2 | 11/2009 | Park et al. | |
| 7,652,916 B2 | 1/2010 | Shepard | |
| 7,683,430 B2 * | 3/2010 | Okhonin | G11C 11/404 257/350 |
| 7,701,751 B2 | 4/2010 | Kang et al. | |
| 7,701,763 B2 | 4/2010 | Roohparvar | |
| 7,733,693 B2 | 6/2010 | Ferrant et al. | |
| 7,738,312 B2 | 6/2010 | Shimano et al. | |
| 7,759,715 B2 | 7/2010 | Bhattacharyya | |
| 7,760,548 B2 | 7/2010 | Widjaja | |
| 7,847,338 B2 | 12/2010 | Widjaja | |
| 7,898,009 B2 | 3/2011 | Wilson et al. | |
| 7,903,472 B2 * | 3/2011 | Chen | H01L 27/115 365/184 |
| 7,924,630 B2 | 4/2011 | Carman | |
| 7,933,140 B2 | 4/2011 | Wang et al. | |
| 8,014,200 B2 | 9/2011 | Widjaja | |
| 8,018,007 B2 | 9/2011 | Chang et al. | |
| 8,036,033 B2 | 10/2011 | Widjaja | |
| 8,059,459 B2 | 11/2011 | Widjaja | |
| 8,077,536 B2 | 12/2011 | Widjaja | |
| 8,130,547 B2 | 3/2012 | Widjaja et al. | |
| 8,130,548 B2 | 3/2012 | Widjaja et al. | |
| 8,159,878 B2 | 4/2012 | Widjaja | |
| 8,174,886 B2 | 5/2012 | Widjaja et al. | |
| 8,194,451 B2 | 6/2012 | Widjaja | |
| 8,208,302 B2 | 6/2012 | Widjaja et al. | |
| 8,243,499 B2 | 8/2012 | Widjaja | |
| 8,264,875 B2 | 9/2012 | Widjaja et al. | |
| 8,294,193 B2 | 10/2012 | Widjaja | |
| 8,391,066 B2 | 3/2013 | Widjaja | |
| 8,472,249 B2 | 6/2013 | Widjaja | |
| 8,498,140 B2 | 7/2013 | Fossum et al. | |
| 8,514,622 B2 | 8/2013 | Widjaja | |
| 8,514,623 B2 | 8/2013 | Widjaja et al. | |
| 8,531,878 B2 | 9/2013 | Banna et al. | |
| 8,531,881 B2 | 9/2013 | Widjaja | |
| 8,559,257 B2 | 10/2013 | Widjaja | |
| 8,570,803 B2 | 10/2013 | Widjaja | |
| 8,582,359 B2 * | 11/2013 | Widjaja | G11C 8/10 365/185.05 |
| 8,654,583 B2 | 2/2014 | Widjaja | |
| 8,711,622 B2 | 4/2014 | Widjaja | |
| 8,767,458 B2 * | 7/2014 | Widjaja | G11C 8/10 365/177 |
| 8,787,072 B2 | 7/2014 | Fossum et al. | |

(56) References Cited

U.S. PATENT DOCUMENTS

| | | | |
|---|---|---|---|
| 8,787,085 B2 | 7/2014 | Widjaja | |
| 8,837,247 B2 | 9/2014 | Widjaja | |
| 8,923,052 B2 | 12/2014 | Widjaja | |
| 8,934,296 B2 * | 1/2015 | Widjaja | G11C 8/10 365/177 |
| 8,937,834 B2 | 1/2015 | Widjaja et al. | |
| 8,957,458 B2 | 2/2015 | Widjaja | |
| 8,964,456 B2 | 2/2015 | Jensen | |
| 8,995,186 B2 | 3/2015 | Widjaja | |
| 9,001,581 B2 | 4/2015 | Widjaja | |
| 9,025,358 B2 | 5/2015 | Widjaja | |
| 9,030,872 B2 | 5/2015 | Widjaja et al. | |
| 9,087,580 B2 | 7/2015 | Widjaja | |
| 9,153,309 B2 | 10/2015 | Widjaja | |
| 9,153,333 B2 | 10/2015 | Widjaja | |
| 9,208,840 B2 | 12/2015 | Widjaja et al. | |
| 9,208,880 B2 | 12/2015 | Louie et al. | |
| 9,209,188 B2 | 12/2015 | Widjaja | |
| 9,230,965 B2 | 1/2016 | Widjaja | |
| 9,236,382 B2 | 1/2016 | Widjaja et al. | |
| 9,257,179 B2 | 2/2016 | Widjaja | |
| 9,281,022 B2 * | 3/2016 | Louie | G11C 5/148 |
| 9,391,079 B2 | 7/2016 | Widjaja | |
| 9,431,401 B2 | 8/2016 | Han et al. | |
| 9,455,262 B2 | 9/2016 | Widjaja | |
| 9,460,790 B2 | 10/2016 | Widjaja | |
| 9,484,082 B2 | 11/2016 | Widjaja | |
| 9,490,012 B2 | 11/2016 | Widjaja | |
| 9,514,803 B2 | 12/2016 | Widjaja et al. | |
| 9,576,617 B1 | 2/2017 | Lee et al. | |
| 9,589,963 B2 * | 3/2017 | Widjaja | G11C 8/10 |
| 9,601,493 B2 | 3/2017 | Widjaja | |
| 9,614,080 B2 | 4/2017 | Widjaja | |
| 9,646,693 B2 | 5/2017 | Widjaja | |
| 9,653,467 B2 | 5/2017 | Widjaja et al. | |
| 9,679,648 B2 | 6/2017 | Widjaja | |
| 9,704,870 B2 | 7/2017 | Widjaja | |
| 9,715,932 B2 | 7/2017 | Widjaja | |
| 9,747,983 B2 | 8/2017 | Widjaja | |
| 9,761,311 B2 | 9/2017 | Widjaja | |
| 9,761,589 B2 | 9/2017 | Widjaja | |
| 9,793,277 B2 | 10/2017 | Widjaja et al. | |
| 9,812,203 B2 | 11/2017 | Widjaja | |
| 9,812,456 B2 * | 11/2017 | Widjaja | G11C 8/10 |
| 9,847,131 B2 | 12/2017 | Widjaja | |
| 9,905,564 B2 * | 2/2018 | Widjaja | G11C 11/404 |
| 9,922,981 B2 | 3/2018 | Widjaja | |
| 9,928,910 B2 | 3/2018 | Widjaja | |
| 9,960,166 B2 | 5/2018 | Widjaja | |
| 9,978,450 B2 | 5/2018 | Widjaja | |
| 10,008,266 B1 | 6/2018 | Widjaja | |
| 10,032,514 B2 | 7/2018 | Widjaja | |
| 10,032,776 B2 | 7/2018 | Widjaja et al. | |
| 10,056,387 B2 | 8/2018 | Widjaja | |
| 10,079,236 B2 * | 9/2018 | Widjaja | G11C 8/10 |
| 10,079,301 B2 * | 9/2018 | Han | H01L 29/7841 |
| 2002/0018366 A1 | 2/2002 | Von Schwerin et al. | |
| 2002/0048193 A1 | 4/2002 | Tanikawa et al. | |
| 2002/0167036 A1 | 11/2002 | Hwang et al. | |
| 2004/0057286 A1 | 3/2004 | Chen et al. | |
| 2004/0151606 A1 | 8/2004 | Doerr et al. | |
| 2004/0228168 A1 | 11/2004 | Sharma et al. | |
| 2005/0024968 A1 | 2/2005 | Lee et al. | |
| 2005/0032313 A1 | 2/2005 | Forbes | |
| 2005/0124120 A1 | 6/2005 | Du et al. | |
| 2006/0044915 A1 | 3/2006 | Park et al. | |
| 2006/0125010 A1 | 6/2006 | Bhattacharyya | |
| 2006/0157679 A1 | 7/2006 | Scheuerlein | |
| 2006/0227601 A1 | 10/2006 | Bhattacharyya | |
| 2006/0237770 A1 | 10/2006 | Huang et al. | |
| 2006/0278915 A1 | 12/2006 | Lee et al. | |
| 2007/0004149 A1 | 1/2007 | Tews | |
| 2007/0023789 A1 | 2/2007 | Hoefler et al. | |
| 2007/0090443 A1 | 4/2007 | Choi et al. | |
| 2007/0138530 A1 | 6/2007 | Okhonin | |
| 2007/0164351 A1 | 7/2007 | Hamamoto | |
| 2007/0164352 A1 | 7/2007 | Padilla | |
| 2007/0210338 A1 | 9/2007 | Orlowski | |
| 2007/0211535 A1 | 9/2007 | Kim | |
| 2007/0215954 A1 | 9/2007 | Mouli | |
| 2007/0284648 A1 | 12/2007 | Park et al. | |
| 2008/0012051 A1 | 1/2008 | Cho | |
| 2008/0048239 A1 | 2/2008 | Huo et al. | |
| 2008/0080248 A1 | 4/2008 | Lue et al. | |
| 2008/0123418 A1 | 5/2008 | Widjaja | |
| 2008/0179656 A1 | 7/2008 | Aoki | |
| 2008/0205114 A1 | 8/2008 | Ferrant et al. | |
| 2008/0224202 A1 | 9/2008 | Young et al. | |
| 2008/0265305 A1 | 10/2008 | He et al. | |
| 2008/0303079 A1 | 12/2008 | Cho et al. | |
| 2009/0016101 A1 | 1/2009 | Okhonin et al. | |
| 2009/0034320 A1 | 2/2009 | Ueda | |
| 2009/0065853 A1 | 3/2009 | Hanafi | |
| 2009/0081835 A1 | 3/2009 | Kim et al. | |
| 2009/0085089 A1 | 4/2009 | Chang et al. | |
| 2009/0108322 A1 | 4/2009 | Widjaja | |
| 2009/0108351 A1 | 4/2009 | Yang et al. | |
| 2009/0109750 A1 | 4/2009 | Widjaja | |
| 2009/0173985 A1 | 7/2009 | Lee et al. | |
| 2009/0190402 A1 | 7/2009 | Hsu et al. | |
| 2009/0251966 A1 | 10/2009 | Widjaja | |
| 2009/0316492 A1 | 12/2009 | Widjaja | |
| 2010/0008139 A1 | 1/2010 | Bae | |
| 2010/0034041 A1 | 2/2010 | Widjaja | |
| 2010/0046287 A1 | 2/2010 | Widjaja | |
| 2010/0157669 A1 | 6/2010 | Audzeyeu et al. | |
| 2010/0221877 A1 | 9/2010 | Park et al. | |
| 2010/0246277 A1 | 9/2010 | Widjaja | |
| 2010/0246284 A1 | 9/2010 | Widjaja | |
| 2011/0032756 A1 | 2/2011 | Widjaja | |
| 2011/0042736 A1 | 2/2011 | Widjaja | |
| 2011/0044110 A1 | 2/2011 | Widjaja | |
| 2011/0228591 A1 | 9/2011 | Widjaja | |
| 2011/0249499 A1 | 10/2011 | Fisch et al. | |
| 2011/0305085 A1 | 12/2011 | Widjaja | |
| 2012/0012915 A1 | 1/2012 | Widjaja et al. | |
| 2012/0014180 A1 | 1/2012 | Widjaja | |
| 2012/0014188 A1 | 1/2012 | Widjaja et al. | |
| 2012/0069652 A1 | 3/2012 | Widjaja | |
| 2012/0106234 A1 | 5/2012 | Widjaja | |
| 2012/0113712 A1 | 5/2012 | Widjaja | |
| 2012/0120752 A1 | 5/2012 | Widjaja | |
| 2012/0217549 A1 | 8/2012 | Widjaja | |
| 2012/0223369 A1 | 9/2012 | Gupta et al. | |
| 2012/0230123 A1 | 9/2012 | Widjaja et al. | |
| 2013/0015517 A1 | 1/2013 | Widjaja et al. | |
| 2013/0292635 A1 | 11/2013 | Widjaja | |
| 2013/0301349 A1 | 11/2013 | Widjaja | |
| 2014/0036577 A1 | 2/2014 | Widjaja et al. | |
| 2014/0159156 A1 | 6/2014 | Widjaja | |
| 2014/0160868 A1 | 6/2014 | Widjaja et al. | |
| 2014/0332899 A1 | 11/2014 | Widjaja | |
| 2014/0334229 A1 | 11/2014 | Okhonin | |
| 2014/0340972 A1 | 11/2014 | Widjaja et al. | |
| 2014/0355343 A1 | 12/2014 | Widjaja | |
| 2015/0023105 A1 | 1/2015 | Widjaja et al. | |
| 2015/0092486 A1 | 4/2015 | Widjaja | |
| 2015/0109860 A1 | 4/2015 | Widjaja | |
| 2015/0170743 A1 | 6/2015 | Widjaja | |
| 2015/0187776 A1 | 7/2015 | Widjaja | |
| 2015/0221650 A1 | 8/2015 | Widjaja et al. | |
| 2015/0310917 A1 | 10/2015 | Widjaja | |
| 2015/0371707 A1 | 12/2015 | Widjaja | |
| 2016/0005741 A1 | 1/2016 | Widjaja | |
| 2016/0005750 A1 | 1/2016 | Widjaja | |
| 2016/0078921 A1 | 3/2016 | Widjaja et al. | |
| 2016/0086655 A1 | 3/2016 | Widjaja | |
| 2016/0111158 A1 | 4/2016 | Widjaja | |
| 2016/0233224 A1 | 8/2016 | Rhie | |
| 2016/0300841 A1 | 10/2016 | Widjaja | |
| 2016/0365444 A1 | 12/2016 | Widjaja | |
| 2017/0025534 A1 | 1/2017 | Widjaja | |
| 2017/0032842 A1 | 2/2017 | Widjaja | |
| 2017/0040326 A1 | 2/2017 | Widjaja | |

(56) References Cited

U.S. PATENT DOCUMENTS

| | | |
|---|---|---|
| 2017/0053919 A1 | 2/2017 | Widjaja et al. |
| 2017/0133091 A1 | 5/2017 | Widjaja |
| 2017/0133382 A1 | 5/2017 | Widjaja |
| 2017/0154888 A1 | 6/2017 | Widjaja |
| 2017/0169887 A1 | 6/2017 | Widjaja |
| 2017/0213593 A1 | 7/2017 | Widjaja |
| 2017/0221900 A1 | 8/2017 | Widjaja et al. |
| 2017/0271339 A1 | 9/2017 | Widjaja |
| 2017/0294230 A1 | 10/2017 | Widjaja |
| 2017/0365340 A1 | 12/2017 | Widjaja |
| 2017/0365607 A1 | 12/2017 | Widjaja |
| 2018/0012893 A1 | 1/2018 | Widjaja et al. |
| 2018/0025780 A1 | 1/2018 | Widjaja |
| 2018/0047731 A1 | 2/2018 | Widjaja |
| 2018/0075907 A1 | 3/2018 | Widjaja |
| 2018/0166446 A1 | 6/2018 | Widjaja |
| 2018/0174654 A1 | 6/2018 | Widjaja |
| 2018/0182458 A1 | 6/2018 | Widjaja |
| 2018/0219013 A1 | 8/2018 | Widjaja |
| 2018/0233199 A1 | 8/2018 | Widjaja |
| 2018/0301191 A1 | 10/2018 | Widjaja |

OTHER PUBLICATIONS

Campardo G. et al., VLSI Design of Non-Volatile Memories, Springer Berlin Heidelberg New York, 2005, pp. 94-95.
Cho et al., A novel capacitor-less DRAM cell using Thin Capacitively-Coupled Thyristor (TCCT), pp. 1-4, 2005.
Frontiers of Silicon-on-insulator., vol. 93, No. 9, pp. 4955-4978, May 2003.
Han et al. Programming/Erasing Characteristics of 45 nm NOR-Type Flash Memory Based on SOI FinFET Structure. J. Korean Phys. Society, vol. 47, Nov. 2005, pp. S564-S567.
Headland. Hot electron injection, Feb. 19, 2004.
Langholz, et al., Foundation of Digital Logic Design., pp. 339-344, 1998.
Lanyon, et al., "Bandgap Narrowing in Moderately to Heavily Doped Silicon", IEEE Trans. on Electron Devices, vol. ED-26, No. 7, 1979, pp. 1014-1018.
Lin, et al., "A new 1T DRAM Cell with enhanced Floating Body Effect", Proc. of 2006 IEEE International Workshop on Memory Tech., Design and Testing, pp. 1-5, 2006.
Montaanaro et al., A 160-MHz, 32-b, 05-W CMOS RISC Microprocessor, vol. 31, No. 11, pp. 1703-1714, Nov. 1996.
Oh, et al., "A 4-Bit Double SONOS memory (DSM) with 4 Storage Nodes Per Cell for Ultimate Multi-Bit Operation", 2006 Symposium on VLSI Tech. Digest of Tech. Papers, pp. 1-2, 2006.
Okhonin, et al., Principles of Transient Charge Pumping on Partially Depleted SOI MOSFETs, IEEE Electron Device Letters, vol. 23, No. 5, May 2002, pp. 279-281.
Okhonin et al. A SOI Capacitor-less 1T-DRAM Concept, 2001IEEE International SOI Conference, 2001, pp. 153-154.
Ohsawa et al., An 18.5ns 128Mb SOI DRAM with a Floating body Cell, IEEE International Solid-State Circuits Conference, 2005, pp. 458-459, 609.
Pellizzer et al., A 90nm Phase Change Memory Technology for Stand-Alone Non-Volatile Memory Applications, IEEE 2006 Symposium on VLSI Tech. Digest of Tech. Papers, pp. 1-2, 2006.
Ranica, et al. "Scaled IT-Bulk devices built with CMOS 90nm technology for low-cost eDRAM applications." VLSI Technology, 2005. Digest of Technical Papers. 2005 Symposium on. IEEE, 2005, pp. 38-39.
Rothemund, et al., The importance of being modular, Nature, vol. 485, May 2012 pp. 584-585.
Reisch, "On bistable behavior and open-base breakdown of bipolar transistors in the avalanche regime-modeling and applications." Electron Devices, IEEE Transactions on 39.6 (1992): 1398-1409.
Robert F. Pierret. Semiconductor Device Fundamentals, ISBN: 0-201-54393-1, 1996, by Addison-Wesley Publishing Company, Inc. PNPN Devices 463-476.

Rodriguez, et al. "A-RAM: Novel capacitor-less DRAM memory." In SOI Conference, 2009 IEEE International, pp. 1-2. IEEE, 2009.
Rodriguez, et al. "A-RAM memory cell: concept and operation." Electron Device Letters, IEEE, vol. 31, No. 9 (2010), pp. 972-974.
Rodriguez, et al. "Novel capacitorless 1T-DRAM cell for 22-nm node compatible with bulk and SOI substrates." Electron Devices, IEEE Transactions on, vol. 58, No. 8 (2011), pp. 2371-2377.
Romanjek, et al., "Compact (Wg/Lg=80/85nm) FDSOI 1T-DRAM programmed by Meta Stable Dip", Ultimate Integration on Silicon (ULIS), 2012 13th International Conference on, Mar. 6, 2012, pp. 199-202.
Sugizaki et al., Ultra-high-speed Novel Bulk Thyristor-SRAM (BT-RAM) Cell with Selective Epitaxy Anode (SEA), pp. 1-4, 2006.
Sakui, K., et al. "A new static memory cell based on the reverse base current effect of bipolar transistors." Electron Devices, IEEE Transactions on 36.6 (1989): 1215-1217.
Sakui, Koji, et al. "A new static memory cell based on reverse base current (RBC) effect of bipolar transistor." Electron Devices Meeting, 1988. IEDM'88. Technical Digest., International. IEEE, 1988, pp. 44-47.
Shim, Kyung-Suk, In-Young Chung, and Young June Park. "A BJT-Based Heterostructure 1T-DRAM for Low-Voltage Operation." Electron Device Letters, vol. 33, No. 1, 2012, pp. 14-16.
Shin, et al. "Vertical-Gate Si/SiGe Double-HBT-Based Capacitorless 1T DRAM Cell for Extended Retention Time at Low Latch Voltage." Electron Device Letters, vol. 33, No. 2, 2012, pp. 134-136.
Shin, et al. "A novel double HBT-based capacitorless 1T DRAM cell with Si/SiGe heterojunctions." Electron Device Letters, vol. 32, No. 7, 2011, pp. 850-852.
Sze, et al. Physics of Semiconductor Devices, Wiley-Interscience, 2007, p. 104.
Tack, et al. "The multistable charge-controlled memory effect in SOI MOS transistors at low temperatures." Electron Devices, IEEE Transactions on 37.5 (1990): 1373-1382.
Terada, et al. "A new VLSI memory cell using capacitance coupling (CC cell)." Electron Devices, IEEE Transactions on 31.9 (1984): pp. 319-1324.
Villaret, et al. "Further insight into the physics and modeling of floating-body capacitorless DRAMs." Electron Devices, IEEE Transactions on 52.11 (2005): pp. 2447-2454.
Ventrice, et al. "Analytical model of deeply-scaled thyristors for memory applications." Microelectronics and Electron Devices (WMED), 2012 IEEE Workshop on. IEEE, 2012, pp. 1-4.
Wu, et al. "Experimental Demonstration of the High-Performance Floating-Body/Gate DRAM Cell for Embedded Memories", IEEE Elec. Dev. Letter, vol. 33, No. 6, Jun. 2012, pp. 743-745.
Yoshida et al., A Design of a Capacitorless 1T-DRAM Cell Using Gate-Induced Drain Leakage (GIDL) Current for Low-power and High-speed Embedded Memory, International Electron Devices Meeting, 2003, pp. 1-4.
Zhang, et al. "Total Ionizing Dose Effects on FinFET-Based Capacitor-Less 1T-DRAMs." Nuclear Science, IEEE Transactions on, vol. 57, No. 6, 2010, pp. 3298-3304.
Ohsawa et al. Autonomous refresh of floating body cell (FBC), IEEE, pp. 801-804, 2008.
Ohsawa, et al. Autonomous refresh of floating-body cell due to Current Anomaly of Impact Ionization, IEEE Transactions on Electron Devices, vol. 56, No. 10, pp. 2302-2311, 2009.
Almeida, et al., "Comparison between low and high read bias in FB-RAM on UTBOX FDSOI devices", Ultimate Integration on Silicon (ULIS), 2012 13th International Conference on, Mar. 6, 2012, pp. 61-64.
Andrade, et al., "The Impact of Back Bias on the Floating Body Effect in UTBOX SOI Devices for 1T-FBRAM Memory Applications", Devices, Circuits and Systems (ICCDCS), 2012 8th International Caribbean Conference on. IEEE, 2012, pp. 1-4.
Aoulaiche, et al. "Junction Field Effect on the Retention Time for One-Transistor Floating-Body RAM." Electron Devices, IEEE Transactions on, vol. 59, No. 8, 2012, pp. 2167-2172.
Aoulaiche, et al. "Hot hole induced damage in 1T-FBRAM on bulk FinFET." Reliability Physics Symposium (IRPS), 2011 IEEE International. IEEE, 2011, pp. 99-104.

(56) References Cited

OTHER PUBLICATIONS

Avci, et al. "Floating-Body Diode—A Novel DRAM Device." Electron Device Letters, IEEE, vol. 33, No. 2, 2012, pp. 161-163.

Bawedin, et al., "Floating-Body SOI Memory: Concepts, Physics, and Challenges", ECS Transactions 19.4 (2009), pp. 243-256.

Ban, et al. "Integration of Back-Gate doping for 15-nm node floating body cell (FBC) memory." VLSI Technology (VLSIT), 2010 Symposium on. IEEE, 2010, pp. 159-160.

Cho, et al. "Variation-aware study of BJT-based capacitorless DRAM cell scaling limit." Silicon Nanoelectronics Workshop (SNW), 2012 IEEE. IEEE, 2012, pp. 1-2.

Cho, et al. "Variation Study and Implications for BJT-Based Thin-Body Capacitorless DRAM." Electron Device Letters, IEEE, vol. 33, No. 3, 2012, pp. 312-314.

Chiu, et al. "Characteristics of a new trench-oxide thin-film transistor and its 1T-DRAM applications." Solid-State and Integrated Circuit Technology (ICSICT), 2010 10th IEEE International Conference on. IEEE, 2010, pp. 1106-1108.

Chiu, et al. "A simple process of thin-film transistor using the trench-oxide layer for improving 1T-DRAM performance." Next-Generation Electronics (ISNE), 2010 International Symposium on. IEEE, 2010, pp. 254-257.

Chun, et al. "A 1.1 V, 667MHz random cycle, asymmetric 2T gain cell embedded DRAM with a 99.9 percentile retention time of 110 µsec." VLSI Circuits (VLSIC), 2010 IEEE Symposium on. IEEE, 2010, pp. 191-192.

Chun, et al. "A 667 MHz Logic-Compatible Embedded DRAM Featuring an Asymmetric 2T Gain Cell for High Speed On-Die Caches." Solid-State Circuits, IEEE Journal of, vol. 47, No. 2, 2012, pp. 547-559.

Cao, et al. "A Novel 1T-1D DRAM Cell for Embedded Application." Electron Devices, IEEE Transactions on, vol. 59, No. 5, 2012, pp. 1304-1310.

Collaert, et al. "Substrate bias dependency of sense margin and retention in bulk FinFET 1T-DRAM cells." Solid-State Electronics 65 (2011), pp. 205-210.

Collaert, et al. "A low-voltage biasing scheme for aggressively scaled bulk FinFET 1T-DRAM featuring 10s retention at 85 C" VLSI Technology (VLSIT), 2010 Symposium on. IEEE, 2010, pp. 161-162.

Chatterjee, et al. "Taper isolated dynamic gain RAM cell." Electron Devices Meeting, 1978 International. vol. 24. IEEE, 1978, pp. 698-699.

Chatterjee, et al. Circuit Optimization of the Paper Isolated Dynamic Gain RAM Cell for VLSI Memories, pp. 22-23, 1979 IEEE International Solid-State Circuits Conference.

Chatterjee, et al. "A survey of high-density dynamic RAM cell concepts." Electron Devices, IEEE Transactions on 26.6 (1979): 827-839.

Erb, D. "Stratified charge memory." Solid-State Circuits Conference. Digest of Technical Papers. 1978 IEEE International. vol. 21. IEEE, 1978, pp. 24-25.

Galeti, M., et al. "BJT effect analysis in p-and n-SOI MuGFETs with high-k gate dielectrics and TiN metal gate electrode for a 1T-DRAM application." SOI Conference (SOI), 2011 IEEE International. IEEE, 2011, pp. 1-2.

Gamiz, et al. "3D Trigate 1T-DRAM Memory Cell for 2x nm Nodes." Memory Workshop (IMW), 2012 4th IEEE International. IEEE, 2012, pp. 1-4.

Gamiz, et al. "A 20nm low-power triple-gate multibody 1T-DRAM cell." VLSI Technology, Systems, and Applications (VLSI-TSA), 2012 International Symposium on. IEEE, 2012, pp. 1-2.

Giusi, et al. "Bipolar mode operation and scalability of double-gate capacitorless 1T-DRAM cells." Electron Devices, IEEE Transactions on, vol. 57, No. 8 (2010), pp. 1743-1750.

Gupta, et al. "32nm high-density high-speed T-RAM embedded memory technology." Electron Devices Meeting (IEDM), 2010 IEEE International. IEEE, 2010, pp. 12-1.

Han, et al. "Bistable resistor (biristor)-gateless silicon nanowire memory." VLSI Technology (VLSIT), 2010 Symposium on. IEEE, 2010, pp. 171-172.

Han, et al. "Biristor—Bistable resistor based on a silicon nanowire." Electron Device Letters, IEEE 31.8 (2010): 797-799.

Hubert, et al., "Experimental comparison of programming mechanisms in 1T-DRAM cells with variable channel length", Solid-State Device Research Conference (ESSDERC), 2010 Proceedings of the European, pp. 150-153, Sep. 14-16, 2010.

Hwang, et al. "Offset buried metal gate vertical floating body memory technology with excellent retention time for DRAM application." VLSI Technology (VLSIT), 2011 Symposium on. IEEE, 2011, pp. 172-173.

Kim, et al. "Vertical double gate Z-RAM technology with remarkable low voltage operation for DRAM application." VLSI Technology (VLSIT), 2010 Symposium on, 2010, pp. 163-164.

Kim, et al. "Silicon on replacement insulator (SRI) floating body cell (FBC) memory." VLSI Technology (VLSIT), 2010 Symposium on. IEEE, 2010, pp. 165-166.

Kim, et al. "Optical charge-pumping: A universal trap characterization technique for nanoscale floating body devices." VLSI Technology (VLSIT), 2011 Symposium on. IEEE, 2011, pp. 190-191.

Kim, et al. "Investigation of 1T DRAM cell with non-overlap structure and recessed channel." Silicon Nanoelectronics Workshop (SNW), 2010. IEEE, 2010, pp. 1-2.

Lu, et al., "A Simplified Superior Floating-Body/Gate DRAM Cell", IEEE Elec. Dev. Letters, vol. 30, No. 3, Mar. 2009, pp. 282-284.

Lu, et al., "A Floating-Body/Gate DRAM Cell Upgraded for Long Retention Time", IEEE Elec. Dev. Letters, vol. 32, No. 6, pp. 731-733, Jun. 2011.

Liu, Xuelian, et al. "A three-dimensional DRAM using floating body cell in FDSOI devices." Design and Diagnostics of Electronic Circuits & Systems (DDECS), 2012 IEEE 15th International Symposium on. IEEE, 2012, pp. 159-162.

Lee, et al. "A Novel Capacitorless 1T DRAM Cell for Data Retention Time Improvement." Nanotechnology, IEEE Transactions on, vol. 10, No. 3, 2011, pp. 462-466.

Leiss, et al, "dRAM Design Using the Taper-Isolated Dynamic RAM Cell." Solid-State Circuits, IEEE Journal of 17.2 (1982): 337-344.

Mahatme, et al. "Total ionizing dose effects on ultra thin buried oxide floating body memories." Reliability Physics Symposium (IRPS), 2012 IEEE International, 2012, pp. 1-5.

Moon, et al. "Fin-width dependence of BJT-based 1T-DRAM implemented on FinFET." Electron Device Letters, vol. 31, No. 9 (2010): 909-911.

Moon, et al. "An optically assisted program method for capacitorless 1T-DRAM." Electron Devices, IEEE Transactions on, vol. 57, No. 7, 2010, pp. 1714-1718.

Moon, et al. "Multi-functional universal device using a band-engineered vertical structure." Electron Devices Meeting (IEDM), 2011 IEEE International. IEEE, 2011, pp. 24.6.2-24.6.4.

Moon, et al. "Ultimately scaled 20nm unified-RAM." Electron Devices Meeting (IEDM), 2010 IEEE International. IEEE, 2010, pp. 12.2.1-12.2.4.

Nicoletti, et al. "The Dependence of Retention Time on Gate Length in UTBOX FBRAM With Different Source/Drain Junction Engineering." Electron Device Letters, vol. 33, No. 7, 2012, pp. 940-942.

Ohsawa, et al, "A Novel Capacitor-less DRAM Cell: Floating Body Cell", CRC Press, Taylor & Francis Group, 2012, pp. 1-7.

Ranica, et al. "A one transistor cell on bulk substrate (1T-Bulk) for low-cost and high density eDRAM." VLSI Technology, 2004. Digest of Technical Papers. 2004 Symposium on. IEEE, 2004, pp. 128-129.

Okhonin et al. A Capicitor-Less IT-DRAM Cell, IEEE Electron Device Letters, vol. 23, No. 2, Feb. 2002, pp. 85-87.

Ohsawa, et al. "Autonomous refresh of floating body cell (FBC)." Electron Devices Meeting, 2008. IEDM 2008. IEEE International. IEEE, 2008, pp. 801-804.

Ohsawa et al., Memory Design Using One-Transistor Gain Cell on SOI, Tech. Digest, IEEE International Solid-State Circuits, vol. 37, No. 11, 2002, pp. 1510-1522.

(56) References Cited

OTHER PUBLICATIONS

Pulicani, R., et al. "Simulation of intrinsic bipolar transistor mechanisms for future capacitor-less eDRAM on bulk substrate." Electronics, Circuits, and Systems (ICECS), 2010 17th IEEE International Conference on. IEEE, 2010, pp. 966-969.

* cited by examiner

|  | Terminals | | | | | |
| --- | --- | --- | --- | --- | --- | --- |
|  | Substrate 78 | BL1 74 | WL1 70 | SL 72 | WL2 76 | BL2 77 |
| Idle | Zero 0.0V | Zero 0.0V | Zero or negative 0.0V | Zero 0.0V | Zero or negative 0.0V | Zero 0.0V |
| Row-Wide Holding/ Refresh | Zero 0.0V | Zero 0.0V | Zero or negative 0.0V | Positive +1.2V | Zero or negative 0.0V | Zero 0.0V |
| Holding/ Refresh Port #1 | Zero 0.0V | Positive +1.2V | Zero or negative 0.0V | Zero 0.0V | Zero or negative 0.0V | Zero 0.0V |
| Holding/ Refresh Port #2 | Zero 0.0V | Zero 0.0V | Zero or negative 0.0V | Zero 0.0V | Zero or negative 0.0V | Positive +1.2V |
| Holding/ Refresh Simultaneous Ports #1 & #2 | Zero 0.0V | Positive +1.2V | Zero or negative 0.0V | Zero 0.0V | Zero or negative 0.0V | Positive +1.2V |
| Read port #1 only | Zero 0.0V | Positive2( < Positive1) +0.4V | Positive1 +1.2V | Zero 0.0V | Zero or negative 0.0V | Zero 0.0V |
| Read port #2 only | Zero 0.0V | Zero 0.0V | Zero or negative 0.0V | Zero 0.0V | Positive1 +1.2V | Positive2( < Positive1) +0.4V |
| Simultaneous read ports #1 and #2 | Zero 0.0V | Positive2( < Positive1) +0.4V | Positive1 +1.2V | Zero 0.0V | Positive1 +1.2V | Positive2 (< Positive1) +0.4V |

FIG. 5

|  | Terminals | | | | | |
| --- | --- | --- | --- | --- | --- | --- |
|  | Substrate 78 | BL1 74 | WL1 70 | SL 72 | WL2 76 | BL2 77 |
| SL Row-wide Write '0' | Zero 0.0V | Zero 0.0V | Zero 0.0V | Negative -1.2V | Zero 0.0V | Zero 0.0V |
| Row-wide Write '0' Gate Tunneling Port #1 | Zero 0.0V | Zero 0.0V | Negative -2.4V | Zero 0.0V | Zero 0.0V | Zero 0.0V |
| Row-wide Write '0' Gate Tunneling Port #2 | Zero 0.0V | Zero 0.0V | Zero 0.0V | Zero 0.0V | Negative -2.4V | Zero 0.0V |
| Bit-selective Write '0' Port #1 | Zero 0.0V | Negative $(-V_{FB1}/2)$ -0.2V | Positive $(+V_{FB1}/2)$ +0.5V | Zero 0.0V | Zero or negative 0.0V | Zero 0.0V |
| Bit-selective Write '0' Port #2 | Zero 0.0V | Zero 0.0V | Zero or negative 0.0V | Zero 0.0V | Positive $(+V_{FB1}/2)$ +0.5V | Negative $(-V_{FB1}/2)$ -0.2V |
| Write '1' GIDL Port #1 | Zero 0.0V | Positive +1.2V | Negative -1.2V | Zero 0.0V | Zero or negative 0.0V | Zero 0.0V |
| Write '1' GIDL Port #2 | Zero 0.0V | Zero 0.0V | Zero or negative 0.0V | Zero 0.0V | Negative -1.2V | Positive +1.2V |
| Write '1' Impact Ionization Port #1 | Zero 0.0V | Positive +1.2V | Positive +1.2V | Zero 0.0V | Zero 0.0V | Zero 0.0V |
| Write '1' Impact Ionization Port #2 | Zero 0.0V | Zero 0.0V | Zero 0.0V | Zero 0.0V | Positive +1.2V | Positive +1.2V |

FIG. 6

| Operation | Memory Cell | Substrate 78 | BL1 74 | WL1 70 | SL 72 | WL2 76 | BL2 77 |
|---|---|---|---|---|---|---|---|
| Holding/ Refresh | All | Positive (+1.2V) | Zero (0.0V) | Zero or negative (0.0V) | Zero (0.0V) | Zero or negative (0.0V) | Zero (0.0V) |

FIG. 16

| Operation | Memory Cell | Substrate 78 | BL1 74 | WL1 70 | SL 72 | WL2 76 | BL2 77 |
|---|---|---|---|---|---|---|---|
| Read port #1 only | Selected Cell(s) | Zero or positive (+1.2V) | Positive2 (<Positive1) (+0.4V) | Positive1 (+1.2V) | Zero (0.0V) | Zero or negative (0.0V) | Zero (0.0V) |
| | Unselected Terminal(s) | Zero or positive (+1.2V) | Zero (0.0V) | Zero (0.0V) | Zero (0.0V) | Zero or negative (0.0V) | Zero (0.0V) |
| Read port #2 only | Selected Cell(s) | Zero or positive (+1.2V) | Zero (0.0V) | Zero (0.0V) | Zero (0.0V) | Positive1 (+1.2V) | Positive2 (<Positive1) (+0.4V) |
| | Unselected Terminal(s) | Zero or positive (+1.2V) | Zero (0.0V) | Zero (0.0V) | Zero (0.0V) | Zero or negative (0.0V) | Zero (0.0V) |
| Simult. read ports #1 and #2 | Selected Cell(s) | Zero or positive (+1.2V) | Positive2 (<Positive1) (+0.4V) | Positive1 (+1.2V) | Zero (0.0V) | Positive1 (+1.2V) | Positive2 (<Positive1) (+0.4V) |
| | Unselected Terminal(s) | Zero or positive (+1.2V) | Zero (0.0V) | Zero (0.0V) | Zero (0.0V) | Zero or negative (0.0V) | Zero (0.0V) |

FIG. 17

| Operation | Memory Cell | Terminals | | | | | | |
|---|---|---|---|---|---|---|---|---|
| | | Substrate 78 | BL1 74 | WL1 70 | SL 72 | WL2 76 | BL2 77 | |
| Row-wide Write '0' | Selected Row(s) | Zero or positive (+1.2V) | Zero or negative (0.0V) | Zero or Negative (0.0V) | Negative (-1.2V) | Zero or negative (0.0V) | Zero or Negative (0.0V) | |
| | Unselected Row(s) | Zero or positive (+1.2V) | Zero or negative (0.0V) | Zero or Negative (0.0V) | Zero (0.0V) | Zero or negative (0.0V) | Zero or Negative (0.0V) | |
| Bit-selective Write '0' Port #1 | Selected Cell(s) | Zero or positive (+1.2V) | Negative ($-V_{FB1}/2$) (-0.2V) | Positive ($+V_{FB1}/2$) (+0.5V) | Zero or positive (0.0V) | Zero or negative (0.0V) | Zero (0.0V) | |
| | Unselected Terminal(s) | Zero or positive (+1.2V) | Zero (0.0V) | Zero or Negative (0.0V) | Zero or positive (0.0V) | Zero or negative (0.0V) | Zero (0.0V) | |
| Bit-selective Write '0' Port #2 | Selected Cell(s) | Zero or positive (+1.2V) | Zero (0.0V) | Zero or negative (0.0V) | Zero or positive (0.0V) | Positive ($+V_{FB1}/2$) (+0.5V) | Negative ($-V_{FB1}/2$) (-0.2V) | |
| | Unselected Terminal(s) | Zero or positive (+1.2V) | Zero (0.0V) | Zero or Negative (0.0V) | Zero or positive (0.0V) | Zero or Negative (0.0V) | Zero (0.0V) | |

FIG. 18

| Operation | Memory Cells | Terminals | | | | | | |
|---|---|---|---|---|---|---|---|---|
| | | Substrate 78 | BL1 74 | WL1 70 | SL 72 | WL2 76 | BL2 77 |
| Write '1' GIDL Port #1 | Selected Cell(s) | Positive (+1.2V) | Positive (+1.2V) | Negative (-1.2V) | Zero (0.0V) | Zero or negative (0.0V) | Zero (0.0V) |
| | Unselected Terminal(s) | Positive (+1.2V) | Zero (0.0V) | Zero or negative (0.0V) | Zero (0.0V) | Zero or negative (0.0V) | Zero (0.0V) |
| Write '1' GIDL Port #2 | Selected Cell(s) | Positive (+1.2V) | Zero (0.0V) | Zero or negative (0.0V) | Zero (0.0V) | Negative (-1.2V) | Positive (+1.2V) |
| | Unselected Terminal(s) | Positive (+1.2V) | Zero (0.0V) | Zero or negative (0.0V) | Zero (0.0V) | Zero (0.0V) | Zero or negative (0.0V) |
| Write '1' Port #1 Impact Ionization | Selected Cell(s) | Positive (+1.2V) | Positive (+1.2V) | Positive (+1.2V) | Zero (0.0V) | Zero (0.0V) | Zero (0.0V) |
| | Unselected Terminal(s) | Positive (+1.2V) | Zero (0.0V) | Zero (0.0V) | Zero (0.0V) | Zero (0.0V) | Zero (0.0V) |
| Write '1' Port #2 Impact Ionization | Selected Cell(s) | Positive (+1.2V) | Zero (0.0V) | Zero (0.0V) | Zero (0.0V) | Positive (+1.2V) | Positive (+1.2V) |
| | Unselected Terminal(s) | Positive (+1.2V) | Zero (0.0V) | Zero (0.0V) | Zero (0.0V) | Zero (0.0V) | Zero (0.0V) |

FIG. 19

| Memory Cell | | Subst. 78 | BW 75 | BL1 74 | WL1 72 | GA 70 | WL2 76 | BL2 77 |
|---|---|---|---|---|---|---|---|---|
| Idle | All | Zero (0.0V) | Zero or Positive (0.0V) | Zero (0.0V) | Zero or negative (-0.7V) | Zero or negative (0.0V) | Zero or negative (-0.7V) | Zero (0.0V) |
| Holding/ Refresh via Port #1 | Selected Cell(s) | Zero (0.0V) | Zero (0.0V) | Positive (+0.6V) | Positive (+1.2V) | Zero or negative (0.0V) | Zero or negative (-0.7V) | Zero (0.0V) |
| | Unselected Terminal(s) | Zero (0.0V) | Zero (0.0V) | Zero or negative (0.0V) | Zero or negative (-0.7V) | Zero or negative (0.0V) | Zero or negative (-0.7V) | Zero (0.0V) |
| Holding/ Refresh via Port #2 | Selected Cell(s) | Zero (0.0V) | Zero (0.0V) | Zero (0.0V) | Zero or negative (-0.7V) | Zero or negative (0.0V) | Positive (+1.2V) | Positive (+0.6V) |
| | Unselected Terminal(s) | Zero (0.0V) | Zero (0.0V) | Zero or negative (0.0V) | Zero or negative (-0.7V) | Zero or negative (0.0V) | Zero or negative (-0.7V) | Zero (0.0V) |
| Holding/ Refresh via Port #1 & Port #2 | Selected Cell(s) | Zero (0.0V) | Zero (0.0V) | Positive (+0.6V) | Positive (+1.2V) | Zero or negative (0.0V) | Positive (+1.2V) | Positive (+0.6V) |
| | Unselected Terminal(s) | Zero (0.0V) | Zero (0.0V) | Zero or negative (0.0V) | Zero or negative (-0.7V) | Zero or negative (0.0V) | Zero or negative (-0.7V) | Zero (0.0V) |

FIG. 50

| Memory Cell | | Subst. 78 | BW 75 | BL1 74 | WL1 72 | GA 70 | WL2 76 | BL2 77 |
|---|---|---|---|---|---|---|---|---|
| Read port #1 only | Selected Cell(s) | Zero (0.0V) | Zero (0.0V) | Positive (+1.2V) | Positive (+1.2V) | Zero (0.0V) | Zero or negative (-0.7V) | Zero (0.0V) |
| | Unselected Terminal(s) | Zero (0.0V) | Zero (0.0V) | Zero (0.0V) | Zero or negative (-0.7V) | Zero (0.0V) | Zero or negative (-0.7V) | Zero (0.0V) |
| Read port #2 only | Selected Cell(s) | Zero (0.0V) | Zero (0.0V) | Zero (0.0V) | Zero or negative (-0.7V) | Zero (0.0V) | Positive (+1.2V) | Positive (+1.2V) |
| | Unselected Terminal(s) | Zero (0.0V) | Zero (0.0V) | Zero (0.0V) | Zero or negative (-0.7V) | Zero (0.0V) | Zero or negative (-0.7V) | Zero (0.0V) |
| Simultaneous read ports #1 and #2 | Selected Cell(s) | Zero (0.0V) | Zero (0.0V) | Positive (+1.2V) | Positive (+1.2V) | Zero (0.0V) | Positive (+1.2V) | Positive (+1.2V) |
| | Unselected Terminal(s) | Zero (0.0V) | Zero (0.0V) | Zero (0.0V) | Zero or negative (-0.7V) | Zero (0.0V) | Zero or negative (-0.7V) | Zero (0.0V) |

FIG. 51

| Memory Cell | | Terminals | | | | | | | |
|---|---|---|---|---|---|---|---|---|---|
| | | Subst. 78 | BW 75 | BL1 74 | WL1 72 | GA 70 | WL2 76 | BL2 77 |
| Row-wide Write '0' | Selected Row(s) | Zero (0.0V) | Negative (-0.5V) | Positive (0.0V) | Positive (+1.2V) | Zero or Negative (0.0V) | Positive (+1.2V) | Positive (0.0V) |
| | Unselected Terminal(s) | Zero (0.0V) | Zero (0.0V) | Zero (0.0V) | Zero or negative (-0.7V) | Zero (0.0V) | Zero or negative (-0.7V) | Zero (0.0V) |
| Bit-selective Write '0' Port #1 | Selected Cell(s) | Zero (0.0V) | Zero (0.0V) | Negative (-0.7V) | Positive (+1.2V) | Zero (0.0V) | Zero or negative (-0.7V) | Zero (0.0V) |
| | Unselected Terminal(s) | Zero (0.0V) | Zero (0.0V) | Zero (0.0V) | Zero or negative (-0.7V) | Zero (0.0V) | Zero or negative (-0.7V) | Zero (0.0V) |
| Bit-selective Write '0' Port #2 | Selected Cell(s) | Zero (0.0V) | Zero (0.0V) | Zero (0.0V) | Zero or negative (-0.7V) | Zero (0.0V) | Positive (+1.2V) | Negative (-0.7V) |
| | Unselected Terminal(s) | Zero (0.0V) | Zero (0.0V) | Zero (0.0V) | Zero or negative (-0.7V) | Zero (0.0V) | Zero or negative (-0.7V) | Zero (0.0V) |

FIG. 52

| Memory Cell | | Subst. 78 | BW 75 | BL1 74 | WL1 72 | GA 70 | WL2 76 | BL2 77 |
|---|---|---|---|---|---|---|---|---|
| Write '1' Port #1 w/Gate Assist | Selected Cell(s) | Zero (0.0V) | Zero (0.0V) | Positive (+1.2V) | Positive (+1.2V) | Negative (-1.2V) | Zero or negative (-0.7V) | Zero (0.0V) |
| | Unselected Terminal(s) | Zero (0.0V) | Zero (0.0V) | Zero (0.0V) | Zero or negative (-0.7V) | Zero (0.0V) | Zero or negative (-0.7V) | Zero (0.0V) |
| Write '1' Port #2 w/Gate Assist | Selected Cell(s) | Zero (0.0V) | Zero (0.0V) | Zero (0.0V) | Zero or negative (-0.7V) | Negative (-1.2V) | Positive (+1.2V) | Positive (+1.2V) |
| | Unselected Terminal(s) | Zero (0.0V) | Zero (0.0V) | Zero (0.0V) | Zero or negative (-0.7V) | Zero (0.0V) | Zero or negative (-0.7V) | Zero (0.0V) |
| Compact Write '1' Port #1 | Selected Cell(s) | Zero (0.0V) | Zero (0.0V) | Positive2 (>Positive1) (+2.4V) | Positive2 (+2.4V) | Zero (0.0V) | Zero or negative (-0.7V) | Zero (0.0V) |
| | Unselected Terminal(s) | Zero (0.0V) | Zero (0.0V) | Zero (0.0V) | Zero or negative (-0.7V) | Zero (0.0V) | Zero or negative (-0.7V) | Zero (0.0V) |
| Compact Write '1' Port #2 | Selected Cell(s) | Zero (0.0V) | Zero (0.0V) | Zero (0.0V) | Zero or negative (-0.7V) | Zero (0.0V) | Positive2 (+2.4V) | Positive2 (>Positive1) (+2.4V) |
| | Unselected Terminal(s) | Zero (0.0V) | Zero (0.0V) | Zero (0.0V) | Zero or negative (-0.7V) | Zero (0.0V) | Zero or negative (-0.7V) | Zero (0.0V) |

FIG. 53

| | Memory Cell | Subst. 78 | BW 75 | BL1 74 | WL1 72 | GA 70 | WL2 76 | BL2 77 |
|---|---|---|---|---|---|---|---|---|
| Idle | All | Zero (0.0V) | Zero or Positive (+1.2V) | Positive (+1.2V) | Zero or negative (-0.7V) | Zero or negative (0.0V) | Zero or Negative (-0.7V) | Positive (+1.2V) |
| Holding/ Refresh via Port #1 | Selected Cell(s) | Zero (0.0V) | Positive (+1.2V) | Zero (0.0V) | Positive (+1.2V) | Zero or negative (0.0V) | Zero or negative (-0.7V) | Positive (+1.2V) |
| | Unselected Terminal(s) | Zero (0.0V) | Zero or Positive (+1.2V) | Positive (+1.2V) | Zero or negative (-0.7V) | Zero or negative (0.0V) | Zero or negative (-0.7V) | Positive (+1.2V) |
| Holding/ Refresh via Port #2 | Selected Cell(s) | Zero (0.0V) | Positive (+1.2V) | Zero or negative (-0.7V) | Zero or negative (-0.7V) | Zero or negative (0.0V) | Zero or negative (-0.7V) | Zero (0.0V) |
| | Unselected Terminal(s) | Zero (0.0V) | Zero or Positive (+1.2V) | Positive (+1.2V) | Zero or negative (-0.7V) | Zero or negative (0.0V) | Positive (+1.2V) | Positive (+1.2V) |
| Holding/ Refresh via Port #1 & Port #2 | Selected Cell(s) | Zero (0.0V) | Positive (+1.2V) | Zero (0.0V) | Positive (+1.2V) | Zero or negative (0.0V) | Positive (+1.2V) | Zero (0.0V) |
| | Unselected Terminal(s) | Zero (0.0V) | Zero or Positive (+1.2V) | Positive (+1.2V) | Zero or negative (-0.7V) | Zero or negative (0.0V) | Zero or negative (-0.7V) | Positive (+1.2V) |

FIG. 54

| | Memory Cell | Subst. 78 | BW 75 | BL1 74 | WL1 72 | GA 70 | WL2 76 | BL2 77 |
|---|---|---|---|---|---|---|---|---|
| Read port #1 only | Selected Cell(s) | Zero (0.0V) | Positive (+1.2V) | Zero (0.0V) | Positive (+1.2V) | Zero (0.0V) | Zero or negative (-0.7V) | Positive (+1.2V) |
| | Unselected Terminal(s) | Zero (0.0V) | Zero or Positive (+1.2V) | Positive (+1.2V) | Zero or negative (-0.7V) | Zero (0.0V) | Zero or negative (-0.7V) | Positive (+1.2V) |
| Read port #2 only | Selected Cell(s) | Zero (0.0V) | Positive (+1.2V) | Positive (+1.2V) | Zero or negative (-0.7V) | Zero (0.0V) | Positive (+1.2V) | Zero (0.0V) |
| | Unselected Terminal(s) | Zero (0.0V) | Zero or Positive (+1.2V) | Positive (+1.2V) | Zero or negative (-0.7V) | Zero (0.0V) | Zero or negative (-0.7V) | Positive (+1.2V) |
| Simultaneous read ports #1 and #2 | Selected Cell(s) | Zero (0.0V) | Positive (+1.2V) | Zero (0.0V) | Positive (+1.2V) | Zero (0.0V) | Positive (+1.2V) | Zero (0.0V) |
| | Unselected Terminal(s) | Zero (0.0V) | Zero or Positive (+1.2V) | Positive (+1.2V) | Zero or negative (-0.7V) | Zero (0.0V) | Zero or negative (-0.7V) | Positive (+1.2V) |

Terminals

FIG. 55

| | Memory Cell | Subst. 78 | BW 75 | BL1 74 | WL1 72 | GA 70 | WL2 76 | BL2 77 |
|---|---|---|---|---|---|---|---|---|
| Row-wide Write '0' | Selected Row(s) | Zero (0.0V) | Negative (-0.5V) | Positive (+1.2V) | Zero or negative (-0.7V) | Zero or Negative (0.0V) | Zero or negative (-0.7V) | Positive (+1.2V) |
| | Unselected Row(s) | Zero (0.0V) | Zero or Positive (+1.2V) | Positive (+1.2V) | Zero or negative (-0.7V) | Zero (0.0V) | Zero or negative (-0.7V) | Positive (+1.2V) |
| Bit-selective Write '0' Port #1 | Selected Cell(s) | Zero (0.0V) | Zero or Positive (+1.2V) | Negative (-0.7V) | Positive (+1.2V) | Zero (0.0V) | Zero or negative (-0.7V) | Positive (+1.2V) |
| | Unselected Terminal(s) | Zero (0.0V) | Zero or Positive (+1.2V) | Positive (+1.2V) | Zero or negative (-0.7V) | Zero (0.0V) | Zero or negative (-0.7V) | Positive (+1.2V) |
| Bit-selective Write '0' Port #2 | Selected Cell(s) | Zero (0.0V) | Zero or Positive (+1.2V) | Positive (+1.2V) | Zero or negative (-0.7V) | Zero (0.0V) | Positive (+1.2V) | Negative (-0.7V) |
| | Unselected Terminal(s) | Zero (0.0V) | Zero or Positive (+1.2V) | Positive (+1.2V) | Zero or negative (-0.7V) | Zero (0.0V) | Zero or negative (-0.7V) | Positive (+1.2V) |

FIG. 56

| | Memory Cell | Subst. 78 | BW 75 | BL1 74 | WL1 72 | GA 70 | WL2 76 | BL2 77 |
|---|---|---|---|---|---|---|---|---|
| Write '1' Port #1 w/Gate Assist | Selected Cell(s) | Zero (0.0V) | Zero or Positive (+1.2V) | Positive (+1.2V) | Positive (+1.2V) | Negative (-1.2V) | Zero or negative (-0.7V) | Positive (+1.2V) |
| | Unselected Terminal(s) | Zero (0.0V) | Zero or Positive (+1.2V) | Positive (+1.2V) | Zero or negative (-0.7V) | Zero (0.0V) | Zero or negative (-0.7V) | Positive (+1.2V) |
| Write '1' Port #2 w/Gate Assist | Selected Cell(s) | Zero (0.0V) | Zero or Positive (+1.2V) | Positive (+1.2V) | Zero or negative (-0.7V) | Negative (-1.2V) | Positive (+1.2V) | Positive (+1.2V) |
| | Unselected Terminal(s) | Zero (0.0V) | Zero or Positive (+1.2V) | Positive (+1.2V) | Zero or negative (-0.7V) | Zero (0.0V) | Zero or negative (-0.7V) | Positive (+1.2V) |
| Compact Write '1' Port #1 | Selected Cell(s) | Zero (0.0V) | Zero (0.0V) | Positive2 (> Positive1) (+2.4V) | Positive2 (+2.4V) | Zero (0.0V) | Zero or negative (-0.7V) | Positive1 (+1.2V) |
| | Unselected Terminal(s) | Zero (0.0V) | Zero or Positive (+1.2V) | Positive1 (+1.2V) | Zero or negative (-0.7V) | Zero (0.0V) | Zero or negative (-0.7V) | Positive1 (+1.2V) |
| Compact Write '1' Port #2 | Selected Cell(s) | Zero (0.0V) | Zero (0.0V) | Positive1 (+1.2V) | Zero or negative (-0.7V) | Zero (0.0V) | Positive2 (+2.4V) | Positive2 (> Positive1) (+2.4V) |
| | Unselected Terminal(s) | Zero (0.0V) | Zero or Positive (+1.2V) | Positive1 (+1.2V) | Zero or negative (-0.7V) | Zero (0.0V) | Zero or negative (-0.7V) | Positive1 (+1.2V) |

FIG. 57

| | Terminals | | | | | | |
|---|---|---|---|---|---|---|---|
| | Subst. 78 | BW 75 | BL1 74 | WL1 72 | GA 70 | WL2 76 | BL2 77 |
| Row-Wide Write '1' w/ Gate Assist | Zero (0.0V) | Zero or Positive (+1.2V) | Positive (+1.2V) | Positive (+1.2V) | Negative (-1.2V) | Positive (+1.2V) | Positive (+1.2V) |

| Memory Cell | | Terminals | | | | | | | |
|---|---|---|---|---|---|---|---|---|---|
| | | Subst. 78 | BW 75 | BL1 74 | WL1 72 | GA 70 | WL2 76 | BL2 77 |
| Idle | All | Zero (0.0V) | Zero or Positive (0.0V) | Zero (0.0V) | Zero or negative (-0.7V) | Zero or negative (0.0V) | Zero or negative (-0.7V) | Zero (0.0V) |
| Holding/ Refresh via Port #1 | Selected Cell(s) | Zero (0.0V) | Zero (0.0V) | Positive (+1.2V) | Positive (+1.2V) | Zero or negative (0.0V) | Zero or negative (-0.7V) | Zero (0.0V) |
| | Unselected Terminal(s) | Zero (0.0V) | Zero (0.0V) | Zero (0.0V) | Zero or negative (-0.7V) | Zero or negative (0.0V) | Zero or negative (-0.7V) | Zero (0.0V) |
| Holding/ Refresh via Port #2 | Selected Cell(s) | Zero (0.0V) | Zero (0.0V) | Zero (0.0V) | Zero or negative (-0.7V) | Zero or negative (0.0V) | Positive (+1.2V) | Positive (+1.2V) |
| | Unselected Terminal(s) | Zero (0.0V) | Zero (0.0V) | Zero (0.0V) | Zero or negative (-0.7V) | Zero or negative (0.0V) | Zero or negative (-0.7V) | Zero (0.0V) |
| Holding/ Refresh via Port #1 & Port #2 | Selected Cell(s) | Zero (0.0V) | Zero (0.0V) | Positive (+1.2V) | Positive (+1.2V) | Zero or negative (0.0V) | Positive (+1.2V) | Positive (+1.2V) |
| | Unselected Terminal(s) | Zero (0.0V) | Zero (0.0V) | Zero (0.0V) | Zero or negative (-0.7V) | Zero or negative (0.0V) | Zero or negative (-0.7V) | Zero (0.0V) |

FIG. 70

| | Memory Cell | Terminals | | | | | | | |
|---|---|---|---|---|---|---|---|---|---|
| | | Subst. 78 | BW 75 | BL1 74 | WL1 72 | GA 70 | WL2 76 | BL2 77 |
| Read port #1 only | Selected Cell(s) | Zero (0.0V) | Zero (0.0V) | Positive (+1.2V) | Positive (+1.2V) | Zero or negative (0.0V) | Zero or negative (-0.7V) | Zero (0.0V) |
| | Unselected Terminal(s) | Zero (0.0V) | Zero (0.0V) | Zero (0.0V) | Zero or negative (-0.7V) | Zero or negative (0.0V) | Zero or negative (-0.7V) | Zero (0.0V) |
| Read port #2 only | Selected Cell(s) | Zero (0.0V) | Zero (0.0V) | Zero (0.0V) | Zero or negative (-0.7V) | Zero or negative (0.0V) | Positive (+1.2V) | Positive (+1.2V) |
| | Unselected Terminal(s) | Zero (0.0V) | Zero (0.0V) | Zero (0.0V) | Zero or negative (-0.7V) | Zero or negative (0.0V) | Zero or negative (-0.7V) | Zero (0.0V) |
| Simultaneous read ports #1 and #2 | Selected Cell(s) | Zero (0.0V) | Zero (0.0V) | Positive (+1.2V) | Positive (+1.2V) | Zero or negative (0.0V) | Positive (+1.2V) | Positive (+1.2V) |
| | Unselected Terminal(s) | Zero (0.0V) | Zero (0.0V) | Zero (0.0V) | Zero or negative (-0.7V) | Zero or negative (0.0V) | Zero or negative (-0.7V) | Zero (0.0V) |

FIG. 71

| | | Terminals | | | | | | |
|---|---|---|---|---|---|---|---|---|
| | Memory Cell | Subst. 78 | BW 75 | BL1 74 | WL1 72 | GA 70 | WL2 76 | BL2 77 |
| Row-wide Write "0" | Selected Row(s) | Zero (0.0V) | Negative (-0.5V) | Zero (0.0V) | Zero or negative (-0.7V) | Zero or negative (0.0V) | Zero or negative (-0.7V) | Zero (0.0V) |
| | Unselected Row(s) | Zero (0.0V) | Zero (0.0V) | Zero (0.0V) | Zero or negative (-0.7V) | Zero or negative (0.0V) | Zero or negative (-0.7V) | Zero (0.0V) |
| Bit-selective Write "0" Port #1 | Selected Cell(s) | Zero (0.0V) | Zero (0.0V) | Negative (-0.7V) | Positive (+1.2V) | Zero (0.0V) | Zero or negative (-0.7V) | Zero (0.0V) |
| | Unselected Terminal(s) | Zero (0.0V) | Zero (0.0V) | Zero (0.0V) | Zero or negative (-0.7V) | Zero or negative (0.0V) | Zero or negative (-0.7V) | Zero (0.0V) |
| Bit-selective Write "0" Port #2 | Selected Cell(s) | Zero (0.0V) | Zero (0.0V) | Zero (0.0V) | Zero or negative (-0.7V) | Zero (0.0V) | Positive (+1.2V) | Negative (-0.7V) |
| | Unselected Terminal(s) | Zero (0.0V) | Zero (0.0V) | Zero (0.0V) | Zero or negative (-0.7V) | Zero or negative (0.0V) | Zero or negative (-0.7V) | Zero (0.0V) |

FIG. 72

| | Memory Cell | Subst. 78 | BW 75 | BL1 74 | WL1 72 | GA 70 | WL2 76 | BL2 77 |
|---|---|---|---|---|---|---|---|---|
| Write '1' Port #1 w/ Gate Assist | Selected Cell(s) | Zero (0.0V) | Zero (0.0V) | Positive (+1.2V) | Positive (+1.2V) | Negative (-1.2V) | Zero or negative (-0.7V) | Zero (0.0V) |
| | Unselected Terminal(s) | Zero (0.0V) | Zero (0.0V) | Zero (0.0V) | Zero or Negative (-0.7V) | Zero (0.0V) | Zero or negative (-0.7V) | Zero (0.0V) |
| Write '1' Port #2 w/ Gate Assist | Selected Cell(s) | Zero (0.0V) | Zero (0.0V) | Zero (0.0V) | Zero or Negative (-0.7V) | Negative (-1.2V) | Positive (+1.2V) | Positive (+1.2V) |
| | Unselected Terminal(s) | Zero (0.0V) | Zero (0.0V) | Zero (0.0V) | Zero or Negative (-0.7V) | Zero (0.0V) | Zero or negative (-0.7V) | Zero (0.0V) |
| Compact Write '1' Port #1 | Selected Cell(s) | Zero (0.0V) | Zero (0.0V) | Positive (+2.4V) | Positive (+2.4V) | Zero (0.0V) | Zero or negative (-0.7V) | Zero (0.0V) |
| | Unselected Terminal(s) | Zero (0.0V) | Zero (0.0V) | Zero (0.0V) | Zero or Negative (-0.7V) | Zero (0.0V) | Zero or negative (-0.7V) | Zero (0.0V) |
| Compact Write '1' Port #2 | Selected Cell(s) | Zero (0.0V) | Zero (0.0V) | Zero (0.0V) | Zero or Negative (-0.7V) | Zero (0.0V) | Positive (+2.4V) | Positive (+2.4V) |
| | Unselected Terminal(s) | Zero (0.0V) | Zero (0.0V) | Zero (0.0V) | Zero or Negative (-0.7V) | Zero (0.0V) | Zero or negative (-0.7V) | Zero (0.0V) |

FIG. 73

| | Memory Cell | Subst. 78 | BW 75 | BL1 74 | WL1 72 | GA 70 | WL2 76 | BL2 77 |
|---|---|---|---|---|---|---|---|---|
| Idle | All | Zero (0.0V) | Zero or Positive (+1.2V) | Positive (+1.2V) | Zero or negative (-0.7V) | Zero or negative (0.0V) | Zero or negative (-0.7V) | Positive (+1.2V) |
| Holding/ Refresh via Port #1 | Selected Cell(s) | Zero (0.0V) | Positive (+1.2V) | Zero (0.0V) | Positive (+1.2V) | Zero or negative (0.0V) | Zero or negative (-0.7V) | Positive (+1.2V) |
| | Unselected Terminal(s) | Zero (0.0V) | Zero or Positive (+1.2V) | Positive (+1.2V) | Zero or negative (-0.7V) | Zero or negative (0.0V) | Zero or negative (-0.7V) | Positive (+1.2V) |
| Holding/ Refresh via Port #2 | Selected Cell(s) | Zero (0.0V) | Positive (+1.2V) | Positive (+1.2V) | Zero or negative (-0.7V) | Zero or negative (0.0V) | Positive (+1.2V) | Zero (0.0V) |
| | Unselected Terminal(s) | Zero (0.0V) | Zero or Positive (+1.2V) | Positive (+1.2V) | Zero or negative (-0.7V) | Zero or negative (0.0V) | Zero or negative (-0.7V) | Positive (+1.2V) |
| Holding/ Refresh via Port #1 & Port #2 | Selected Cell(s) | Zero (0.0V) | Positive (+1.2V) | Zero (0.0V) | Positive (+1.2V) | Zero or negative (0.0V) | Positive (+1.2V) | Zero (0.0V) |
| | Unselected Terminal(s) | Zero (0.0V) | Zero or Positive (+1.2V) | Positive (+1.2V) | Zero or negative (-0.7V) | Zero or negative (0.0V) | Zero or negative (-0.7V) | Positive (+1.2V) |

FIG. 74

| | Memory Cell | Subst. 78 | BW 75 | BL1 74 | WL1 72 | GA 70 | WL2 76 | BL2 77 |
|---|---|---|---|---|---|---|---|---|
| Read port #1 only | Selected Cell(s) | Zero (0.0V) | Positive (+1.2V) | Zero (0.0V) | Positive (+1.2V) | Zero (0.0V) | Zero or negative (-0.7V) | Positive (+1.2V) |
| | Unselected Terminal(s) | Zero (0.0V) | Zero or Positive (+1.2V) | Positive (+1.2V) | Zero or negative (-0.7V) | Zero (0.0V) | Zero or negative (-0.7V) | Positive (+1.2V) |
| Read port #2 only | Selected Cell(s) | Zero (0.0V) | Positive (+1.2V) | Positive (+1.2V) | Zero or negative (-0.7V) | Zero (0.0V) | Positive (+1.2V) | Zero (0.0V) |
| | Unselected Terminal(s) | Zero (0.0V) | Zero or Positive (+1.2V) | Positive (+1.2V) | Zero or negative (-0.7V) | Zero (0.0V) | Zero or negative (-0.7V) | Positive (+1.2V) |
| Simultaneous read ports #1 and #2 | Selected Cell(s) | Zero (0.0V) | Positive (+1.2V) | Zero (0.0V) | Positive (+1.2V) | Zero (0.0V) | Positive (+1.2V) | Zero (0.0V) |
| | Unselected Terminal(s) | Zero (0.0V) | Zero or Positive (+1.2V) | Positive (+1.2V) | Zero or negative (-0.7V) | Zero (0.0V) | Zero or negative (-0.7V) | Positive (+1.2V) |

FIG. 75

| | Memory Cell | Subst. 78 | BW 75 | BL1 74 | WL1 72 | GA 70 | WL2 76 | BL2 77 |
|---|---|---|---|---|---|---|---|---|
| Row-wide Write "0" | Selected Row(s) | Zero (0.0V) | Negative (-0.5V) | Zero (0.0V) | Positive (+1.2V) | Zero or negative (0.0V) | Zero (0.0V) | Positive (+1.2V) |
| | Unselected Row(s) | Zero (0.0V) | Zero or Positive (+1.2V) | Positive (+1.2V) | Zero or negative (-0.7V) | Zero (0.0V) | Zero or negative (-0.7V) | Positive (+1.2V) |
| Bit-selective Write "0" Port #1 | Selected Cell(s) | Zero (0.0V) | Zero or Positive (+1.2V) | Negative (-0.7V) | Positive (+1.2V) | Zero (0.0V) | Zero or negative (-0.7V) | Positive (+1.2V) |
| | Unselected Terminal(s) | Zero (0.0V) | Zero or Positive (+1.2V) | Positive (+1.2V) | Zero or negative (-0.7V) | Zero (0.0V) | Zero or negative (-0.7V) | Positive (+1.2V) |
| Bit-selective Write "0" Port #2 | Selected Cell(s) | Zero (0.0V) | Zero or Positive (+1.2V) | Positive (+1.2V) | Zero or negative (-0.7V) | Zero (0.0V) | Positive (+1.2V) | Negative (-0.7V) |
| | Unselected Terminal(s) | Zero (0.0V) | Zero or Positive (+1.2V) | Positive (+1.2V) | Zero or negative (-0.7V) | Zero (0.0V) | Zero or negative (-0.7V) | Positive (+1.2V) |

Terminals

FIG. 76

| | Memory Cell | Subst. 78 | BW 75 | BL1 74 | WL1 72 | GA 70 | WL2 76 | BL2 77 |
|---|---|---|---|---|---|---|---|---|
| Write "1" Port #1 w/Gate Assist | Selected Cell(s) | Zero (0.0V) | Zero or Positive (+1.2V) | Positive (+1.2V) | Positive (+1.2V) | Negative (-1.2V) | Zero or negative (-0.7V) | Positive (+1.2V) |
| | Unselected Terminal(s) | Zero (0.0V) | Zero or Positive (+1.2V) | Positive (+1.2V) | Zero or negative (-0.7V) | Zero (0.0V) | Zero or negative (-0.7V) | Positive (+1.2V) |
| Write "1" Port #2 w/Gate Assist | Selected Cell(s) | Zero (0.0V) | Zero or Positive (+1.2V) | Positive (+1.2V) | Zero or negative (-0.7V) | Negative (-1.2V) | Positive (+1.2V) | Positive (+1.2V) |
| | Unselected Terminal(s) | Zero (0.0V) | Zero or Positive (+1.2V) | Positive (+1.2V) | Zero or negative (-0.7V) | Zero (0.0V) | Zero or negative (-0.7V) | Positive (+1.2V) |
| Compact Write "1" Port #1 | Selected Cell(s) | Zero (0.0V) | Zero or Positive (0.0V) | Positive2 (> Positive1) (+2.4V) | Positive2 (+2.4V) | Zero (0.0V) | Zero or negative (-0.7V) | Positive (+1.2V) |
| | Unselected Terminal(s) | Zero (0.0V) | Zero or Positive (0.0V) | Positive1 (+1.2V) | Zero or negative (-0.7V) | Zero (0.0V) | Zero or negative (-0.7V) | Positive (+1.2V) |
| Compact Write "1" Port #2 | Selected Cell(s) | Zero (0.0V) | Zero or Positive (0.0V) | Positive1 (+1.2V) | Zero or negative (-0.7V) | Zero (0.0V) | Positive2 (+2.4V) | Positive2 (> Positive1) (+2.4V) |
| | Unselected Terminal(s) | Zero (0.0V) | Zero or Positive (0.0V) | Positive1 (+1.2V) | Zero or negative (-0.7V) | Zero (0.0V) | Zero or negative (-0.7V) | Positive (+1.2V) |

FIG. 77

| | Terminals | | | | | | |
|---|---|---|---|---|---|---|---|
| | Subst. 78 | BW 75 | BL1 74 | WL1 72 | GA 70 | WL2 76 | BL2 77 |
| Row-Wide Write '1' w/ Gate Assist | Zero (0.0V) | Zero or Positive (+1.2V) | Positive (+1.2V) | Positive (+1.2V) | Negative (-1.2V) | Positive (+1.2V) | Positive (+1.2V) |

DUAL-PORT SEMICONDUCTOR MEMORY AND FIRST IN FIRST OUT (FIFO) MEMORY HAVING ELECTRICALLY FLOATING BODY TRANSISTOR

CROSS-REFERENCE TO RELATED APPLICATIONS

The present application is continuation of co-pending application Ser. No. 15/730,525, filed 10/11/2017, which is a continuation of application Ser. No. 15/414,009, filed Jan. 24, 2017, now U.S. Pat. No. 9,812,456, which is a division of application Ser. No. 14/563,133, filed Dec. 8, 2014, now U.S. Pat. No. 9,589,963, which is a continuation of application Ser. No. 14/282,850 filed May 20, 2014, now U.S. Pat. No. 8,934,296, which is a continuation of application Ser. No. 14/046,986 filed Oct. 6, 2013, now U.S. Pat. No. 8,767,458, which is a continuation of application Ser. No. 13/296,402 filed Nov. 15, 2011, now U.S. Pat. No. 8,582,359, which claims priority to U.S. Provisional Patent Application No. 61/413,992 which was filed on Nov. 16, 2010. Each of application Ser. Nos. 15/730,525; 15/414,009; 14/563,133; 14/282,850; 14/046, 986; 13/296,402 and 61/413,992 and U.S. Pat. Nos. 9,589,963; 8,934,296; 8,767, 458 and 8,582,359 are hereby incorporated herein, in their entireties, by reference thereto, and priority to said applications is claimed.

FIELD OF THE DISCLOSURE

The present disclosure is directed generally to semiconductor memory cells, and more particularly to multi-port semiconductor memory cells that include and/or utilize a common floating body region.

BACKGROUND OF THE DISCLOSURE

Semiconductor memory devices are used extensively to store data. Static and Dynamic Random Access Memory (SRAM and DRAM, respectively) are widely used in many applications. The semiconductor memory devices include a plurality of memory cells, which also may be referred to herein as cells, each of which may exist in a plurality of memory states, which also may be referred to herein as states, illustrative, non-exclusive examples of which include a logic-0 state and a logic-1 state.

Conventional DRAM cells consist of a one-transistor and one-capacitor (1T/1C) structure. As the 1T/1C memory cell is scaled to smaller feature sizes, difficulties arise due to the need to maintain the capacitance of the capacitor.

DRAM based on the electrically floating body effect has been proposed (see, for example, "A Capacitor-less 1T-DRAM Cell", S. Okhonin et al., pp. 85-87, IEEE Electron Device Letters, vol. 23, no. 2, February 2002 and "Memory Design Using One-Transistor Gain Cell on SOI", T. Ohsawa et al., pp. 152-153, Tech. Digest, 2002 IEEE International Solid-State Circuits Conference, February 2002). Such memory eliminates the capacitor used in conventional 1T/1C memory cells, and thus is easier to scale to smaller feature sizes. In addition, such memory provides for a smaller cell size compared to the conventional 1T/1C memory cell. However, unlike SRAM, such DRAM memory cells still require a refresh operation, since the stored charge leaks over time.

A conventional DRAM refresh operation involves reading the state of the memory cell, followed by re-writing the memory cell with the same data. This read-then-write refresh requires two operations: a read operation and a write operation. The memory state of the memory cell cannot be accessed while being refreshed. An "automatic refresh" method, which does not require first reading the memory cell state, has been described in Fazan et al., U.S. Pat. No. 7,170,807 and in "Autonomous Refresh of Floating Body Cell (FBC), T. Ohsawa et al., pp. 801-804, Tech. Digest, 2008 IEEE International Electron Devices Meeting. However, the automatic refresh operation still interrupts access to the memory cells being refreshed.

In addition, a maximum charge that may be stored in a floating body DRAM memory cell decreases with repeated read operations, leading to a decrease in a voltage difference among the plurality of memory states available to the DRAM memory cell and degraded cell performance. This reduction in floating body charge may be due to charge pumping, where the floating body charge is attracted to the surface and trapped at the interface (see for example "Principles of Transient Charge Pumping on Partially Depleted SOI MOSFETs", S. Okhonin, et al., pp. 279-281, IEEE Electron Device Letters, vol. 23, no. 5, May 2002).

SRAM memory cells typically consist of six transistors (6T) and hence have a large cell size when compared to DRAM. However, unlike DRAM, SRAM does not require periodic refresh operations to maintain its memory state. Aside from the large cell size, 6T-SRAM also suffers from random threshold voltage (Vt) mismatches among its transistors, and requires a very complex custom manufacturing process for deep submicron IC fabrication.

Some electronic applications require the use of dual-port memory, which is a memory device that has two independent ports; each of which may perform the read and/or the write function. Existing dual-port memories use SRAM technology, such as in the 8T and 10T dual-port SRAM described by Chang, et al., US Patent Application Publication No. US 2007/0242513, and suffer from the same large cell size and random Vt mismatch problems as in single-port SRAM. Existing dual-port SRAM cell size is more than twice that of single-port SRAM cell size, and the dual-port SRAM cell also has a more complex overhead circuitry.

Another specialized memory type that is very commonly used is first-in first-out (FIFO) memory. FIFOs usually utilize dual-port SRAM and suffer from the same issues that SRAM memory cells suffer from, as mentioned above.

Dual-port memory utilizing the floating body effect has been proposed, for example, in U.S. Pat. No. 7,085,156 "Semiconductor Memory Device and Method of Operating Same", R. Ferrant et al., and in U.S. Pat. No. 7,285,832 "Multiport Single Transistor Bit Cell", Hoefler et al. The memory cell is formed by sharing the floating body regions of multiple floating body DRAM cells and still requires the refresh operation, which interrupts access to the memory cell.

Thus there is a need for improved semiconductor memory devices and methods of operating such devices such that the states of the memory cells of the semiconductor memory device are maintained without interrupting memory cell access. There is also a need for improved semiconductor memory devices and methods of operating the same such that the states of the memory cells are not degraded with repeated read operations.

In addition, there is also a need for improved semiconductor memory devices and methods that decrease and/or avoid the use of difficult SRAM custom doping to overcome random Vt mismatches in deep submicron process technology.

Furthermore, there is also a need for improved dual-port and FIFO memories that satisfy the properties above and also have a smaller cell size when compared to the traditional 6T SRAM cell.

SUMMARY OF THE DISCLOSURE

Multi-port semiconductor memory cells including a common floating body region configured to be charged to a level indicative of a memory state of the memory cell. The multi-port semiconductor memory cells include a plurality of gates and conductive regions interfacing with said floating body region. Arrays of memory cells and method of operating said memory arrays are disclosed for making a memory device.

In some embodiments, the multi-port semiconductor memory cells include dual-port semiconductor memory cells. In some embodiments, the multi-port semiconductor memory cells include more than two ports. In some embodiments, the multi-port semiconductor memory cells are formed on a substrate that includes an insulating layer between the floating body region and the substrate. In some embodiments, the multi-port semiconductor memory cells are formed on a substrate that includes a buried layer between the floating body region and the substrate. In some embodiments, the multi-port semiconductor memory cells include three-dimensional fin-type memory cells.

BRIEF DESCRIPTION OF THE DRAWINGS

FIGS. 5-6 provide illustrative, non-exclusive examples of biasing conditions that may be utilized during various operations of the first embodiment of a memory cell according to the present disclosure.

FIGS. 16-19 provide illustrative, non-exclusive examples of biasing conditions that may be utilized during various operations of the second embodiment of a memory cell according to the present disclosure.

FIGS. 50-57 provide illustrative, non-exclusive examples of biasing conditions that may be utilized during various operations of the fifth embodiment of a memory cell according to the present disclosure.

FIGS. 70-77 provide illustrative, non-exclusive examples of biasing conditions that may be utilized during various operations of the sixth embodiment of a memory cell according to the present disclosure.

DETAILED DESCRIPTION AND BEST MODE OF THE DISCLOSURE

Figure 1:
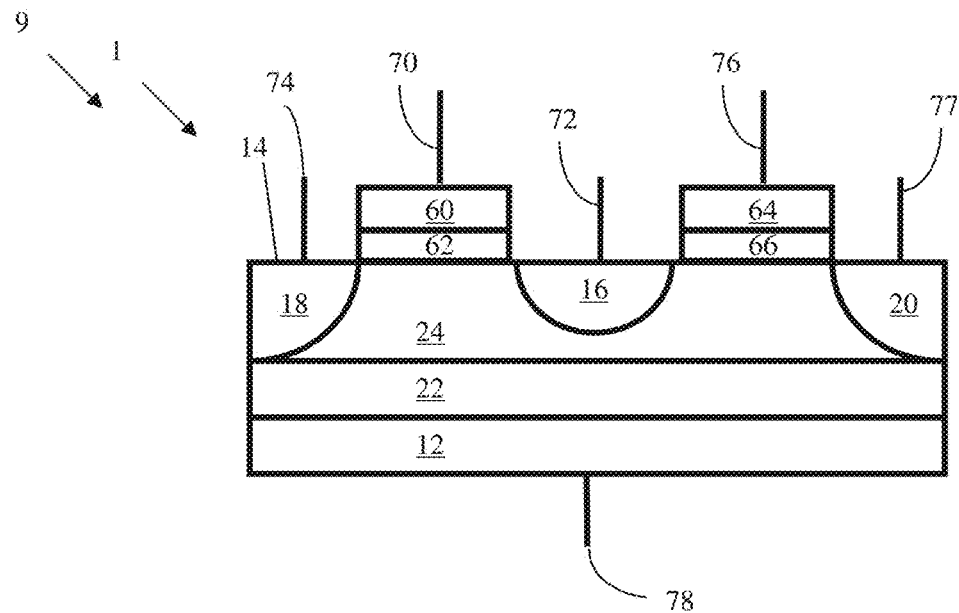
FIG. 1 provides a schematic representation of an illustrative, non-exclusive example of a first embodiment of a memory cell according to the present disclosure.

Before the present systems, devices and methods are described, it is to be understood that the present disclosure is not limited to the particular embodiments described, as such may, of course, vary. It is also to be understood that the terminology used herein is for the purpose of describing particular embodiments only, and is not intended to be limiting, since the scope of the present common body will be limited only by the appended claims.

Where a range of values is provided, it is to be understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the present disclosure. The upper and lower limits of these smaller ranges may independently be included or excluded in the range, and each range where either, neither or both limits are included in the smaller ranges is also encompassed within the present disclosure, subject to any specifically excluded limit in the stated range. Where the stated range includes one or both of the limits, ranges excluding either or both of those included limits are also included in the present disclosure.

Unless defined otherwise, all technical and scientific terms used herein have the same meaning as commonly understood by one of ordinary skill in the art to which this disclosure belongs. Although any methods and/or materials similar and/or equivalent to those described herein may be used in the practice and/or testing of the systems and methods according to the present disclosure, illustrative, non-exclusive examples of methods and materials are now described. All publications mentioned herein are incorporated herein by reference in their entirety.

As used herein and in the appended claims, the singular forms "a", "an", and "the" include plural referents unless the context clearly dictates otherwise. Thus, for example, reference to "a cell" includes a plurality of such cells and reference to "the terminal" includes reference to one or more terminals and equivalents thereof known to those skilled in the art, and so forth.

The publications discussed herein are provided solely for their disclosure prior to the filing date of the present application. Nothing herein is to be construed as an admission that the present disclosure is not entitled to antedate such publication by virtue of prior invention. Further, the dates of publication provided may be different from the actual publication dates, which may need to be independently confirmed.

In the following discussion and the related Figures, like numbers may refer to like and/or similar structures. After being introduced and/or discussed with reference to one Figure, a given structure and/or number may not be discussed in detail herein in subsequent structures and/or Figures that include the same number and/or structure.

Definitions

A "holding operation", "standby operation" or "holding/standby operation", as used herein, refer to a process of sustaining a state of a memory cell by maintaining the stored charge. Maintenance of the stored charge may be facilitated by applying a back bias to the cell in a manner described herein.

A "back bias terminal" refers to a terminal at the back side of a semiconductor transistor device, usually at the opposite side of the gate of the transistor. A back bias terminal is also commonly referred to as a "back gate terminal". Herein, the back bias terminal may refer to the substrate terminal and/or the buried well terminal, depending upon the embodiment being described.

The term "back bias" refers to a voltage applied to a back bias terminal.

Detailed Description

FIG. 1 is a schematic representation of an illustrative, non-exclusive example of a first embodiment 1 of a memory cell 9, which also may be referred to herein as a cell 9, according to the present disclosure. The embodiment of FIG. 1 also may be referred to herein as a dual-port memory cell 1, a memory cell 1, and/or a cell 1. Cell 1 is formed in and/or on a substrate 12 of a first conductivity type, such as a p-type conductivity type, for example. Substrate 12 may include any suitable substrate, an illustrative, non-exclusive example of which includes a silicon on insulator (SOI) substrate. Similarly, substrate 12 may be formed from any suitable semiconductor material, illustrative, non-exclusive examples of which include silicon, germanium, silicon germanium, gallium arsenide, carbon nanotubes, and/or other semiconductor materials.

Substrate 12 has a surface 14 and includes a buried insulator layer 22. Buried insulator layer 22 may include any suitable dielectric material, an illustrative, non-exclusive example of which includes silicon oxide.

Memory cell 1 includes a first region 18 having a second conductivity type, such as an n-type conductivity type, that is formed in substrate 12, a second region 16 having the second conductivity type that is formed in substrate 12 and spaced apart from the first region 18, and a third region 20 having the second conductivity type that is formed in substrate 12 and spaced apart from the first and second regions 18 and 16, respectively. First, second and third regions 18, 16 and 20, respectively, may be exposed at and/or proximal to surface 14 and may be formed using any suitable method and/or process, illustrative, non-exclusive examples of which include ion implantation and/or solid state diffusion.

Figure 3:
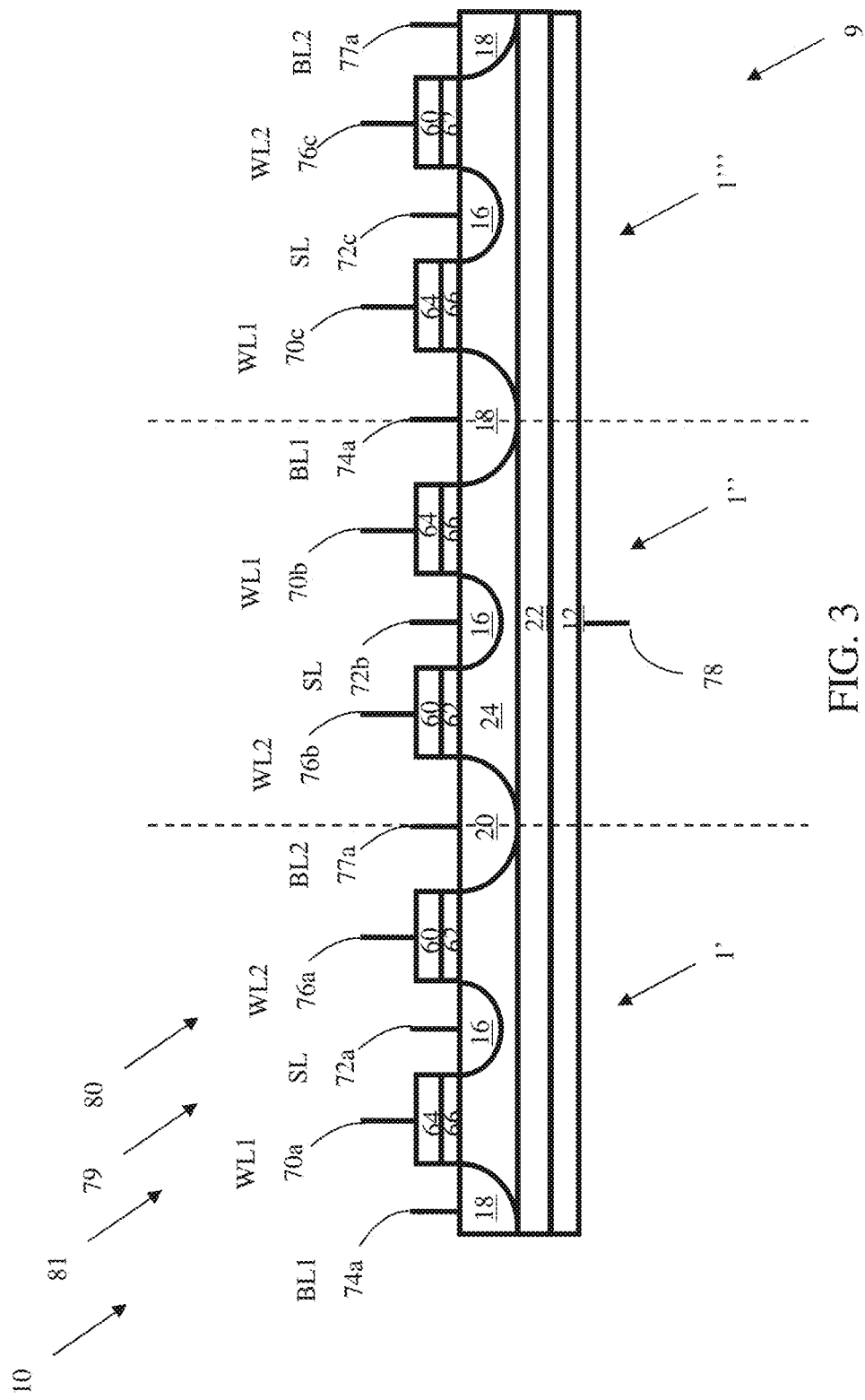
FIG. 3 provides a schematic representation of an illustrative, non-exclusive example of a row and/or column of memory cells according to the present disclosure.
Figure 4:
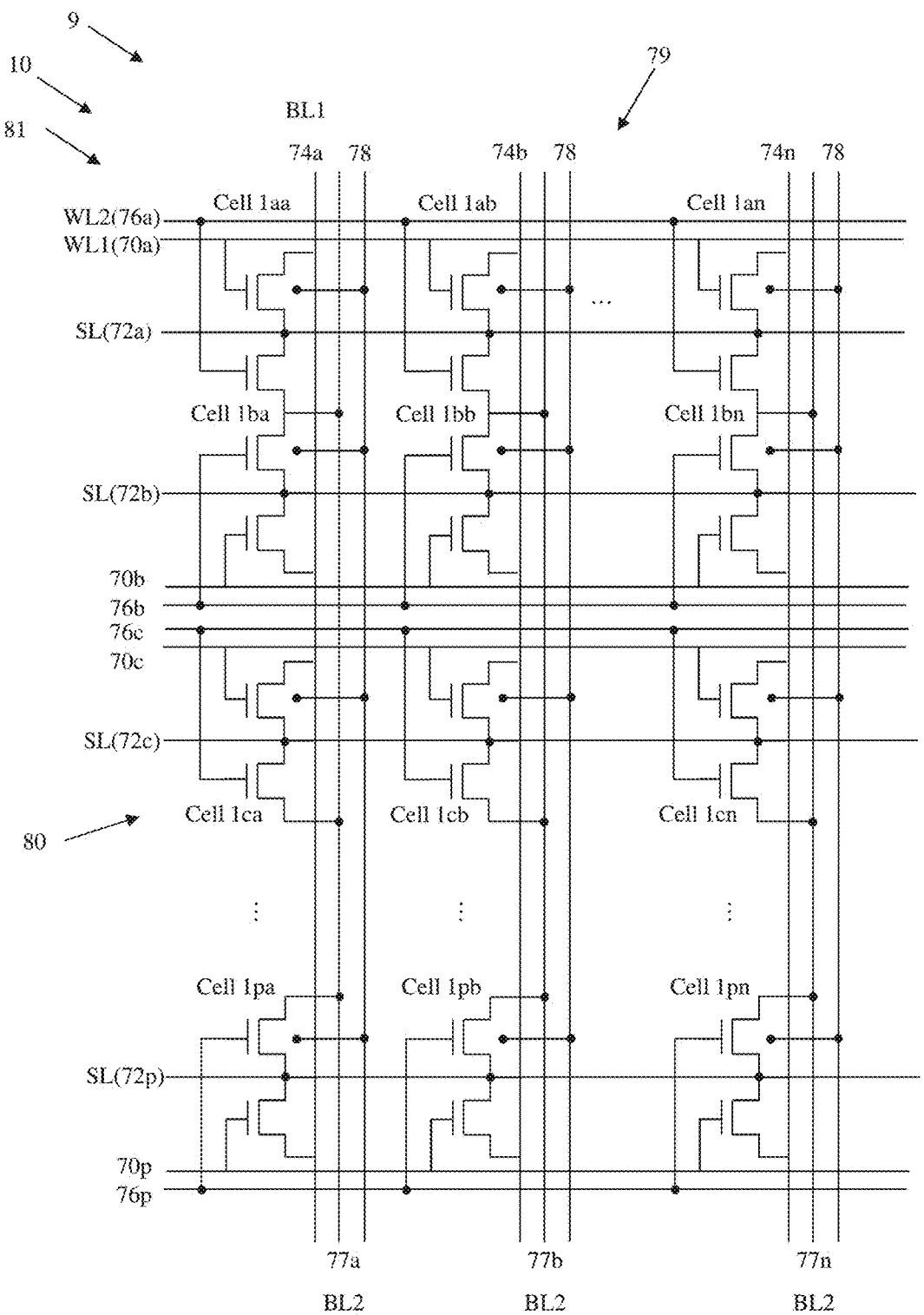
FIG. 4 provides a schematic representation of an illustrative, non-exclusive example of an array of memory cells of the first embodiment according to the present disclosure.

A floating body region 24, which also may be referred to herein as a common body region 24 and/or a shared body region 24, having a first conductivity type, such as a p-type conductivity type, is bounded by surface 14, first, second and third regions 18, 16, and 20, respectively, and by buried insulator layer 22. Floating body region 24 may be formed using any suitable method and/or process, illustrative, non-exclusive examples of which include an ion implantation process and/or epitaxial growth. Multiple cells 1 may be joined in an array 81 to form a memory device and/or a portion thereof 10 as illustrated in FIGS. 3 and 4.

Referring back to FIG. 1, the method and/or process utilized to form first and third regions 18 and 20, respectively, may be optimized such that the regions 18 and 20 reach buried insulator layer 22 and insulate floating body 24 from a neighboring floating body 24 of an adjacent cell when multiple cells 1 are joined in an array 81. On the other hand, the method and/or process utilized to form second region 16 may be optimized such that region 16 does not reach buried insulator layer 22. Therefore, floating body 24 is not isolated on the side by the first region 16.

A first gate 60 may be positioned in between the regions 16 and 18, and above the surface 14. A second gate 64 may be positioned in between the regions 16 and 20, and above the surface 14. Gate 60 is insulated from surface 14 by a first insulating layer 62 and gate 64 is insulated from surface 14 by a second insulating layer 66. Insulating layers 62 and 66 may be formed from any suitable dielectric material, illustrative, non-exclusive examples of which include silicon oxide, high-K dielectric materials, tantalum peroxide, titanium oxide, zirconium oxide, hafnium oxide, and/or aluminum oxide. Gates 60 and 64 may be made from any suitable conductive material, illustrative, non-exclusive examples of which include a polysilicon material, a metal gate electrode, tungsten, tantalum, titanium and/or their nitrides.

Cell 1 further includes a word line #1 (WL1) terminal 70 electrically connected to gate 60, a word line #2 (WL2) terminal 76 electrically connected to gate 64, a source line (SL) terminal 72 electrically connected region 16, a bit line #1 (BL1) terminal 74 electrically connected to region 18, a bit line #2 (BL2) terminal 77 electrically connected to region 20, and a substrate terminal 78 electrically connected to substrate 12. WL1 terminal 70 and BL1 terminal 74 also may be referred to herein as 'port #1'. Similarly, WL2 terminal 76 and BL2 terminal 77 also may be referred to herein as 'port #2'.

As discussed in more detail herein, the conductivity types described above are exemplary conductivity types and other conductivity types and/or relative conductivity types are also within the scope of the present disclosure. As an illustrative, non-exclusive example, memory cell 1 may have and/or include an n-type conductivity type as the first conductivity type and a p-type conductivity type as the second conductivity type.

As shown in the illustrative, non-exclusive example of FIG. 1, memory cells 9 according to the present disclosure may be configured and/or constructed such that a single cross-section of the memory cell (i.e., a single plane) that is taken in a direction that is at least substantially perpendicular to a plane of substrate 12 may pass through the floating body region, each of the plurality of conductive regions, and each of the plurality of gates that are associated with the memory cell. Similarly, the single cross-section (i.e., the single plane) may pass through each of the plurality of ports that is included in the memory cell. Thus, each of floating body region 24, conductive regions 16, 18, and 20, and gates 60 and 64 are included in the single cross-section of FIG. 1.

Such memory cells may be referred to herein as elongate memory cells 9, planar memory cells 9, series memory cells 9, and/or linear memory cells 9. These memory cells also may be referred to herein as elongate, planar, series, and/or linear semiconductor memory cells 9, multi-port semiconductor memory cells 9, and/or multi-port memory cells 9. Such memory cells further may be referred to as including a plurality of cross-sectionally coplanar ports, a plurality of cross-sectionally coplanar conductive regions, and/or a plurality of cross-sectionally coplanar gates. Adjacent rows of such memory cells 9 may be separated by an insulating region, for example, insulating region 28 as shown in the schematic illustration of a top-view of the memory cells 9 shown in FIGS. 10, 38, and 39.

Figure 2:
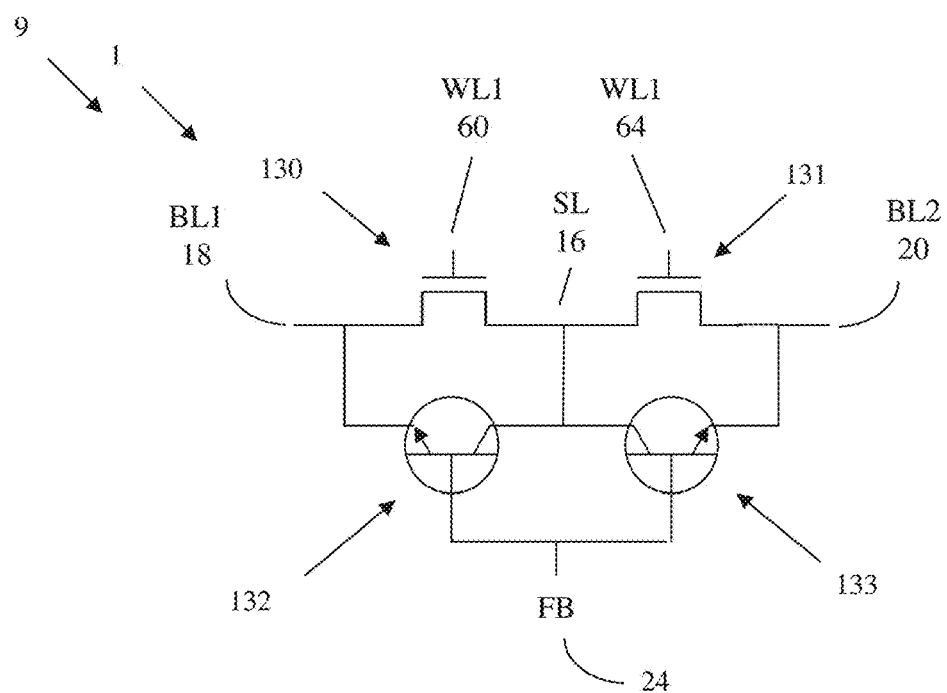
FIG. 2 provides a schematic representation of an equivalent circuit diagram of the memory cell of FIG. 1.

FIG. 2 is an illustrative, non-exclusive example of an equivalent circuit diagram for memory cell 1 of FIG. 1. As shown in FIG. 2, memory cell 1 includes first n-type metal oxide semiconductor field-effect transistor (MOSFET) 130, which is formed by gate 60, BL1 region 18, SL region 16, and floating body 24, and second MOSFET 131, which is formed by gate 64, BL2 region 20, SL region 16, and floating body 24. Memory cell 1 also includes first n-p-n bipolar device 132, which is formed by floating body 24, BL1 region 18, and SL region 16, and second n-p-n bipolar device 133, which is formed by floating body 24, BL2 region 20, and SL region 16. P-type substrate 12 of the current embodiment of the memory cell 1 will be grounded. It can be seen that dual-port memory cell 1 consists of two field-effect transistors 130 and 131 connected in series, where SL region 16 and floating body 24 is shared between the two field-effect transistors.

As shown in FIGS. 3 and 4, and discussed in more detail herein, a plurality of memory cells 1 may be combined in a column 79, a row 80, and/or an array 81 of columns 79 and rows 80, which also may be referred to herein as a memory array 81, to form a memory device 10. FIG. 3 provides an illustrative, non-exclusive example of 3 adjacent cells 1', 1", and 1' on row 'a' connected together with shared bit lines, where every other row of array 81 is mirrored from its previous row. FIG. 4 provides an illustrative, non-exclusive example of array 81 made up of cells 1. In FIG. 4, each cell is denoted by '1xy' cell location notation, where the number '1' refers to cell 1, the 'x' refers to the row and the 'y' refers to the column locations.

Each row 80 in array 81 may include a plurality of memory cells 1. Because first region 18 and third region 20, which also may be referred to herein as active regions 18 and 20, respectively, are open-ended at the boundary of cell 1, without any insulator and/or other non-conductive structure therebetween, they may combine with the regions 18 and 20 of the adjacent cells when multiple cells 1 are joined together to form column 79 and/or memory array 81. In order to prevent shorting of port #1 and port #2 bit lines, the adjacent memory port terminals may be mirrored to each other.

As an illustrative, non-exclusive example, and as shown in FIG. 3, region 18 and BL1 terminal 74*a* of cell 1" are shared with adjacent cell 1' immediately next to region 18. Similarly, region 20 and BL2 terminal 77*a* of cell 1' are shared together with the adjacent cell 1" immediately next to region 20.

Memory cells 1 may be operated with a plurality of different biasing conditions, and the response of memory cells 1 to the different biasing conditions may vary with the particular conditions, as well as the memory state of the memory cells. This may include operating the memory cells in a plurality of modes, or operational modes, illustrative, non-exclusive examples of which include an idle mode, in which memory cell 1 may not be actively retaining a memory state, and a holding mode, in which memory cell 1 may be actively retaining the memory state. Additionally or alternatively, this also may include operating and/or utilizing the memory cell in a plurality of operations, illustrative, non-exclusive examples of which include read operations, in which the memory state of the memory cell is being accessed, or read, by another circuit and/or device, such as a read circuit, and write operations, in which the memory state of the memory cell is set to a desired, target, or specific memory state by another circuit and/or device, such as a write circuit.

FIGS. 5 and 6 provide illustrative, non-exclusive examples of biasing conditions that may be applied to memory cells 1 and/or that may be associated with and/or included in at least a portion of the plurality of modes in which the memory cells may be operated and/or operations in which the memory cells may be utilized. illustrative, non-exclusive examples of the response of memory cell 1 to these various biasing conditions, as well as the modes and/or the operations thereof, are discussed in more detail herein.

As discussed in more detail herein, memory cell 1, column 79, row 80, and/or array 81 of memory device 10 may be operated in an idle mode, in which the memory cell may not be actively retaining the memory state. With reference to FIG. 1, memory cell 1 may be in the idle mode under the following conditions: zero voltage is applied to terminals 78, 72, 74 and 77, and a zero or negative voltage is applied to terminals 70 and 76. In one particular non-limiting embodiment, approximately 0.0 volt may be applied to terminals 78, 72, 74, 77, 70 and 76. However, these voltage levels may vary.

When memory cell 1 is in the idle mode and floating body 24 includes a positive charge, the positive charge stored in floating body region 24 will decrease over time due to the p-n diode leakage from floating body 24 to regions 16, 18, 20 and due to charge recombination. Thus, a periodic holding operation may be utilized to maintain the positive charge stored in the floating body 24. Illustrative, non-exclusive examples of periodic holding operations according to the present disclosure include 1) a row-wide holding operation, 2) a column-wide holding operation by port #1, 3) a column-wide holding operation by port #2, and 4) a column-wide holding operation simultaneously by ports #1 & #2.

Referring now to FIG. 1 for a single memory cell 1 and FIG. 4 for an array 81 of memory cells 1, illustrative, non-exclusive examples of the biasing conditions for the row-wide holding operation, as shown in FIG. 5, are presented below. The biasing conditions for the terminals of the single memory cell of FIG. 1 are indicated first and are followed (in parenthesis) by the biasing conditions for a row-wide holding operation on row "a" of array 81 of FIG. 4. The row-wide holding operation on row "a" may be performed by applying a zero bias, or voltage, to substrate terminal 78, a zero voltage to BL1 terminal 74 (columns 74*a*-74*n*), a zero or negative voltage to WL1 terminal 70 (rows 70*a*-70*p*), a positive voltage to SL terminal 72 in the row upon which the holding operation is performed (i.e. row 72*a*), a zero voltage to the remaining SL terminals of array 81 (rows 72*b*-72*p*), a zero or negative voltage to WL2 terminal 76 (rows 76*a*-76*p*), and a zero voltage to BL2 terminal 77 (columns 77*a*-77*n*).

If floating body region 24 is positively charged (i.e. in the logic-1 state, which also may be referred to herein as state '1' and/or state 1), bipolar devices 132 and 133 (of FIG. 2) will be turned on. A fraction of the bipolar device current will flow into floating body region 24 (which may be referred to herein as the base current) and maintain the state '1' data.

The efficiency of the holding operation may be enhanced by designing bipolar devices 132 and 133 to be low-gain bipolar devices, where the bipolar gain is defined as the ratio of the collector current flowing out of regions 16 to the base current flowing into floating body region 24. If floating body region 24 is not positively charged (i.e. in the logic-0 state, which also may be referred to herein as state '0' and/or state 0), bipolar devices 132 and 133 will not be turned on. Consequently, no base current will flow into floating body region 24. Therefore, memory cells in state '0' will remain in state '0'.

In one particular non-limiting embodiment, and as shown in FIG. 5, the row-wide holding operation may include the application of approximately 0.0 volts to terminals 78, 74, 70, 76 and 77, and approximately +1.2 volts to terminal 72 of the memory device of FIG. 1. However, these voltage levels may vary.

Illustrative, non-exclusive examples of biasing conditions for the column-wide holding operation by port #1 on column "a", as shown in FIG. 5, are discussed in more detail below. The column-wide holding operation by port #1 may be performed by applying a zero bias to the substrate terminal 78, a positive voltage to BL1 terminal 74 in the column upon which the holding operation is performed (i.e., column 74*a*), a zero voltage to the remaining BL1 terminals of array 81 (columns 74*b*-74*n*), a zero or negative voltage to WL1 terminal 70 (rows 70*a*-70*p*), a zero voltage to SL terminal 72 (rows 72*a*-72*p*), a zero or negative voltage to WL2 terminal 76 (rows 76*a*-76*p*) and a zero voltage to BL2 terminal 77 (columns 77*a*-77*n*).

If floating body 24 is positively charged (i.e. in state '1'), the bipolar device 132 formed by SL region 16, floating body 24, and region 18 will be turned on. A fraction of the bipolar transistor current will then flow into floating body region 24 and maintain the state '1' data.

For memory cells in state '0' data, the bipolar devices 132 and 133 will not be turned on. Consequently, no base hole current will flow into floating body region 24. Therefore, memory cells in state '0' will remain in state '0'.

In one particular non-limiting embodiment, and as shown in FIG. 5, the column-wide holding operation by port #1 may include the application of approximately 0.0 volts to terminals 78, 72, 70, 76 and 77, and approximately +1.2 volts to terminal 74. However, these voltage levels may vary.

The biasing conditions for the column-wide holding operation by port #2 on column "a", as shown in FIG. 5, are substantially similar to the biasing conditions for the column-wide holding operation by port #1 on column "a", with the exception that the positive voltage may be applied to BL2 terminal 77 in the column upon which the holding operation is performed (column 77*a*) and a zero voltage may be applied to BL1 terminal 74 in the column upon which the holding operation is performed (column 74*a*).

If floating body 24 is positively charged (i.e. in a state '1'), the bipolar device 133 formed by SL region 16, floating body 24, and region 20 will be turned on. A fraction of the bipolar transistor current will then flow into floating body region 24 and maintain the state '1' data.

For memory cells in state '0' data, the bipolar devices 132 and 133 will not be turned on. Consequently no base hole current will flow into floating body region 24. Therefore, memory cells in state '0' will remain in state '0'.

In one particular non-limiting embodiment, and as shown in FIG. 5, the column-wide holding operation by port #2 may include the application of approximately 0.0 volts to terminals 78, 74, 70, 76 and 72, and approximately +1.2 volts to terminal 77. However, these voltage levels may vary.

The biasing conditions for the column-wide holding operation on column "a" simultaneously by ports #1 and #2, as shown in FIG. 5, are substantially similar to the biasing conditions for the column-wide holding operation by port #1 on column "a", with the exception that the positive voltage may be applied to both BL1 terminal 74 and BL2 terminal 77 in the column upon which the holding operation is performed (columns 74*a* and 77*a*). A zero voltage may be applied to the remainder of the BL1 and BL2 terminals (terminals 74*b*-74*p* and 77*b*-77*p*). If floating body 24 is positively charged (i.e. in a state '1'), the bipolar devices 132 and 133 formed by SL region 16, floating body 24, and regions 18 and 20, respectively, will be turned on. A fraction of the bipolar transistor current will flow into floating body region 24 and maintain the state '1' data.

For memory cells in state '0' data, the bipolar devices 132 and 133 will not be turned on. Consequently no base hole current will flow into floating body region 24. Therefore, memory cells in state '0' will remain in state '0'.

In one particular non-limiting embodiment, and as shown in FIG. 5, the column-wide holding operation on column "a" simultaneously by ports #1 and #1 may include the application of approximately 0.0 volts to terminals 78, 72, 70 and 76, and approximately +1.2 volts to terminals 74 and 77. However, these voltage levels may vary.

While the above holding operations have been discussed in the context of a holding operation that is performed on column "a" or row "a", it is within the scope of the present disclosure that the holding operation(s) may be performed on any suitable portion of a column 79, portion of a row 80, entire column 79, entire column 80, multiple columns 79, and/or multiple rows 80, such as when a plurality of columns 79 and/or rows 80 are electrically connected in series and/or parallel.

Figure 7:
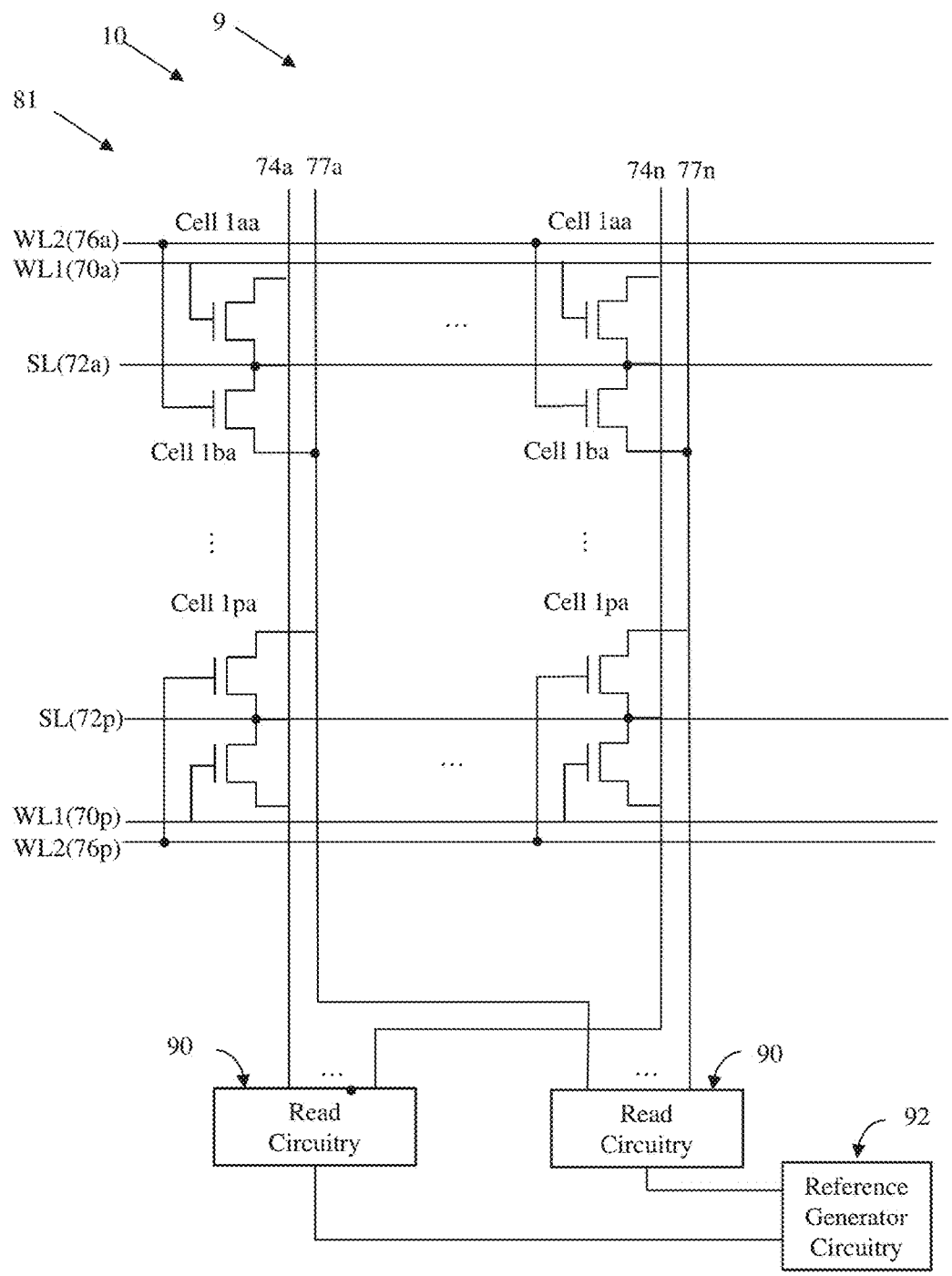
FIG. 7 provides a schematic representation of an illustrative, non-exclusive example of a read circuitry that may be utilized with the first embodiment of a memory cell according to the present disclosure.

The charge stored in the floating body 24 may be sensed by monitoring the cell current of memory cell 1. If cell 1 is in state '1' having holes in the floating body region 24, then the memory cell will have a lower threshold voltage (gate voltage where the transistor is turned on), and consequently a higher cell current, when compared to when cell 1 is in a state '0' having no holes in floating body region 24. The monitoring may be accomplished in any suitable manner and using any suitable circuit and/or circuits. FIG. 7 provides an illustrative, non-exclusive example of a read circuitry architecture that may be utilized with arrays 81 of memory cells 1 and/or 9 according to the present disclosure.

In FIG. 7, sensing circuit/read circuitry 90, which may be connected to BL1 terminal 74 and/or BL2 terminal 77 of memory array 81, may be used to determine the data state of the memory cell. Examples of the read operation is described in "A Design of a Capacitorless 1T-DRAM Cell Using Gate-Induced Drain Leakage (GIDL) Current for Low-power and High-speed Embedded Memory", and Yoshida et al., pp. 913-918, International Electron Devices Meeting, 2003 and U.S. Pat. No. 7,301,803 "Bipolar reading technique for a memory cell having an electrically floating body transistor", both of which are hereby incorporated herein, in their entireties, by reference thereto. An example of a sensing circuit is described in "An 18.5 ns 128 Mb SOI DRAM with a Floating body Cell", Ohsawa et al., pp.

458-459, 609, IEEE International Solid-State Circuits Conference, 2005, which is hereby incorporated herein, in its entirety, by reference thereto.

A read operation in dual port memory cell 1 may be performed independently by port #1 and/or port #2 irrespective of timing. However, read and write operations may not occur simultaneously in order to decrease a potential for reading incorrect data. This process may be referred as write contention avoidance and is discussed in more detail herein.

Referring to FIG. 1 for a single memory cell 1 and FIG. 4 for an array 81 of memory cells, illustrative, non-exclusive examples of the biasing conditions for a read port #1 only operation, as shown in FIG. 5, are presented below. The read port #1 only operation on cell 1aa may be performed by applying a zero voltage to substrate terminal 78, a zero voltage to SL terminal 72 (rows 72a-72p), a positive voltage to the selected BL1 terminal 74 (column 74a), a zero voltage to the remaining BL1 terminals of array 81 (columns 74b-74n), a positive voltage greater than the positive voltage applied to the selected BL1 terminal 74 (74a) to the selected WL1 terminal 70 (row 70a), a zero or negative voltage to the remaining WL1 terminals of array 81 (rows 70b-70p), a zero or negative voltage to WL2 terminal 76 (rows 76a-76p), and a zero voltage to BL2 terminal 77 (columns 77a-77n).

Similarly, and as also shown in FIG. 5, the read port #2 only operation may be performed on cell 1aa. The read port #2 operation may be performed by applying a zero voltage to substrate terminal 78, a zero voltage to SL terminal 72 (rows 72a-72p), a zero voltage to BL1 terminal 74 (columns 74a-74n), a zero or negative voltage to WL1 terminal 70 (rows 70a-70p), a positive voltage to the selected BL2 terminal 77 (column 77a), a zero voltage to the remaining BL2 terminals of array 81 (columns 77b-77n), a positive voltage greater than the positive voltage applied to the selected BL2 terminal 77 (77a) to the selected WL2 terminal 76 (row 76a), and a zero or negative voltage to the remaining WL2 terminals of array 81 (rows 76b-76p).

Additionally or alternatively, and as also shown in FIG. 5, simultaneous read operations by port #1 and port #2 also may be performed on cell 1aa. The simultaneous read operations may be performed by applying a zero voltage to substrate terminal 78, a zero voltage to SL terminal 72 (rows 72a-72p), a positive voltage to the selected BL1 terminal 74 (column 74a) and the selected BL2 terminal 77 (column 77a), a zero voltage to the remaining BL1 and BL2 terminals of array 81 (columns 74b-74n and 77b-77n), a positive voltage greater than the positive voltage applied to the selected BL1 terminal 74 (column 74a) and the selected BL2 terminal 77 (column 77a) to the selected WL1 terminal 70 (row 70a) and the selected WL2 terminal 76 (row 76a), and a zero or negative voltage to the remaining WL1 and WL2 terminals of array 81 (rows 70b-70p and 76b-76p).

In one particular non-limiting embodiment, and as shown in FIG. 5, about 0.0 volts is applied to terminal 72, about +0.4 volts is applied to the selected terminal 74a and/or 77a, about +1.2 volts is applied to selected terminal 70a and/or 76a, and about 0.0 volts is applied to terminal 78. The unselected terminals 74 or 77 remain at 0.0 volts and the unselected terminal 70 or 76 remain at 0.0 volts. However, these voltage levels may vary while maintaining the relative relationships between voltage levels as generally described above.

As a result of the bias conditions applied as described, the unselected memory cells will be at idle mode, maintaining the states of the respective floating bodies 24 thereof. Furthermore, the idle mode does not interrupt the read operation of the selected memory cell 1aa. Similarly, read operation on port #1 may be performed on any different cell in array 81 from read operation on port #2 simultaneously. As an illustrative, non-exclusive example, this may include reading port #1 on cell 1aa and reading port #2 on cell 1bb simultaneously.

For memory cells 1 sharing the same row as the selected memory cell, BL terminals 74 or 77 and substrate terminal 78 are at about 0.0 volt. As can be seen, these cells will be at idle mode because the emitter and collector terminals of intrinsic n-p-n bipolar devices 132 and 133 will be at zero potential and no current will flow from cell 1. For memory cells 1 sharing the same column as the selected memory cell, a positive voltage is applied to BL terminals 74 or 77. However, WL terminal 70 or 76 is at zero volts and MOSFET transistor 130 or 131 is turned off. Thus, no current flows from regions 18 or 20 to region 16.

For memory cells 1 not sharing the same row or the same column as the selected memory cell, SL terminal 72, BL terminals 74 or 77 and WL terminals 70 or 76 are at about 0.0 volts. As can be seen, these cells will be at idle mode. Thus, unselected memory cells 1 during a read operation will remain in idle mode.

Writing '0' to cell 1 may be accomplished by utilizing a plurality of biasing schemes, illustrative, non-exclusive examples of which are shown in FIG. 6 and include 1) Source-line row-wide write '0', 2) Row-wide write '0' via gate tunneling method by port #1 or port #2, and 3) Bit-selective write '0' by port #1 or port #2. Bit-selective write may allow the write '0' operation to be performed on a specific memory cell without affecting unselected memory cells in the array. Row-wide write '0' may be utilized for memory reset and/or erase for any particular row and/or group of rows in array 81 and may be performed using the SL terminal that is common to both ports. Bit-selective write '0' may be used for regular random memory address write operations.

Referring once again to FIG. 1 for a single memory cell 1 and FIG. 4 for an array 81 of memory cells, illustrative, non-exclusive examples of the biasing conditions for a source-line row-wide write '0' operation to row "a", as shown in FIG. 6, are presented below. The source-line (S L) row-wide write '0' operation on row "a" may be performed by applying a negative voltage to SL terminal 72 (row 72a), a zero voltage to the remaining SL terminals of array 81 (rows 72b-72p), and a zero voltage to substrate terminal 78, WL1 terminal 70 (rows 70a-70p), BL1 terminal 74 (columns 74a-74n), WL2 terminal 76 (rows 76a-76p), and BL2 terminal 77 (columns 77a-77n).

Under these conditions, the p-n junctions (junction between 24 and 16) are forward-biased, evacuating any holes from floating body 24. In one particular non-limiting embodiment, about −1.2 volts may be applied to terminal 72 and about 0.0 volt may be applied to terminals 78, 70, 74, 76 and 77. However, these voltage levels may vary, while maintaining the relative relationships between the charges applied, as described above.

The bias conditions for all the unselected cells are the same since the write '0' operation only involves applying a negative voltage to the SL terminal 72 (thus to the entire row). As can be seen, the unselected memory cells will be in idle mode, with WL1, BL1, WL2, BL2 and SL terminals at about 0.0 volts.

Illustrative, non-exclusive examples of the biasing conditions for the row-wide write '0' operation via the gate-tunneling method to row 'a' by port #1, as shown in FIG. 6, are presented below. The row-wide write '0' operation via the gate-tunneling method by port #1 may be performed by applying a relatively higher (when compared to the source-line row-wide write '0' operation) negative voltage to WL1 terminal 70 (row 70a), a zero voltage to the remaining WL1 terminals in array 81 (rows 70b-70p), and a zero voltage to substrate terminals 78, BL1 terminal 74 (columns 74a-74n), SL terminal 72 (rows 72a-72p), WL2 terminal 76 (rows 76a-76p), and BL2 terminal 77 (columns 77a-77n).

Under these conditions, charges that may be present within floating body 24 will evacuate through insulator layer 62 to gate 60 and floating body 24 will be placed in state '0'. WL1 terminal 70 for unselected cells 1 that are not commonly connected to the selected cell will remain grounded. In one particular non-limiting embodiment, for selected cell 1 a potential of about −2.4 volts is applied to WL1 terminal 70 and a potential of about 0.0 volt is applied to substrate terminal 78, BL1 terminal 74, SL terminal 72, WL2 terminal 76 and BL2 terminal 77. However, these voltage levels may vary.

Illustrative, non-exclusive examples of the biasing conditions for the row-wide write '0' operation via gate-tunneling method to row "a" by port #2, as shown in FIG. 6, are presented below. The row-wide write '0' operation via gate-tunneling method by port #2 may be performed by applying a relatively larger (when compared to the source-line row-wide write '0' operation) negative voltage to WL2 terminal 76 (76a), a zero voltage to the remaining WL2 terminals in array 81 (rows 76b-76p), and a zero voltage to substrate terminal 78, BL1 terminal 74 (columns 74a-74n), SL terminal 72 (rows 72a-72p), WL1 terminal 70 (rows 70a-70p), and BL2 terminal 77 (columns 77a-77n).

Under these conditions, charges that may be present within floating body 24 will evacuate through insulator layer 66 to gate 64 and floating body 24 will be placed in state '0'. WL2 terminal 76 for unselected cells 1 that are not commonly connected to the selected cell will remain grounded. In one particular non-limiting embodiment, for the selected cell a potential of about −2.4 volts is applied to WL2 terminal 76 and a potential of about 0.0 volt is applied to substrate terminal 78, BL1 terminal 74, SL terminal 72, WL1 terminal 70 and BL2 terminal 77. However, these voltage levels may vary.

The bias conditions for all the unselected cells are the same since the write '0' operation only involves applying a negative voltage to the WL terminals 70/76 (thus to the entire row). As can be seen, the unselected memory cells will be in the idle mode, with WL1, BL1, WL2, BL2 and SL terminals at about 0.0 volts. Thus, the idle mode does not interrupt the row-wide write '0' operation of the memory cells. Furthermore, the unselected memory cells will remain in idle mode during a row-wide write '0' operation.

Illustrative, non-exclusive examples of the biasing conditions for the bit-selective write '0' operation on selected memory cell 1aa by port #1, as shown in FIG. 6, are presented below. The bit-selective write '0' operation on selected memory cell 1aa by port #1 may be performed by applying a positive voltage to WL1 terminal 70 (row 70a), a zero voltage to the remaining WL1 terminals in array 81 (rows 70b-70p), a negative voltage to BL1 terminal 74 (column 74a), a zero voltage to the remaining BL1 terminals in array 81 (columns 74b-74n), a zero or positive voltage to SL terminal 72 (rows 72a-72p), a zero or negative voltage to WL2 terminal 76 (rows 76a-76p), a zero voltage to BL2 terminal 77 (columns 77a-77n), and a zero voltage to substrate terminal 78.

Under these conditions, the floating body 24 potential will increase through capacitive coupling from the positive voltage applied to WL1 terminal 70. As a result of the floating body 24 potential increase and the negative voltage applied to BL1 terminal 74, the p-n junction (junction between regions 24 and 18) will be forward-biased, evacuating any holes from floating body 24.

The applied bias to selected WL1 terminal 70 and selected BL1 terminal 74 may affect the states of the unselected memory cells 1 sharing the same WL1 or BL1 terminal as the selected memory cell 1. To reduce the potential for an undesired write '0' disturb to other memory cells 1 in the memory array 81, the applied potential may be optimized as follows: If the floating body 24 potential of state '1' is referred to as $V_{FB1}$, then the voltage applied to WL1 terminal 70 is configured to increase the potential of floating body 24 by $V_{FB1}/2$, and $-V_{FB1}/2$ may be applied to BL1 terminal 74. This will decrease the floating body 24 potential change in the unselected cells in state '1' sharing the same BL1 terminal as the selected cell from $V_{FB1}$ to $V_{FB1}/2$. For memory cells 1 in state '0' sharing the same WL1 terminal as the selected cell 1, unless the increase in floating body 24 potential is sufficiently high (i.e., at least $V_{FB}/3$, see below), then n-p-n bipolar devices 132 and 133 will not be turned on and/or the base hold current will be low enough that it does not result in an increase of the floating body 24 potential over the time during which the write operation is carried out (write operation time).

In the memory cell of FIG. 1, it has been determined that a floating body 24 potential increase of $V_{FB}/3$ is low enough to suppress the floating body 24 potential increase. A positive voltage may be applied to SL terminal 72 to further reduce the undesired write '0' disturb on other memory cells 1 in the memory array. The unselected cells will remain in idle mode, i.e. zero or negative voltage applied to WL1 terminal 70 and zero voltage applied to BL1 terminal 74.

In one particular non-limiting embodiment, for the selected cell a potential of about 0.0 volts is applied to terminal 78, a potential of about −0.2 volts is applied to terminal 74, a potential of about +0.5 volts is applied to terminal 70 (which will increase the potential of the floating body region 24 through capacitive coupling), and a potential of about 0.0 volts is applied to terminals 72, 76, and 77. However, these voltage levels may vary.

Illustrative, non-exclusive examples of the biasing conditions for the bit-selective write '0' operation on selected memory cell 1aa by port #2, as shown in FIG. 6, are presented below. The bit-selective write '0' operation on selected memory cell 1aa by port #1 may be performed by applying a positive voltage to WL2 terminal 76 (row 76a), a zero voltage to the remaining WL2 terminals in array 81 (rows 76b-76p), a negative voltage to BL2 terminal 77 (column 77a), a zero voltage to the remaining BL2 terminals in array 81 (columns 77b-77n), a zero or positive voltage to SL terminal 72 (rows 72a-72p), a zero or negative voltage to WL1 terminal 70 (rows 70a-70p), a zero voltage to BL1 terminal 74, and a zero voltage to substrate terminals 78.

Under these conditions, the floating body 24 potential will increase through capacitive coupling from the positive voltage applied to the WL2 terminal 76. As a result of the floating body 24 potential increases and the negative voltage applied to the BL2 terminal 77, the p-n junction (junction between regions 24 and 20) will be forward-biased, evacuating any holes from floating body 24.

Similar to the bit-selective write '0' operation on port #1, the applied bias to selected WL2 terminal 76 and selected BL2 terminal 77 may affect the states of the unselected memory cells 1 sharing the same WL2 or BL2 terminal as the selected memory cell 1. To reduce the potential for an undesired write '0' disturb to other memory cells 1 in the memory array 81, the applied potential may be optimized as follows: If the floating body 24 potential of state '1' is referred to as $V_{FB1}$, then the voltage applied to WL2 terminal 76 is configured to increase the potential of floating body 24 by $V_{FB1}/2$, and $-V_{FB1}/2$ may be applied to BL2 terminal 77. This will decrease the floating body 24 potential change in the unselected cells in state '1' sharing the same BL2 terminal as the selected cell from $V_{FB1}$ to $V_{FB1}/2$. For memory cells 1 in state '0' sharing the same WL2 terminal as the selected cell 1, unless the increase in floating body 24 potential is sufficiently high (i.e., at least $V_{FB}/3$, see below), then the n-p-n bipolar devices 132 and 133 will not be turned on and/or the base hold current will be low enough that it does not result in an increase of the floating body 24 potential over the time during which the write operation is carried out (write operation time).

In the memory cell of FIG. 1, it has been determined that a floating body 24 potential increase of $V_{FB}/3$ is low enough to suppress the floating body 24 potential increase. A positive voltage may be applied to SL terminal 72 to further reduce the undesired write '0' disturb on other memory cells 1 in the memory array. The unselected cells will remain at idle mode, i.e. zero or negative voltage applied to WL2 terminal 76 and zero voltage applied to BL2 terminal 77.

In one particular non-limiting embodiment, for selected cell 1 a potential of about 0.0 volts is applied to terminal 78, a potential of about −0.2 volts is applied to terminal 77, a potential of about +0.5 volts is applied to terminal 76 (which will increase the potential of the floating body region 24 through capacitive coupling), and a potential of about 0.0 volts is applied to terminals 72, 70, and 74. However, these voltage levels may vary.

A write '1' operation by either port #1 or port #2 may be performed on memory cell 1 using any suitable method, process, and/or mechanism. Illustrative, non-exclusive examples of suitable mechanisms include an impact ionization mechanism and/or a band-to-band tunneling mechanism, as described for example in "A Design of a Capacitorless 1T-DRAM Cell Using Gate-Induced Drain Leakage (GIDL) Current for Low-power and High-speed Embedded Memory", Yoshida et al., pp. 913-918, International Electron Devices Meeting, 2003.

With continued reference to FIGS. 1 and 4, illustrative, non-exclusive examples of the biasing conditions for the band-to-band tunneling write '1' GIDL operation on selected memory cell 1aa by port #1, as shown in FIG. 6, are presented below. The band-to-band tunneling write '1' GIDL operation to selected memory cell 1aa by port #1 may be performed by applying a zero voltage to substrate terminal 78, a negative voltage to WL1 terminal 70 (row 70a), a zero voltage to the remaining WL1 terminals in array 81 (rows 70b-70p), a positive voltage to BL1 terminal 74 (column 74a), a zero voltage to the remaining BL1 terminals in array 81 (columns 74b-74n), zero voltage to SL terminal 72 (rows 72a-72p), a zero or negative voltage to WL2 terminal 76 (rows 76a-76p), and a zero voltage to BL2 terminal 77 (columns 77a-77n).

The negative bias on WL1 terminal 70 and the positive bias on BL1 terminal 74 will result in hole injection into floating body 24. The unselected cells 1 will remain in the idle mode. In one particular non-limiting embodiment, about 0.0 volts is applied to terminal 78, about +1.2 volts is applied to terminals 74, about −1.2 volts is applied to terminal 70, and about 0.0 volts is applied to terminals 72, 76 and 77. However, these voltage levels may vary.

Illustrative, non-exclusive examples of the biasing conditions for the band-to-band tunneling write '1' GIDL operation on selected memory cell 1aa by port #2, as shown in FIG. 6, are presented below. The biasing conditions for the write '1' operation by port #2 are substantially similar to the biasing conditions for the write '1' operation by port #1, except that the positive voltage is applied to BL2 terminal 77 (column 77a) of the selected memory cell instead of to BL1 terminal 74 (74a) of the selected memory cell, which instead has a zero or negative voltage applied thereto; and the negative voltage is applied to WL2 terminal 76 (row 76a) instead to WL1 terminal 70 (row 70a), which instead has a zero or negative voltage applied thereto. In one particular non-limiting embodiment, about 0.0 volts is applied to terminal 78, about +1.2 volts is applied to terminal 77, about −1.2 volts is applied to terminal 76, and about 0.0 volts is applied to terminals 72, 70 and 74. However, these voltage levels may vary.

When performing the band-to-band tunneling write '1' GIDL operation on selected memory cell 1aa by port #1 and/or port #2, unselected memory cells sharing the same row as the selected memory cell will have their SL terminal 72 and BL1 (or BL2) terminal 74 (or 77) at about 0.0 volts and their WL1 (or WL2) terminal 70 (or 76) at zero or negative voltage. Thus, the unselected memory cells are in idle mode. As a result, the states of these unselected memory cells will remain unchanged.

For unselected memory cells sharing the same column as the selected memory cell, SL terminal 72 and WL1 (or WL2) terminal 70 (or 76) will be at about 0.0 volt and BL1 (or BL2) terminal 74 (or 77) will be at about +1.2 volts. Comparing with the holding operation bias condition, it can be seen that cells sharing the same column (i.e. the same BL1/BL2 terminals 74/77) are in the holding operation. As a result, the states of these memory cells will remain unchanged.

For unselected memory cells not sharing the same row or the same column as the selected memory cell, the SL terminal 72, WL1/WL2 terminal 70/76 and BL1/BL2 terminals 74/77 are at about 0.0 volts. Thus, these cells will be in the idle mode. As a result, the idle mode and the holding operation do not interrupt the write '1' operation of the selected memory cell(s).

Illustrative, non-exclusive examples of the biasing conditions for the write '1' operation on selected memory cell 1aa by port #1 using the impact ionization method, as shown in FIG. 6, are presented below. The impact ionization write '1' operation to selected memory cell 1aa by port #1 may be performed by applying a zero voltage to substrate terminal 78, a positive voltage to BL1 terminal 74 (column 74a), a zero voltage to the remaining BL1 terminals 74 in array 81 (columns 74b-74n), a positive voltage to WL1 terminal 70 (row 70a), a zero voltage to the remaining WL1 terminals 70 in array 81 (rows 70b-70p), and a zero voltage to SL terminal 72 (rows 72a-72p), WL2 terminal 76 (rows 76a-76p), and BL2 terminal 77 (columns 77a-77n).

If the potential of bit line region 18 is equal to or higher than the difference between the potential of gate 60 and the threshold voltage, a pinch-off region may be formed near bit line region 18. A large electric field will be developed in this pinch-off region, accelerating the electrons flowing from source line region 16 to bit line region 18. These energetic electrons will collide with atoms in the semiconductor lattice, which will generate hole-electron pairs in the vicinity of the junction. The electrons will be swept into bit line region 18 by the electric field and become a bit line current, while the holes will be swept into the floating body region, becoming the hole charge that creates the state '1'.

In one particular non-limiting embodiment, to perform a write '1' operation to the selected cell 1 by port #1, a potential of about 0.0 volts is applied to terminal 78, a potential of about +1.2 volts is applied to terminal 74, a potential of about +1.2 volts is applied to terminal 70, and a potential of about 0.0 volts is applied to terminals 72, 76 and 77. For the unselected cells not sharing the same WL1 terminal or BL1 terminal with the selected memory cell 1, about 0.0 volts is applied to terminal 72, about 0.0 volts is applied to terminal 74, about 0.0 volts is applied to terminal 70, about 0.0 volt is applied to terminal 78, about 0.0 volts is applied to terminal 76, and about 0.0 volts is applied to terminal 77. However, these voltage levels may vary.

Illustrative, non-exclusive examples of the biasing conditions for the write '1' operation on selected memory cell 1aa by port #2 using the impact ionization method, as shown in FIG. 6, are presented below. The biasing conditions for the write '1' operation by port #2 are substantially similar to the biasing conditions for the write '1' operation by port #1, except that the positive voltage is applied to BL2 terminal 77 (column 77a) and WL2 terminal 76 (row 76a) of the selected memory cell instead of to BL1 terminal 74 (column 74a) and WL1 terminal 70 (row 74a), which instead have a zero voltage applied thereto.

In one particular non-limiting embodiment, to perform a write '1' operation to the selected cell 1 by port #2, a potential of about 0.0 volts is applied to terminal 72, a potential of about 0.0 volt is applied to terminal 74, a potential of about 0.0 volts is applied to terminal 70, a potential of about 0.0 volts is applied to terminal 78, a potential of about +1.2 volts is applied to terminal 76, and a potential of about +1.2 volts is applied to terminal 77. However, these voltage levels may vary.

Figure 8:
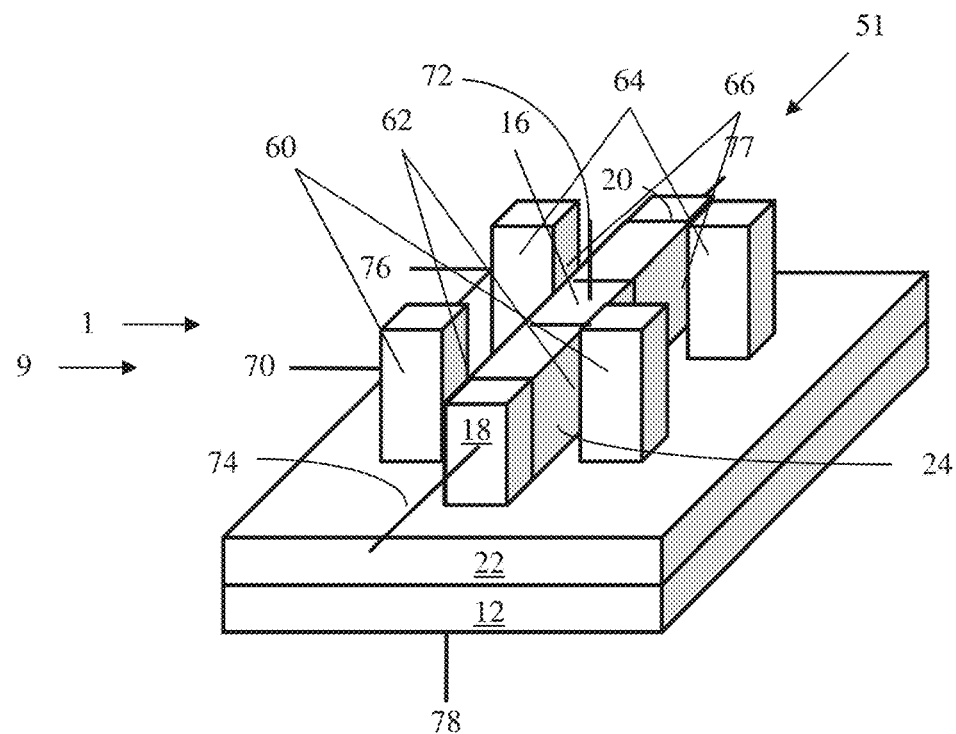
FIGS. 8-9 provide three-dimensional schematic representations of illustrative, non-exclusive examples of the first embodiment of a memory cell according to the present disclosure.
Figure 9:
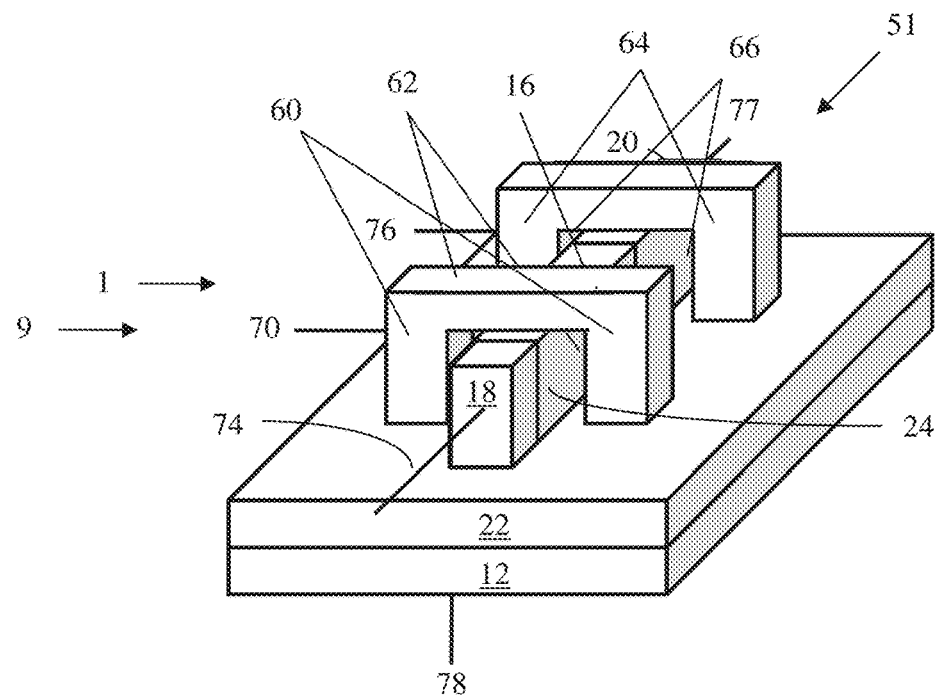
Figure 10:
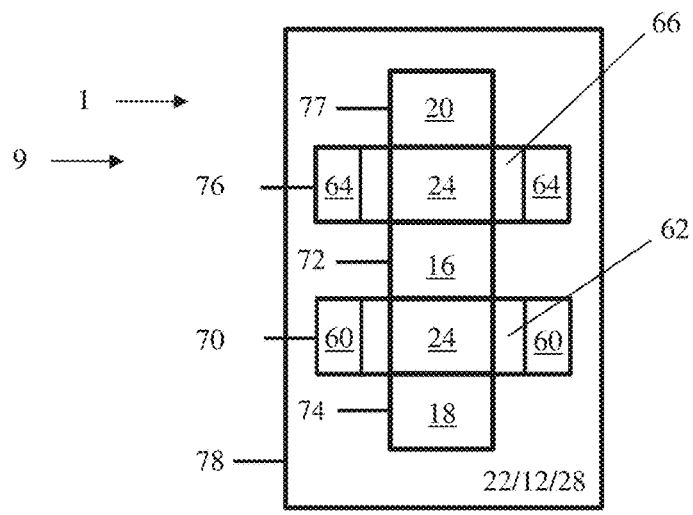
FIG. 10 provides a schematic representation of a top view of the memory cell of FIG. 8.

FIGS. 8 and 9 are three-dimensional schematic representations of additional illustrative, non-exclusive examples of memory cells 1 according to the present disclosure, while FIG. 10 is a top view of the memory cell of FIG. 8. The memory cells of FIGS. 8-10 are functionally similar to dual-port memory cell 1 of FIGS. 1-4 but include three-dimensional fin-type memory cells 1, which also may be referred to herein as memory cells 1 and/or cells 1. Fin-type memory cells 1 include a fin structure 51 that is fabricated on a substrate 12 having a first conductivity type (such as p-type conductivity type) so as to extend from a top surface of the substrate to form a three-dimensional structure, with fin 51 extending substantially perpendicularly to, and above, the top surface of substrate 12. Fin 51, which also may be referred to herein as fin structure 51 and/or elongate fin structure 51, includes first, second and third regions 18, 16, and 20, respectively, having the second conductivity type. A floating body region 24 is bounded by the top surface of fin 53, first region 18, second region 16, and third region 20 and insulating layers 28 (shown in FIG. 10).

The floating body region 24 is conductive having a first conductivity type (such as p-type conductivity type) and may be formed using any suitable process and/or method, illustrative, non-exclusive examples of which include an ion implantation process and/or epitaxial growth. Fin 51 may be formed from any suitable material, illustrative, non-exclusive examples of which include silicon, germanium, silicon germanium, gallium arsenide, carbon nanotubes, or other semiconductor materials. The cell 1 also includes an insulator layer 22, which may be formed from any suitable insulating, or dielectric, material, illustrative, non-exclusive examples of which are discussed in more detail herein.

Memory cell 1 further may include gates 60 and 64 on two opposite sides of floating body region 24, as shown in FIG. 8. Alternatively, gates 60 and 64 may enclose three sides of floating body region 24 as shown in FIG. 9. Gates 60 and 64 are insulated from floating body region 24 by insulating layers 62 and 66, respectively. Gates 60 are positioned between the first and second regions 18, 16 adjacent to the floating body region 24 and gates 64 are positioned between the second and third regions 16, 20, adjacent to the floating body region 24. Gates 60 and 64 are spaced apart along a longitudinal axis of fin structure 51.

Similar to dual-port memory cell 1, fin-type memory cells 1 include several terminals: word line #1 (WL1) terminal 70, word line #2 (WL2) terminal 76, source line (SL) terminal 72, bit line #1 (BL1) terminal 74, bit line #2 (BL2) terminal 77 and substrate terminal 78. Terminal 70 is connected to the gate 60. Terminal 76 is connected to the gate 64. Terminal 72 is connected to second region 16, terminal 74 is connected to first region 18, terminal 77 is connected to third region 20, and terminal 78 is connected to substrate 12.

Similar to dual-port memory cells 1, fin-type memory cells 1 may include two ports and the response of fin-type memory cells 1 to various biasing conditions is substantially similar to the response of dual-port memory cells 1 to similar biasing conditions. These biasing conditions and responses are discussed in more detail herein with reference to FIGS. 5 and 6.

Figure 11:
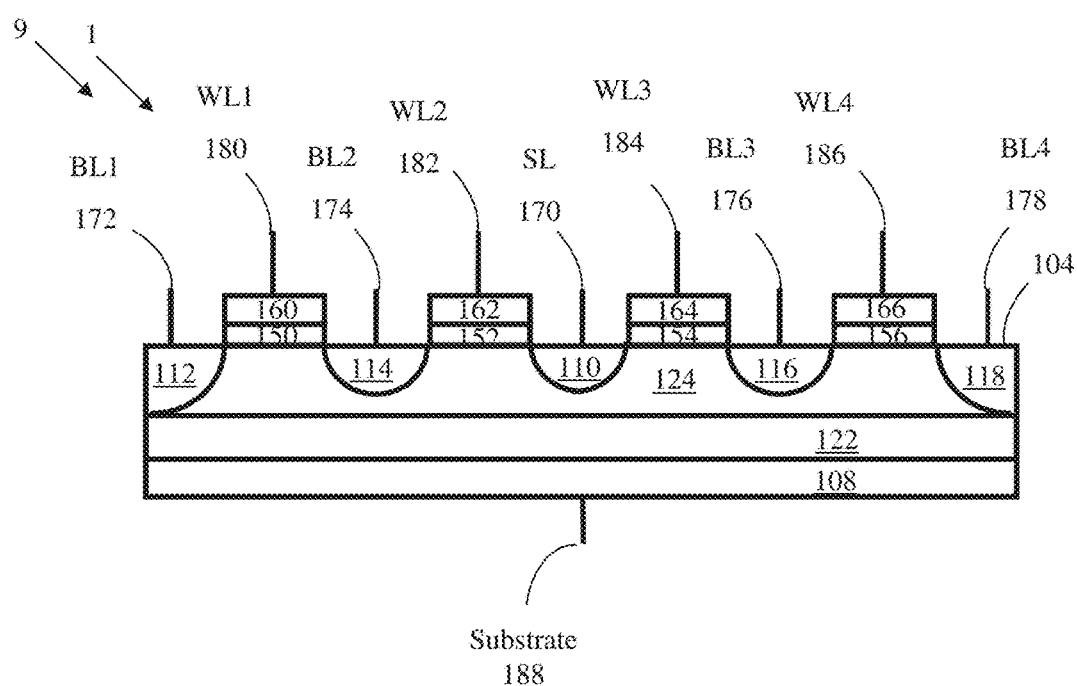
FIG. 11 provides a schematic representation of an illustrative, non-exclusive example of a quad-port memory cell of the first embodiment of a memory cell according to the present disclosure.

Dual-port memory cells 1 of FIGS. 1-4 and/or fin-type memory cells 1 of FIGS. 8-10 are shown including two ports, namely, port #1 and port #2. However, it is within the scope of the present disclosure that memory cells 1 and/or memory cells 9 may include any suitable number of ports, including 3 ports, 4 ports, 5 ports, 6 ports, 8 ports, 10 ports, or more than 10 ports. FIG. 11 is an illustrative, non-exclusive example of another embodiment of memory cell 1 according to the present disclosure. The memory cell of FIG. 11 includes four ports and also may be referred to herein as a quad-port memory cell 1, a memory cell 1, a cell 1, and/or a quad-port memory 1. Quad-port memory cell 1 may be fabricated on a substrate 108 of a first conductivity type, such as p-type conductivity type, for example. Substrate 108 may include any suitable substrate, an illustrative, non-exclusive example of which includes an SOI substrate. Similarly, substrate 108 may be formed from any suitable semiconductor material, illustrative, non-exclusive examples of which include silicon, germanium, silicon germanium, gallium arsenide, carbon nanotubes, and/or other semiconductor materials.

Substrate 108 includes and/or has formed therein a buried insulator layer 122. Buried insulator layer 122 may include any suitable dielectric, or electrically insulating, material, an illustrative, non-exclusive example of which includes silicon dioxide.

A floating body region 124 of the first conductivity type, such as p-type, for example, is bounded on top by surface 104 and regions 110, 112, 114, 116, and 118 of a second conductivity type. Floating body 124 may have the same doping as substrate 108 in some embodiments or a different doping, if desired, in other embodiments, as a matter of design choice. Regions 110, 112, 114, 116, and 118 may be formed by any suitable process, illustrative, non-exclusive examples of which include an ion implantation process and/or a solid state diffusion process.

The regions 112 and 118 are formed such that they reach the buried insulator layer 122. Thus, regions 112 and 118 insulate floating body 124 from its neighboring floating body 124 of adjacent cells when multiple cells 1 are joined in an array. On the other hand, the regions 110, 114, and 116 are formed such that they do not reach the buried insulator layer 122. This provides for floating body 124, which is used to store the memory state, to be shared and thus can to be accessed through multiple ports (four ports in this example).

Floating body 124 also may be bounded on one or more sides by insulating layers (not shown in FIG. 8). The insulating layers may insulate cell 1 from neighboring cells 1 when multiple cells 1 are joined to form a memory array.

Gates 160, 162, 164, and 166 may be positioned above surface 104. Gate 160 is insulated from surface 104 by an insulating layer 150 and is positioned in between regions 112 and 114. The gate 162 is insulated from surface 104 by an insulating layer 152 and is positioned in between regions 114 and 110. Gate 164 is insulated from surface 104 by an insulating layer 154 and is positioned in between regions 110 and 116. Gate 166 is insulated from surface 104 by an insulating layer 156 and is positioned in between regions 116 and 118.

Insulating layers 150, 152, 154, and/or 156 may be formed from any suitable insulator and/or dielectric material using any suitable process and/or method. Illustrative, non-exclusive examples of materials that may be included in insulating layers 150, 152, 154, and/or 156 according to the present disclosure include silicon oxide high-K dielectric materials, tantalum peroxide, titanium oxide, zirconium oxide, hafnium oxide, and/or aluminum oxide.

Similarly, gates 160, 162, 164, and/or 166 may be formed from any suitable material using any suitable process and/or method. Illustrative, non-exclusive examples of materials that may be included in gates 160, 162, 164, and/or 166 include polysilicon, metal gate electrode materials, tungsten, tantalum, titanium and/or their nitrides.

Cell 1 further includes word line #1 (WL1) terminal 180 electrically connected to gate 160, word line #2 (WL2) terminal 182 electrically connected to gate 162, word line #3 (WL3) terminal 184 electrically connected to gate 164, word line #4 (WL4) terminal 186 electrically connected to gate 166, source line (SL) terminal 170 electrically connected region 110, bit line #1 (BL1) terminal 172 electrically connected to region 112, bit line #2 (BL2) terminal 174 electrically connected to region 114, bit line #3 (BL3) terminal 176 electrically connected to region 116, bit line #4 (BL4) terminal 178 electrically connected to region 118, and substrate terminal 188 electrically connected to substrate 108.

These terminals define a plurality of ports that may form a portion of quad-port memory cell 1. With this in mind, WL1 terminal 180 and BL1 terminal 172 also may be referred to herein as 'port #1', WL2 terminal 182 and BL2 terminal 174 also may be referred to herein as 'port #2', WL3 terminal 184 and BL3 terminal 176 also may be referred to herein 'port #3', and WL4 terminal 186 and BL4 terminal 178 also may be referred to herein 'port #4'.

It is within the scope of the present disclosure that additional ports may be constructed in a similar manner (i.e., by forming additional regions of a second conductivity type and positioning an additional gate above the surface and in between two regions of the second conductivity type). For an n-port memory cell, the number of gates and the number of bit lines are equal to n, while the number of regions of the second conductivity type is equal to (n+1). All regions of a second conductivity type and gates in a multi-port memory cell according to the present disclosure will be coupled to the same floating body region 124.

Figure 12:
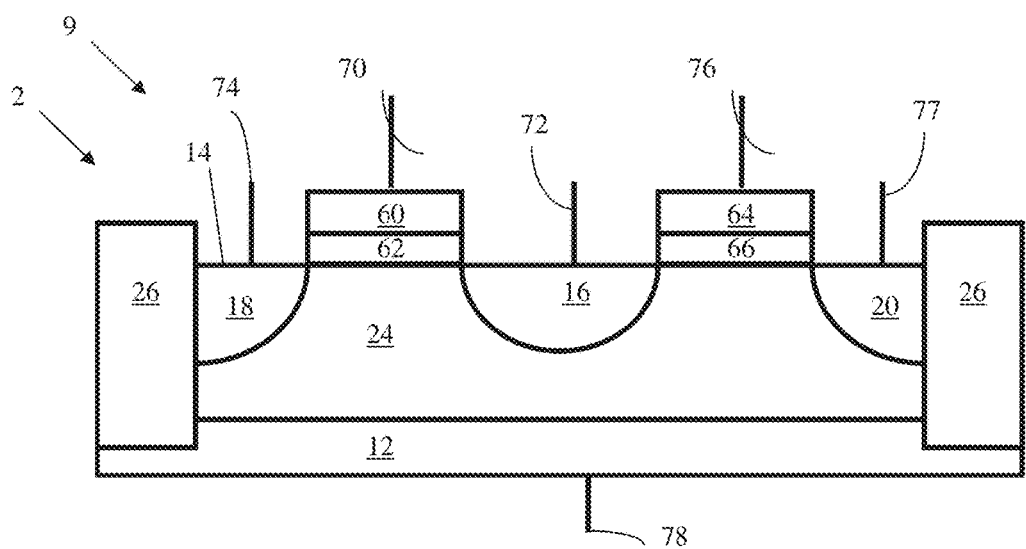
FIG. 12 provides a schematic representation of an illustrative, non-exclusive example of a second embodiment of a memory cell according to the present disclosure.

FIG. 12 is a schematic representation of an illustrative, non-exclusive example of a second embodiment 2 of memory cell 9 according to the present disclosure. The embodiment of FIG. 12 also may be referred to herein as dual-port memory cell 2, memory cell 2, and/or cell 2. Memory cell 2 is substantially similar to dual-port memory cell 1 of FIGS. 1-4 but includes a plurality of insulating layers 26 between adjacent memory cells that may be present within an array of memory cells to isolate the adjacent memory cells from one another, as shown. In addition, memory cell 2 does not include buried insulator layer 22 between floating body region 24 and substrate 12.

In FIG. 12, floating body region 24 having a second conductivity type, such as a p-type conductivity type, is bounded by surface 14, first, second and third regions 18, 16, and 20, respectively of the first conductivity type, insulating layers 26, and substrate 12. Floating body region 24 may be formed using any suitable process and/or method, illustrative, non-exclusive examples of which are discussed in more detail herein.

Figure 13:
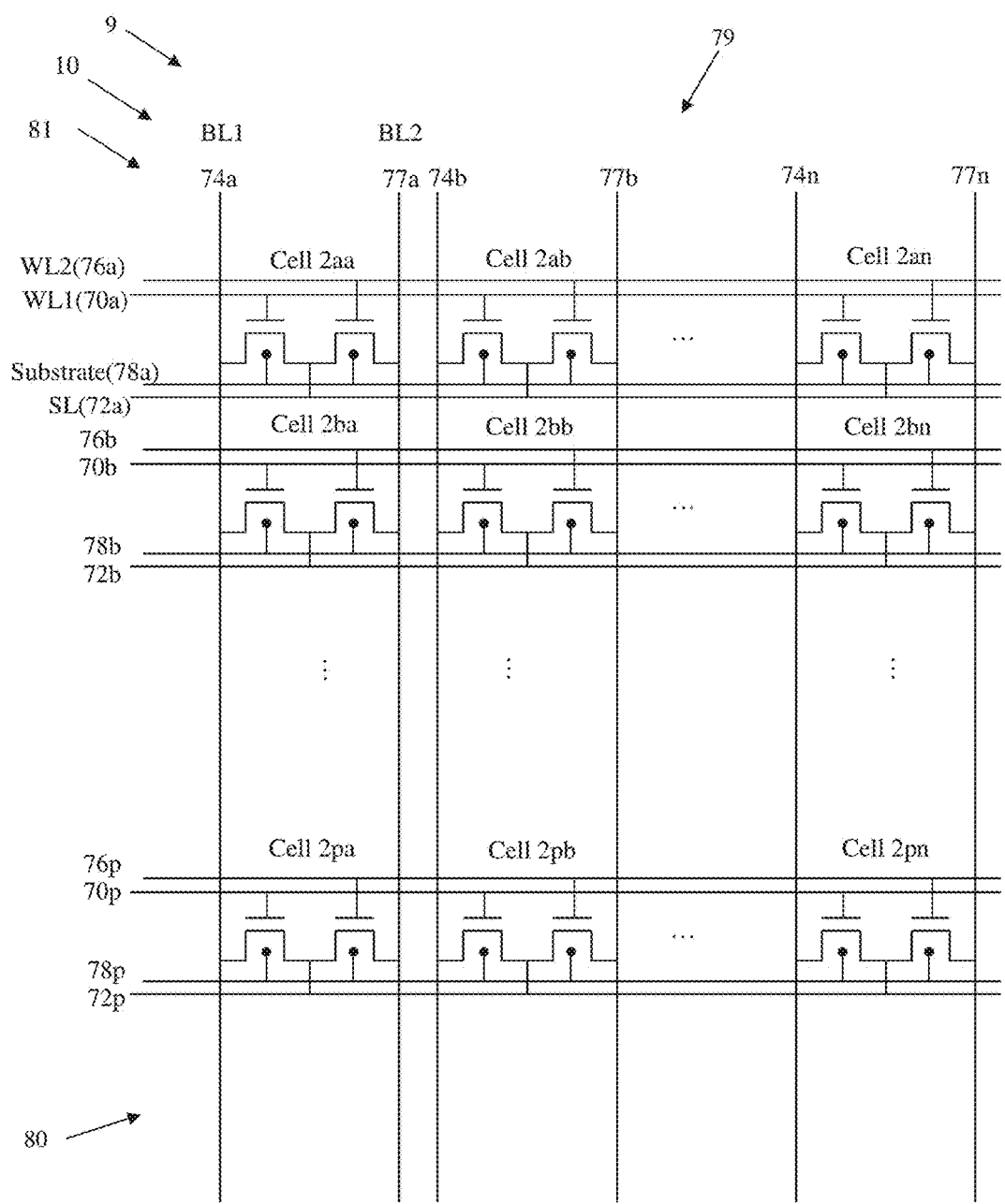
FIG. 13 provides a schematic representation of an illustrative, non-exclusive example of an array of memory cells of the second embodiment according to the present disclosure.

Insulating layers 26, which also may be referred to herein as shallow trench isolation (STI) 26, may be formed from any suitable insulating and/or dielectric material, illustrative, non-exclusive examples of which are discussed in more detail herein. Insulating layers 26 may insulate cell 2 from neighboring cells 2 when multiple cells 2 are joined in an array 81 to form a memory device 10 as illustrated in FIG. 13.

The memory states of memory cell 2 are represented by the charge in floating body region 24. If cell 2 has holes stored in floating body region 24, then the memory cell 2 will have a lower threshold voltage (gate voltage where transistor is turned on) compared to when cell 2 does not store holes in floating body region 24.

Figure 14:
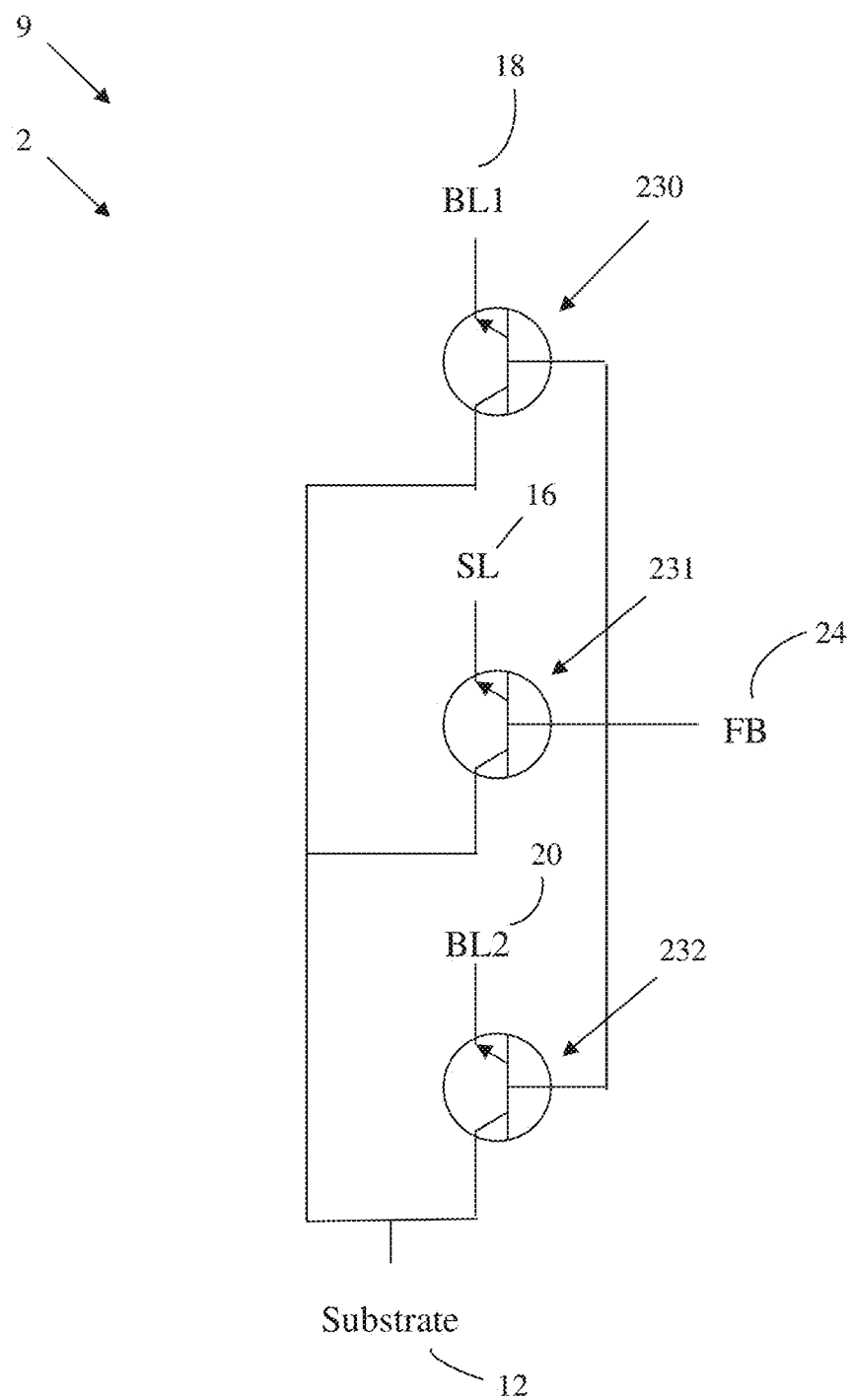
FIG. 14 provides a schematic representation of a first equivalent circuit diagram of the memory cell of FIG. 12.
Figure 15:
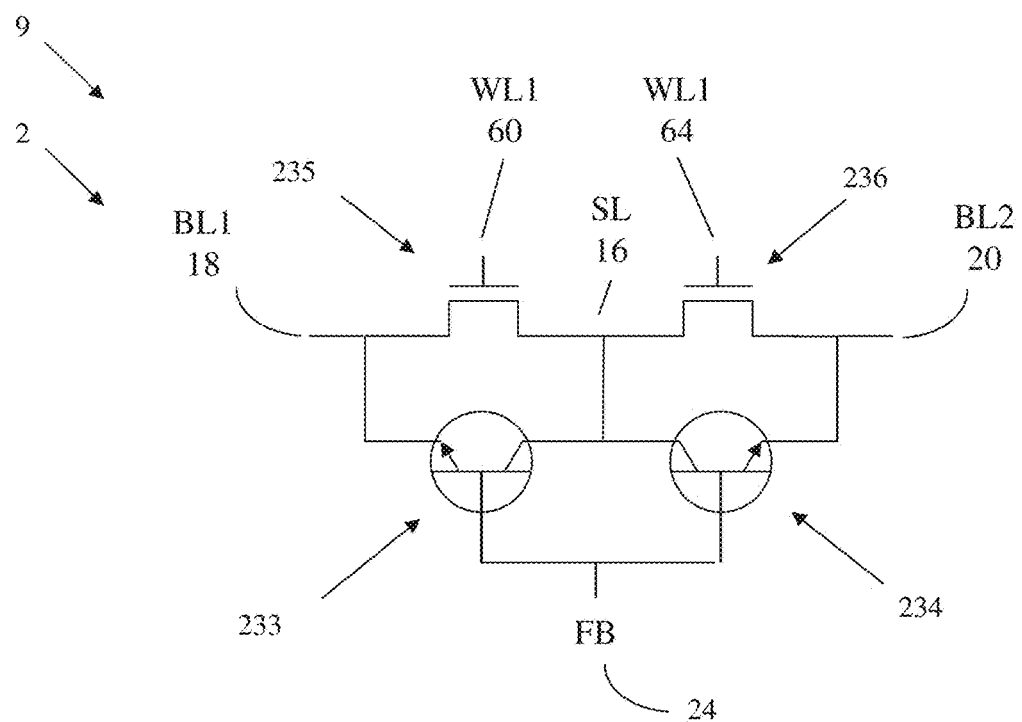
FIG. 15 provides a schematic representation of a second equivalent circuit diagram of the memory cell of FIG. 12.

FIGS. 14 and 15 provide illustrative, non-exclusive examples of equivalent circuit representations of memory cell 2. As shown in FIG. 14, memory cell 2 includes n-p-n bipolar devices 230, 231, and 232. Bipolar device 230 is formed by substrate 12, floating body region 24, and BL1 region 18, bipolar device 231 is formed by substrate 12, floating body region 24, and SL region 16, and bipolar device 232 is formed by substrate 12, floating body region 24, and BL2 region 20. Bipolar devices 230, 231, and 232 are connected in parallel with a common substrate 12 and floating body region 24.

As shown in FIG. 15, memory cell 2 also includes two additional bipolar devices 233 (formed by BL1 region 18, floating body region 24, and SL region 16) and 234 (formed by BL2 region 20, floating body region 24, and SL region 16) connected in series, where the SL region 16 and the floating body 24 is shared between the two bipolar devices. In addition, memory cell 2 also includes two field effect transistors 235 (formed by BL1 region 18, gate 60 connected to WL1 terminal 70, and SL region 16) and 236 (formed by BL2 region 20, gate 64 connected to WL2 terminal 76, and SL region 16) connected in series, where the SL region 16 and the floating body 24 is shared between the two field effect transistors. Operation of memory cell 2 is described below.

Memory cells 2 of FIG. 12 and/or array 81 of FIG. 13 may be operated in a plurality of states and/or modes and/or may be subject to a plurality of operating conditions, or operations, which may include a plurality of biasing conditions for memory cells 2. Illustrative, non-exclusive examples of operations for memory cells 2 according to the present disclosure include a holding, or refresh, operation, a read port #1 only operation, a read port #2 only operation, a simultaneous read port #1 and port #2 operation, a row-wide write '0' operation, a bit-selective write '0' on port #1 operation, a bit-selective write '0' on port #2 operation, a write '1' GIDL on port #1 operation, a write '1' GIDL on port #2 operation, a write '1' on port #1 by impact ionization operation, and/or a write '1' on port #2 by impact ionization operation.

Illustrative, non-exclusive examples of biasing conditions for the above operations are shown in FIGS. 16-19. In FIGS. 16-19, the first column describes the operation that is being performed upon memory cell 2 of FIG. 12 and/or upon one or more memory cells "2xy" of FIG. 13, where the "x" indicates the row 80 (a through p) in which the memory cell(s) is/are located within array 81 and the "y" indicates the column 79 (a through n) in which the memory cell(s) is/are located within array 81. In addition, the second column describes the memory cell(s) upon which the operation is being performed. "All" indicates that the given operation (and, by extension, the given biasing conditions) may be applied to all of memory cells 2 within array 81 of FIG. 13. When a given operation may be applied only to one or more selected cell(s) and/or selected row(s) of cells within array 81, "Selected Cell(s)" and/or "Selected Row(s)" may indicate the biasing conditions that may be applied to the selected cell (an illustrative, non-exclusive example of which is cell "2aa" of FIG. 13) and/or to the selected row of cells (an illustrative, non-exclusive example of which is row "a" (which may include all memory cells 2 in row "a" of FIG. 13)). Similarly "Unselected Cell(s)" may indicate the biasing conditions that may be applied to the unselected cells upon which the given operation is not performed.

With continued reference to FIGS. 16-19, columns 3-8 list the biasing conditions that may be applied to terminals 78, 74, 70, 72, 76, and/or 77 of the selected and/or unselected memory cells for the given operation. As an illustrative, non-exclusive example, and with reference to FIGS. 13 and 17, the read port #1 only operation may be performed on selected cell "2aa" by applying a zero or positive voltage to substrate terminal 78a, a Positive2 (which is less than the Positive1) voltage to BL1 terminal 74a, a Positive1 voltage to WL1 terminal 70a, a zero voltage to SL terminal 72a, a zero or negative voltage to WL2 terminal 76a, and a zero voltage to BL2 terminal 77. In addition, all unselected memory cells within array 81 of FIG. 13 will be biased by the given voltage. This includes applying a zero or positive voltage to unselected substrate terminals 78b-78p, a zero voltage to unselected BL1 terminals 74b-74n, a zero voltage to unselected WL1 terminals 70b-70p, a zero voltage to unselected SL terminals 72b-72p, a zero or negative voltage to unselected WL2 terminals 76b-76p, and a zero voltage to unselected BL2 terminals 77b-77n.

As another illustrative, non-exclusive example, and with reference to FIGS. 13 and 18, the row-wide write '0' operation may be performed on selected row "a" by applying a zero or a positive voltage to substrate terminal 78a, a zero or negative voltage to BL1 terminal 74a, a zero or negative voltage to WL1 terminal 70a, a negative voltage to SL terminal 72a, a zero or negative voltage to WL2 terminal 76a, and a zero or negative voltage to BL2 terminal 77a. In addition, all unselected memory cells "2xy" within array 81 of FIG. 13 will be biased by the voltage shown in FIG. 18. This includes applying a zero or positive voltage to unselected substrate terminals 78b-78p, a zero or negative voltage to unselected BL1 terminals 74b-74n, a zero or negative voltage to unselected WL1 terminals 70b-70p, a zero voltage to unselected SL terminals 72b-72p, a zero or negative voltage to unselected WL2 terminals 76b-76p, and a zero or negative voltage to unselected BL2 terminals 77b-77n.

The above examples are given for illustration purposes only and it is within the scope of the present disclosure that any suitable selected memory cell "2xy" and/or any suitable selected row "x" of memory cells within array 81 may be biased by the biasing conditions associated with any suitable one of the operations described in FIGS. 16-19. In addition, it is also within the scope of the present disclosure that the voltage associated with each of the biasing conditions listed in FIGS. 16-19 may include any suitable magnitude and that this magnitude may vary depending on a variety of factors, illustrative, non-exclusive examples of which include the doping levels and/or charge carrier concentrations present within any suitable portion(s) and/or region(s) of memory cell 2 and/or the size, lengths scales, and/or geometry of memory cell 2. Thus, while illustrative, non-exclusive examples of the biasing voltages that may be utilized with each of the operations described in FIGS. 16-19 are shown in parenthesis therein, these voltage values may vary without departing from the scope of the present disclosure.

With continued reference to FIG. 13 for an illustrative, non-exclusive example of array 81 of memory cells 2, FIG. 16 provides illustrative, non-exclusive examples of biasing conditions that may be utilized to perform the holding and/or refresh operation on all of the memory cells present within array 81. When floating body region 24 includes a positive charge, the positive charge stored in floating body region 24 may decrease over time. This decrease may be due to p-n diode leakage from the p-n diodes formed by floating body 24 and regions 16, 18, 20, and substrate 12 and/or due to charge recombination. A unique capability of memory cell 2 is that it may provide for performing the holding operation in parallel to all memory cells 2 in array 81 by applying the biasing voltages shown in FIG. 16.

During the holding operation, and as discussed in more detail herein, a fraction of the bipolar transistor current will then flow into floating body region 24 (usually referred to as the base current) and maintain the state '1' data. The efficiency of the holding operation may be enhanced by designing the bipolar devices 230, 231, 232 formed on substrate 12, floating body region 24, and/or regions 18/16/20 to be low-gain bipolar devices, where the bipolar gain is defined as the ratio of the collector current flowing out of substrate terminal 78 to the base current flowing into the floating body region 24.

For memory cells in state '0' data, the bipolar devices 230, 231, 232 will not be turned on, and consequently no base hole current will flow into floating body region 24. Therefore, memory cells in state '0' will remain in state '0'.

The holding operation may be performed in a mass, parallel manner as the substrate terminal 78 (functioning as back bias terminal) is typically shared by all the cells 2 in memory array 81, or at least by multiple cells 2 in a segment of array 81. Substrate terminal 78 also may be segmented to allow independent control of the applied bias to a selected portion of memory array 81. Also, because substrate terminal 78 is not used for memory address selection, no memory cell access interruption occurs due to the holding operation.

Figure 20:
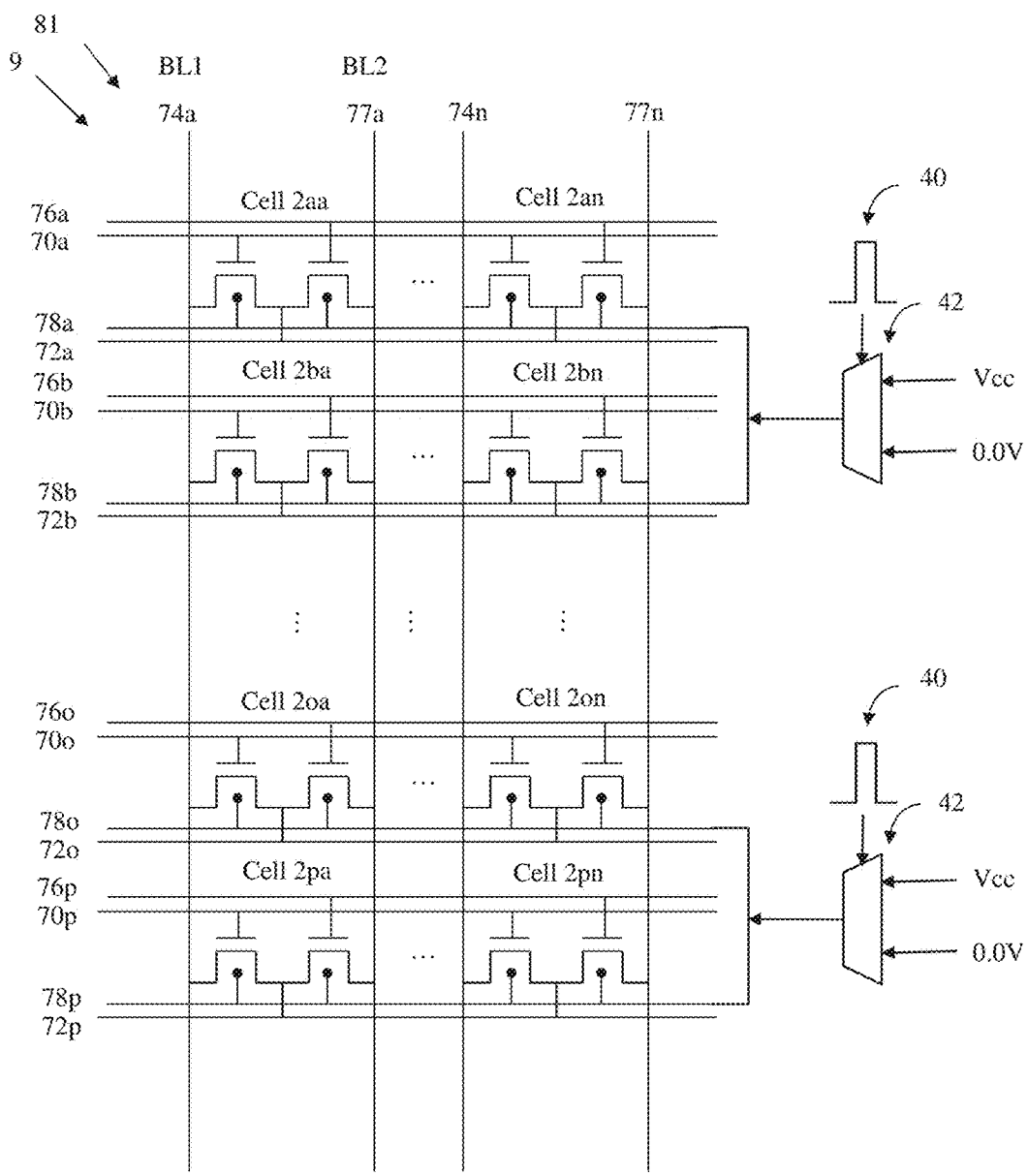
FIGS. 20-21 provide schematic representations of illustrative, non-exclusive examples of refresh circuitry that may be utilized to maintain a memory state of the second embodiment of a memory cell according to the present disclosure.

In another embodiment, a periodic pulse of a positive voltage may be applied to substrate terminal 78, as opposed to applying a constant positive bias, in order to reduce the power consumption of memory cells 2. The state of memory cell 2 may be maintained by refreshing the charge stored in floating body region 24 during the period over which the positive voltage pulse is applied to the back bias terminal (i.e., substrate terminal 78). As an illustrative, non-exclusive example, FIG. 20 shows multiplexers 42 that may determine the bias applied to substrate terminal 78, where the control signal could be a clock signal 40 or, as will be described later, determined by different operating modes. The positive input signals could be the power supply voltage Vcc (FIG.

Figure 21:
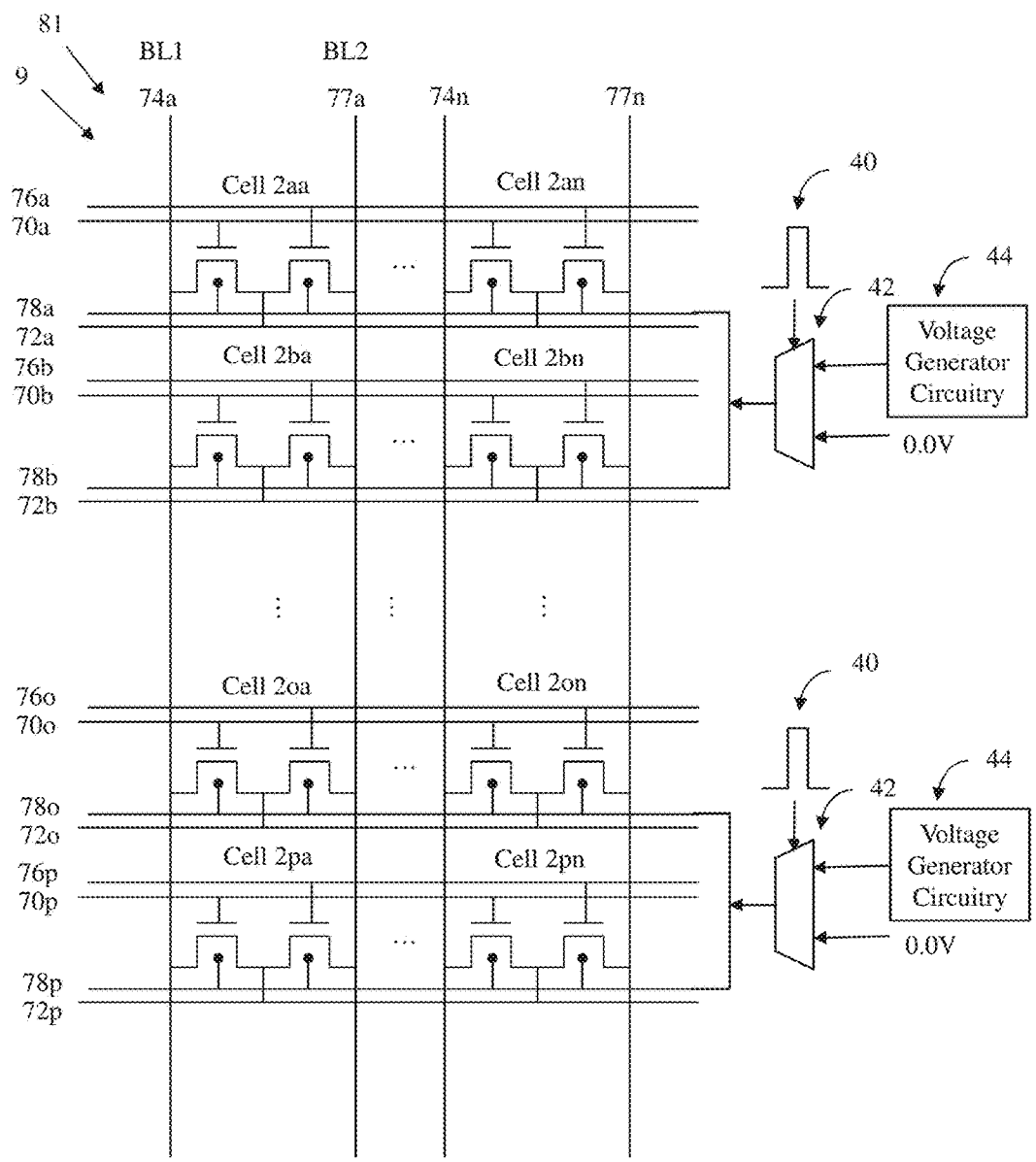

20) or a different positive bias could be generated by voltage generator circuitry 44 (see FIG. 21).

The holding/standby operation also results in a larger memory window by increasing the amount of charge that may be stored in floating body region 24. Without the holding/standby operation, the maximum potential that may be stored in floating body region 24 may be limited to the flat band voltage $V_{FB}$ as the junction leakage current to regions 16, 18 and 20 increases exponentially at floating body potential greater than $V_{FB}$. However, by applying a positive voltage to substrate terminal 78, the bipolar action results in a hole current flowing into floating body region 24, compensating for the junction leakage current between floating body region 24 and regions 16, 18 and 20. As a result, the maximum charge $V_{MC}$ stored in floating body region 24 may be increased by applying a positive bias to the substrate terminal 78.

Figure 22:
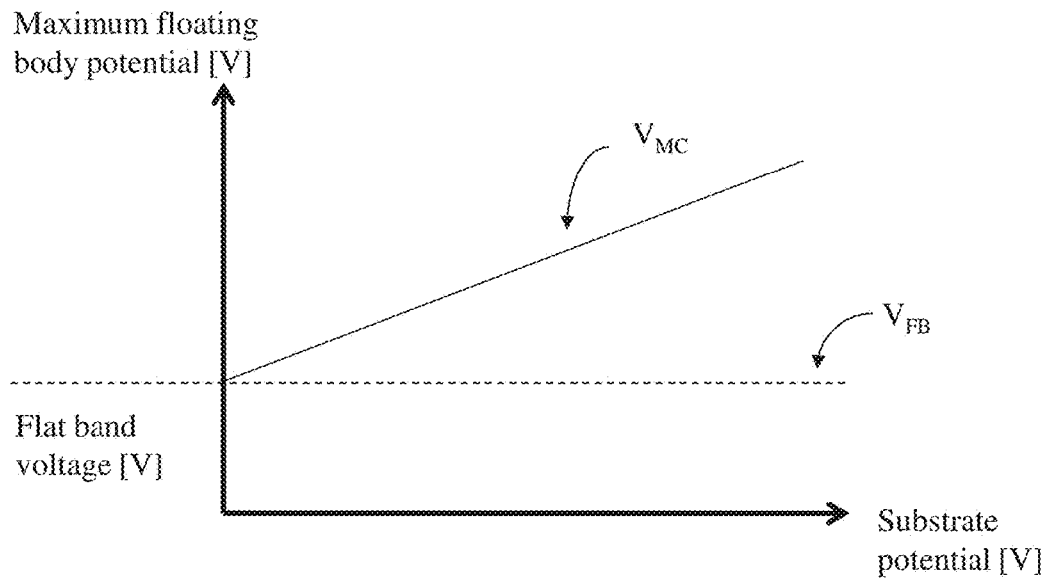
FIG. 22 is a plot of a maximum floating body potential as a function of the potential that may be applied to a substrate terminal for the second embodiment of a memory cell according to the present disclosure.

A plot of the maximum floating body potential ($V_{MC}$) as a function of the potential that is applied to substrate terminal 78 is shown in FIG. 22. The increase in the maximum charge stored in the floating body 24 provides for a larger memory window when using memory cells 2 when compared to more conventional memory cells.

Figure 23:
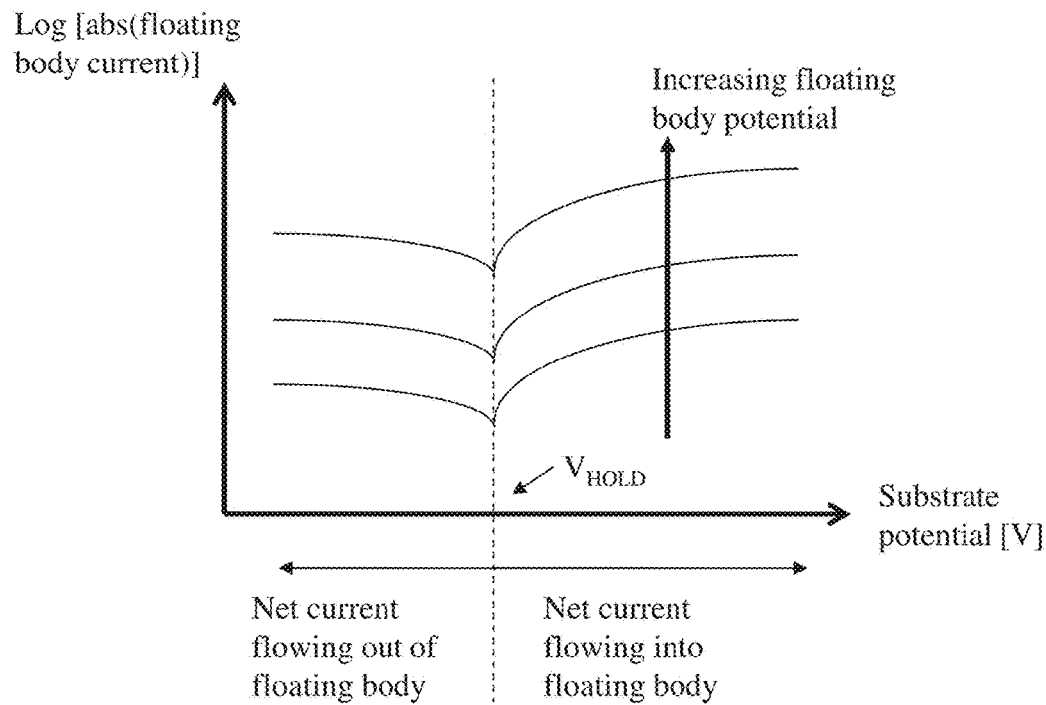
FIG. 23 is a plot of a floating body region net current for different floating body region potentials as a function of the voltage that may be applied to the substrate terminal for the second embodiment of a memory cell according to the present disclosure.

FIG. 23 shows a floating body region relative net current for different floating body region potentials as a function of the voltage applied to substrate terminal 78 with BL1, WL1, SL, WL1 and BL2 terminals 74, 70, 72, 76 and 77 grounded. When zero voltage is applied to substrate terminal 78, no bipolar current is flowing into floating body 24 and, as a result, the stored charge will leak over time. When a positive voltage is applied to substrate terminal 78, hole current will flow into floating body region 24 and balance the junction leakage current to regions 16, 18 and 20. The junction leakage current is determined by the potential difference between floating body 24 and regions 16, 18 and 20, while the bipolar current flowing into floating body 24 is determined by both the substrate terminal 78 potential and the floating body 24 potential. As indicated in FIG. 23, for different floating body potentials, at a certain substrate terminal 78 potential, $V_{HOLD}$), the current flowing into floating body 24 is balanced by the junction leakage between floating body 24 and regions 16, 18 and 20. The different floating body 24 potentials represent different charges used to represent different states of memory cell 2. Thus, different memory states may be maintained by using the holding/standby operation described herein.

The charge stored in floating body region 24 of memory cell 2 may be sensed by monitoring the cell current of memory cell 2. If cell 2 is in a state '1' having holes in floating body region 24, then the memory cell will have a lower threshold voltage (gate voltage where the transistor is turned on), and consequently a higher cell current, compared to if cell 2 is in a state '0' having no holes in floating body region 24. Thus, read circuitry and a reference generator similar to that discussed in more detail herein with reference to FIG. 7 and memory cell 1 may be used to determine the data state of memory cell 2. The operation of the read circuitry and/or reference generator to determine the data state of memory cell 2 is substantially similar to that utilized to determine the data state of memory cell 1.

FIG. 17 provides illustrative, non-exclusive examples of biasing conditions that may be utilized to read the data state of memory cell 2 of FIG. 12 and/or a selected memory cell "2xy" in array 81 of FIG. 13. These include biasing conditions for the read port #1 only operation, the read port #2 only operation, and/or the simultaneous read port #1 and port #2 operation. In FIG. 17, "Positive2" indicates a positive voltage that is less than another positive voltage, "Positive 1," that may be applied to another terminal of memory cell 2.

As a result of the bias conditions described in FIG. 17, the unselected memory cells will be at holding mode, maintaining the states of the respective floating body regions 24 thereof. Furthermore, the holding operation does not interrupt the read operation of the selected memory cell. In addition, the read port #1 only operation may be performed on a first selected memory cell simultaneously with performing the read port #2 only operation on a second selected memory cell. As an illustrative, non-exclusive example, the read port #1 only operation may be performed on first selected memory cell "2aa" simultaneously with the read port #2 operation being performed on second selected memory cell "2bb."

FIG. 18 provides illustrative, non-exclusive examples of biasing conditions that may be utilized to write a '0' to memory cell 2 of FIG. 12 and/or to a selected memory cell "2xy" and/or a selected row of memory cells "x" in array 81 of FIG. 13. These include biasing conditions for the row-wide write '0' operation, the bit-selective write '0' on port #1 operation, and/or the bit-selective write '0' on port #2 operation. In the row-wide write '0' operation, an entire selected row in array 81 is written with '0's, while in the bit-selective write '0' operations, a selected memory cell, or cells, is written with a '0' without affecting unselected memory cells within array 81.

The row-wide write '0' may be utilized for memory reset or erase for any particular row or group of rows in array 81 and may be accomplished via SL terminal 72 that is common to both ports. The bit-selective write '0' may be useful for regular random memory address write operations and may be performed via either port #1 or port #2.

When performing the row-wide write '0' operation, a negative voltage may be applied to SL terminal 72, a zero or negative voltage may be applied to WL terminal 70, a zero or positive voltage may be applied to substrate terminal 78, while a zero voltage may be applied to BL1 terminal 74, WL1 terminal 70, WL2 terminal 76 and BL2 terminal 77. The SL terminal 72 for the unselected cells 2 that are not commonly connected to the selected cell will remain grounded. Under these conditions, the p-n junctions (junction between 24 and 16) are forward-biased, evacuating any holes from floating body 24. In addition, the unselected memory cells will be in holding operation. Thus, the holding operation does not interrupt the write '0' operation of memory cells 2. Furthermore, the unselected memory cells will remain in holding operation during the write '0' operation.

A column-wide write '0' operation also may be performed by applying a negative voltage to a selected BL terminal 74 and/or 77, with zero or positive voltage being applied to the substrate terminal, and zero voltage being applied to the WL terminals and SL terminal. Under these conditions, the p-n junctions (junction between 24 and 18 or 20, depending on where the negative voltage is being applied to) of all cells sharing the selected bit line terminal will be forward-biased. As a result, all cells in a column sharing the selected bit line terminal will be written to state '0'.

The bit-selective write '0' operation to cell 2 may be performed by either port #1 or port #2 at any given time but not by both simultaneously. Furthermore, during a write operation, the other port cannot perform a read operation and vice versa. A write operation has to be completed before a read operation by either port may commence or a read operation must be completed before a write operation by either port can commence. See descriptions below for details on the write contention avoidance.

During the bit-selective write '0' on port #1 operation, the floating body region potential will increase through capacitive coupling from the positive voltage applied to the WL1 terminal 70. As a result of the floating body 24 potential increase and the negative voltage applied to the BL1 terminal 74, the p-n junction (junction between 24 and 18) is forward-biased, evacuating any holes from floating body region 24. The bias applied to selected WL1 terminal 70 and selected BL1 terminal 74 may affect the states of the unselected memory cells 2 sharing the same WL1 or BL1 terminal as the selected memory cell 2. To reduce the potential for an undesired write '0' disturb to other memory cells 2 in memory array 81, the applied potential may be optimized as discussed in more detail herein with reference to memory cells 1.

During the bit-selective write '0' on port #2 operation, the floating body region potential will increase through capacitive coupling from the positive voltage that is applied to the WL2 terminal 76. As a result of the floating body 24 potential increase and the negative voltage applied to the BL2 terminal 77, the p-n junction (junction between 24 and 20) is forward-biased, evacuating any holes from floating body region 24. The bias applied to selected WL2 terminal 76 and selected BL2 terminal 77 may affect the states of the unselected memory cells 2 sharing the same WL2 or BL2 terminal as the selected memory cell 2 and may be optimized as discussed in more detail herein. When performing the bit-selective write '0' on port #2 operation, the unselected cells will remain at holding state.

During the write '0' operations for memory cell 2 described above, the positive back bias applied to the substrate terminal 78 of memory cells 2 maintains the states of the unselected cells 2, especially those sharing the same row or column as the selected cell, as the bias condition applied to the selected memory cell can potentially alter the states of the unselected memory cells 2 without the intrinsic bipolar devices 230, 231, and 232 (formed by floating body 24, and regions 18, 16, 20, respectively) re-establishing the equilibrium condition. Furthermore, the holding operation does not interrupt the write '0' operation of the memory cells 2.

FIG. 19 provides illustrative, non-exclusive examples of biasing conditions that may be utilized to write a '1' to memory cell 2 of FIG. 12 and/or to a selected memory cell "2xy" in array 81 of FIG. 13. These include biasing conditions for the write '1' GIDL on port #1 operation, the write '1' GIDL on port #2 operation, the write '1' on port #1 by impact ionization operation, and/or the write '1' on port #2 by impact ionization operation. The write '1' operation by either port #1 or port #2 may be performed on memory cell 2 through an impact ionization mechanism or a band-to-band tunneling mechanism, as described for example in "A Design of a Capacitorless 1T-DRAM Cell Using Gate-Induced Drain Leakage (GIDL) Current for Low-power and High-speed Embedded Memory", Yoshida et al., pp. 913-918, International Electron Devices Meeting, 2003.

When performing the write GIDL on port #1 operation, the negative bias on WL1 terminal 70 and the positive bias on BL1 terminal 74 will result in hole injection into floating body 24. The positive bias applied to substrate terminal 78 will maintain the resulting positive charge on floating body 24 as discussed above, and the unselected cells 2 will remain at the holding mode. The positive bias applied to substrate terminal 78 employed for the holding operations does not interrupt the write '1' operation of the selected memory cell(s).

When performing the write GIDL on port #2 operation, the negative bias on WL2 terminal 76 and the positive bias on BL2 terminal 77 will result in hole injection to the floating body 24. The positive bias applied to the substrate terminal 78 will maintain the resulting positive charge on the floating body 24 as discussed above, and the unselected cells 2 will remain at the holding mode. The positive bias applied to substrate terminal 78 employed for the holding operations does not interrupt the write '1' operation of the selected memory cell(s).

During the write '1' by port #1 operation using the impact ionization method, if the potential of bit line region 18 is equal to or higher than the difference between the gate 60 potential and the threshold voltage, a pinch-off region will be formed near the bit line region 18. A large electric field will be developed in the pinch-off region, accelerating the electrons flowing from source line region 16 to bit line region 18. The energetic electrons will collide with atoms in the semiconductor lattice, which will generate hole-electron pairs in the vicinity of the junction. The electrons will be swept into bit line region 18 by the electric field and become the bit line current, while the holes will be swept into floating body region 24, becoming the hole charge that creates the state '1'.

During the write '1' by port #2 operation using the impact ionization method, if the potential of bit line region 20 is equal to or higher than the difference between the gate 64 potential and the threshold voltage, a pinch-off region will be formed near the bit line region 20. A large electric field will be developed in the pinch-off region, accelerating the electrons flowing from the source line region 16 to bit line region 20. The energetic electrons will collide with atoms in the semiconductor lattice, which will generate hole-electron pairs in the vicinity of the junction. The electrons will be swept into bit line region 20 by the electric field and become the bit line current, while the holes will be swept into the floating body region, becoming the hole charge that creates the state '1'.

Figure 24:
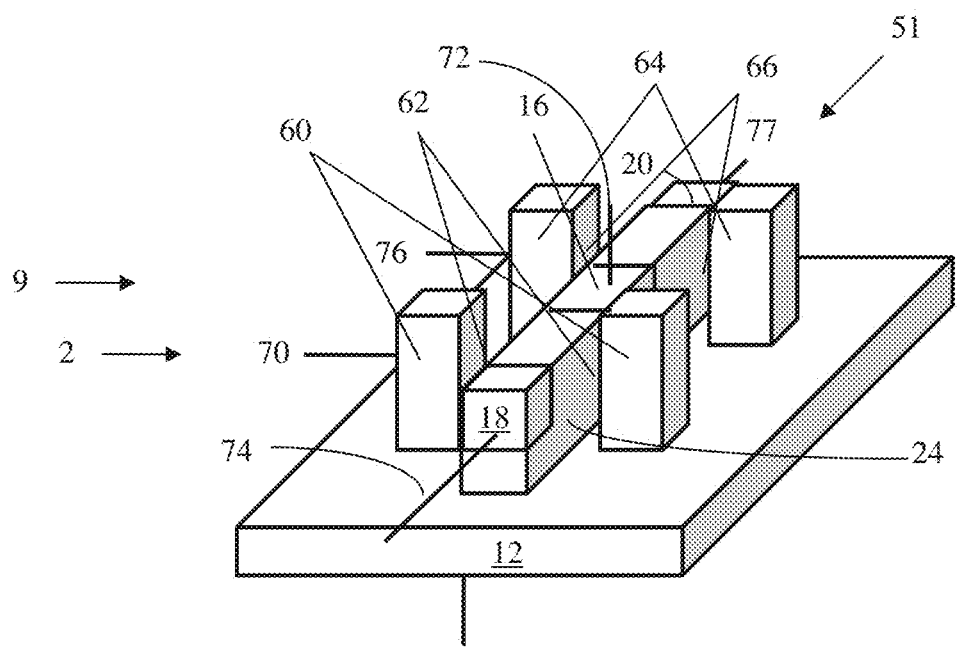
FIGS. 24-25 provide three-dimensional schematic representations of illustrative, non-exclusive examples of the second embodiment of a memory cell according to the present disclosure.
Figure 25:
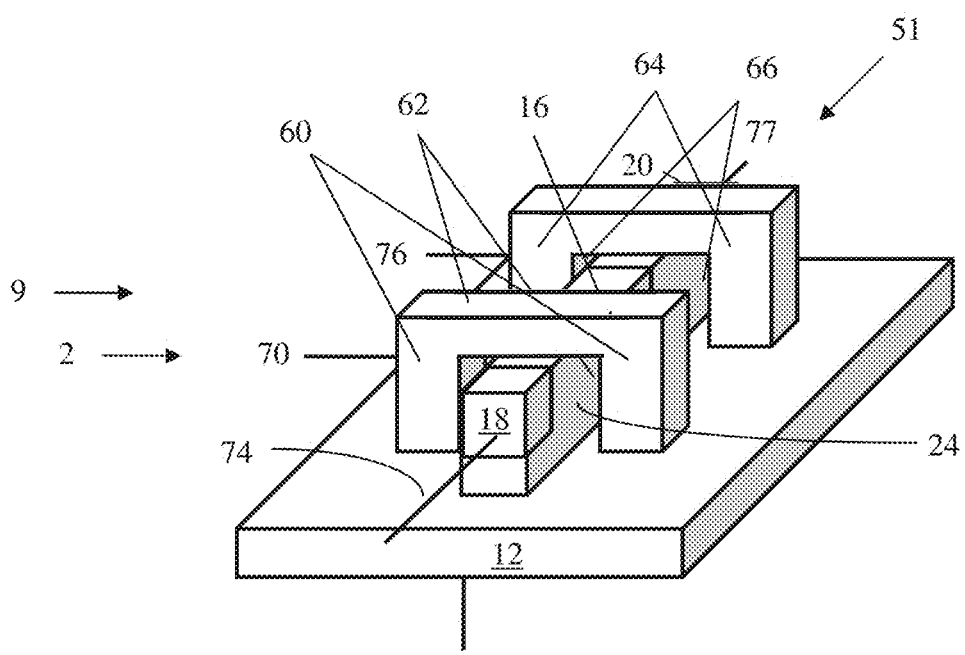
Figure 26:
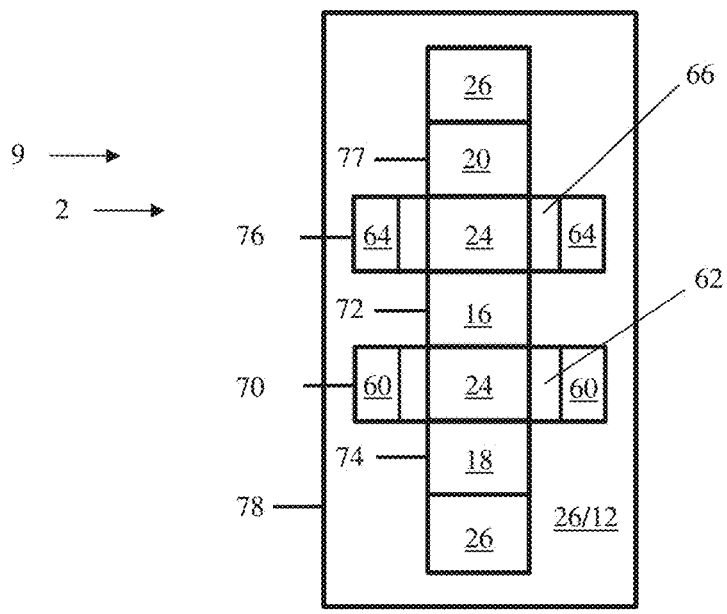
FIG. 26 provides a schematic representation of a top view of the memory cell of FIG. 24.

FIGS. 24-25 are three-dimensional schematic representations of additional illustrative, non-exclusive examples of memory cells 2 according to the present disclosure, while FIG. 26 is a top view of the memory cell of FIG. 24. Memory cells 2 of FIGS. 24-26 are functionally equivalent to memory cells 2 of FIGS. 12-15, include the same terminals as memory cells 2 of FIGS. 12-15, and include a fin structure 51 having a second conductivity type (such as p-type conductivity type) fabricated on substrate 12 having a first conductivity type (such as n-type conductivity type) so as to extend from a top surface of the substrate to form a three-dimensional structure, with fin 51 extending substantially perpendicularly to, and above the top surface of, substrate 12.

Fin structure 51 includes first, second and third regions 18, 16, 20 having the first conductivity type. The floating body region 24 is bounded by the top surface of fin 51, first, second and third regions 18, 16, 20 and insulating layers 26 (insulating layers 26 may be seen in the top view of FIG. 26). Insulating layers 26 insulate cell 2 from neighboring cells 2 when multiple cells 2 are joined to make memory device 10 (such as is schematically illustrated by array 81 of FIG. 13). Floating body region 24 may be formed using any suitable process and/or method, including those that are discussed in more detail herein. Fin 51 may be formed from any suitable material, illustrative, non-exclusive examples of which are discussed in more detail herein.

Memory cell 2 of FIGS. 24-26 further may include gates 60 and 64 on two opposite sides of floating body region 24 as shown in FIG. 24. Alternatively, gates 60 and 64 may enclose three sides of floating body region 24, as shown in FIG. 25. Gates 60 and 64 are insulated from floating body 24 by insulating layers 62 and 66, respectively. Gates 60 are positioned between the first and second regions 18, 16, adjacent to floating body 24 and gates 64 are positioned between the second and third regions 16, 20, adjacent to floating body 24.

Similar to memory cell 1 of FIG. 11, memory cell 2 may include and/or be extended to include any suitable number of ports and also may be referred to herein as multi-port memory cells 2. Illustrative, non-exclusive examples of multi-port memory cells 2 according to the present disclosure include multi-port memory cells with 2 ports, 3 ports, 4 ports, 5 ports, 6 ports, 7 ports, 8 ports, 9 ports, 10 ports, or more than 10 ports.

Figure 27:
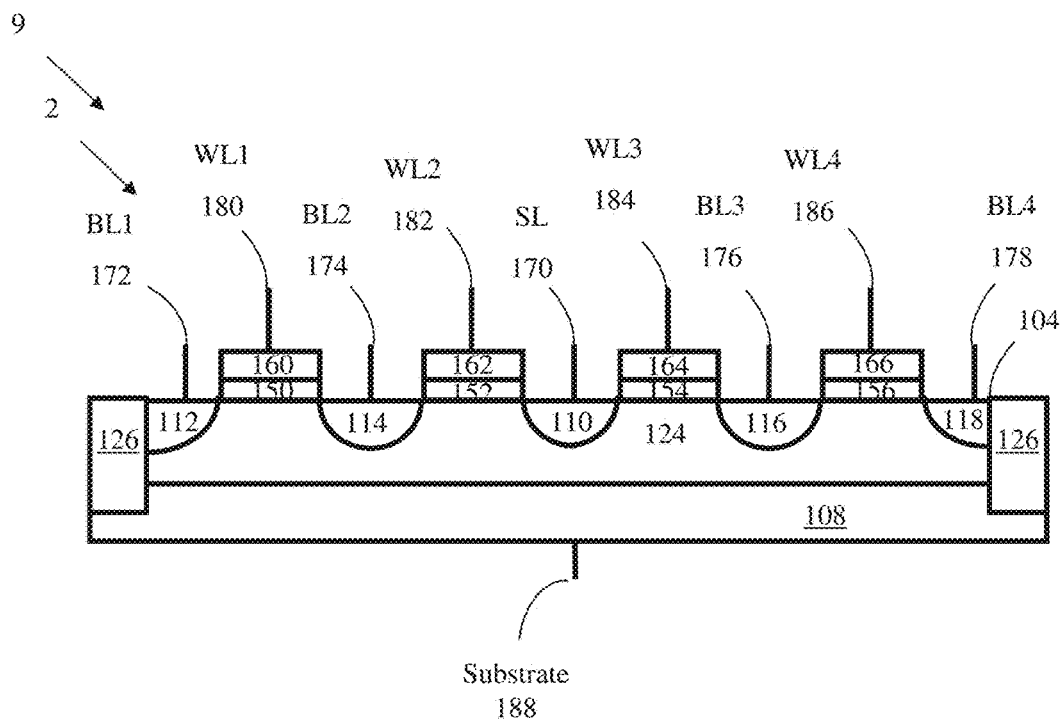
FIG. 27 provides a schematic representation of an illustrative, non-exclusive example of a quad-port memory cell according to the second embodiment of a memory cell according to the present disclosure.

An illustrative, non-exclusive example of a multi-port memory cell 2, in the form of a quad-port memory cell 2, is shown in FIG. 27. Quad-port memory cell 2 is substantially similar to quad-port memory cell 1 of FIG. 11 but also includes insulator layers 126, which insulate quad-port memory cells 2 from neighboring quad-port memory cells 2 when the quad-port memory cells are arranged in an array. In addition, quad-port memory cell 2 is formed on a substrate 108, illustrative, non-exclusive examples of which are discussed in more detail herein, that does not include buried insulator layer 122 of quad-port memory cell 1 of FIG. 11.

Figure 28:
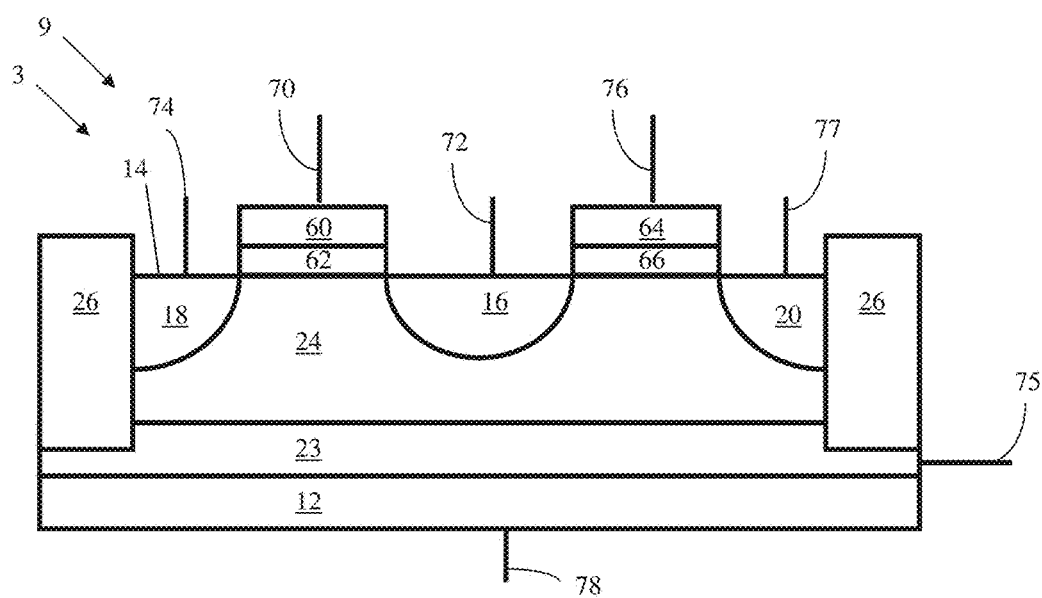
FIG. 28 provides a schematic representation of an illustrative, non-exclusive example of a third embodiment of a memory cell according to the present disclosure.
Figure 29:
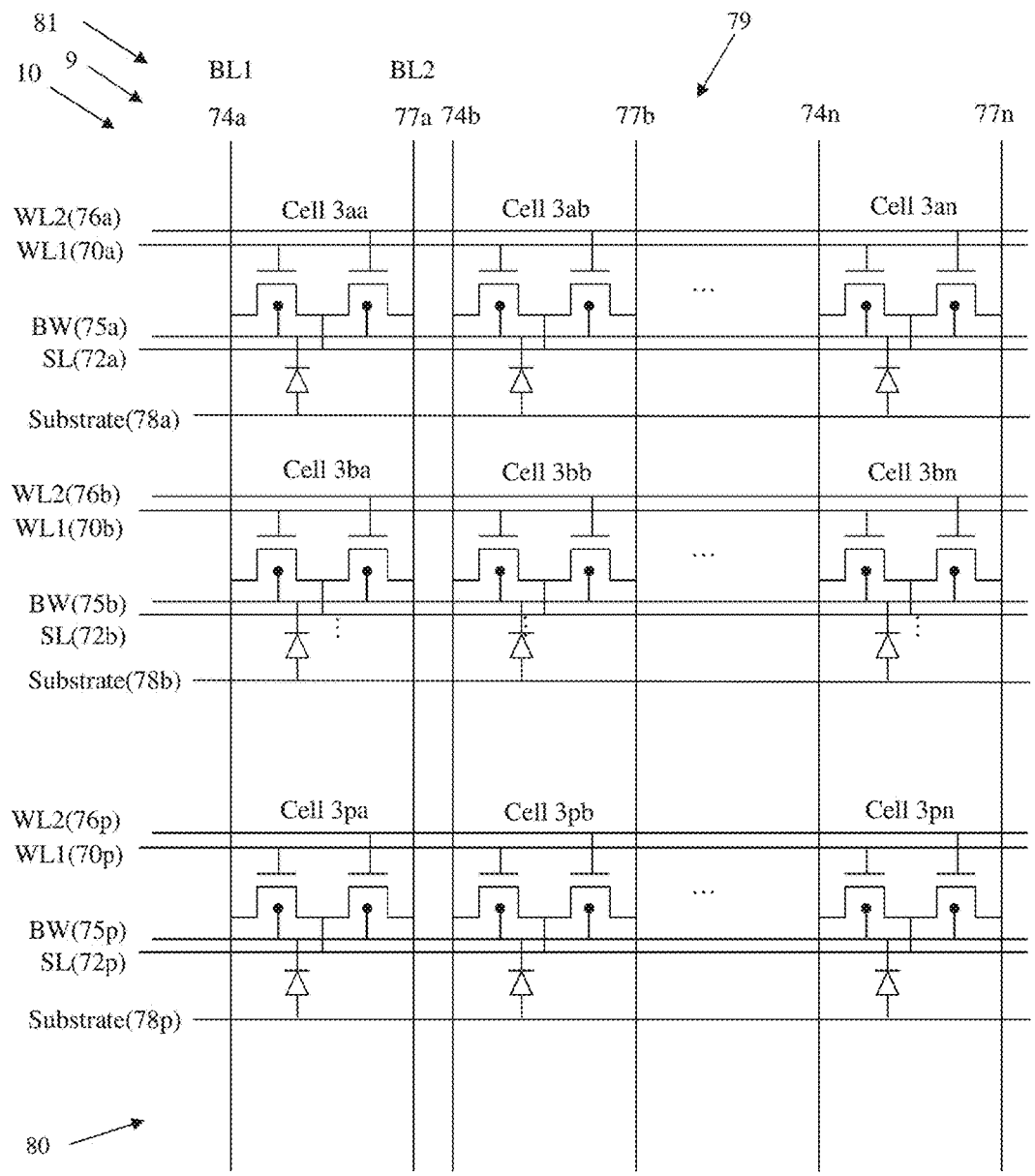
FIG. 29 provides a schematic representation of an illustrative, non-exclusive example of an array of memory cells of the third embodiment according to the present disclosure.

FIG. 28 provides a schematic representation of an illustrative, non-exclusive example of a third embodiment 3 of a memory cell 9 according to the present disclosure. The embodiment of FIG. 28 may be referred to herein as dual-port memory cell 3, memory cell 3, and/or cell 3. Memory cell 3 is substantially similar to memory cell 1 of FIGS. 1-11 but includes buried layer 23 of the second conductivity type, which is located between substrate 12 of the first conductivity type and floating body region 24 of the first conductivity type and which extends beneath insulating layers 26. Thus, and when multiple memory cells 3 are joined in an array 81 to form a memory device 10 as schematically illustrated in FIG. 29, a buried layer 23 of a first memory cell 3, such as memory cell "3aa," may be in electrical communication with a buried layer 23 of a second and/or an adjacent memory cell 3, such as memory cell "3ab."

Buried layer 23 may be formed in any suitable manner and/or using any suitable process, illustrative, non-exclusive examples of which include ion implantation and/or epitaxial growth. Memory cell 3 also includes buried layer terminal 75 in addition to the terminals that are discussed in more detail herein with reference to memory cell 1.

Figure 30:
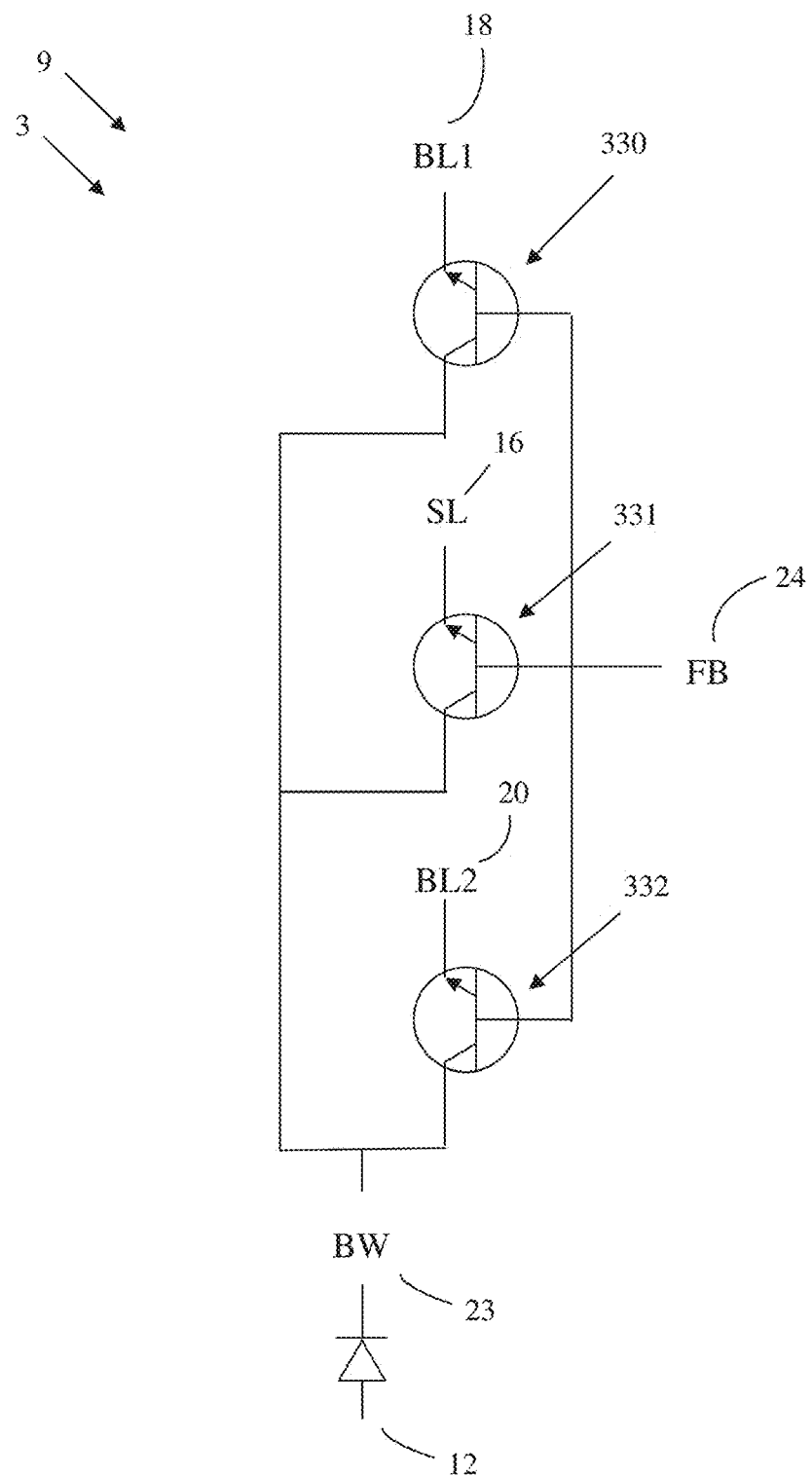
FIG. 30 provides a schematic representation of a first equivalent circuit diagram of the memory cell of FIG. 28.
Figure 31:
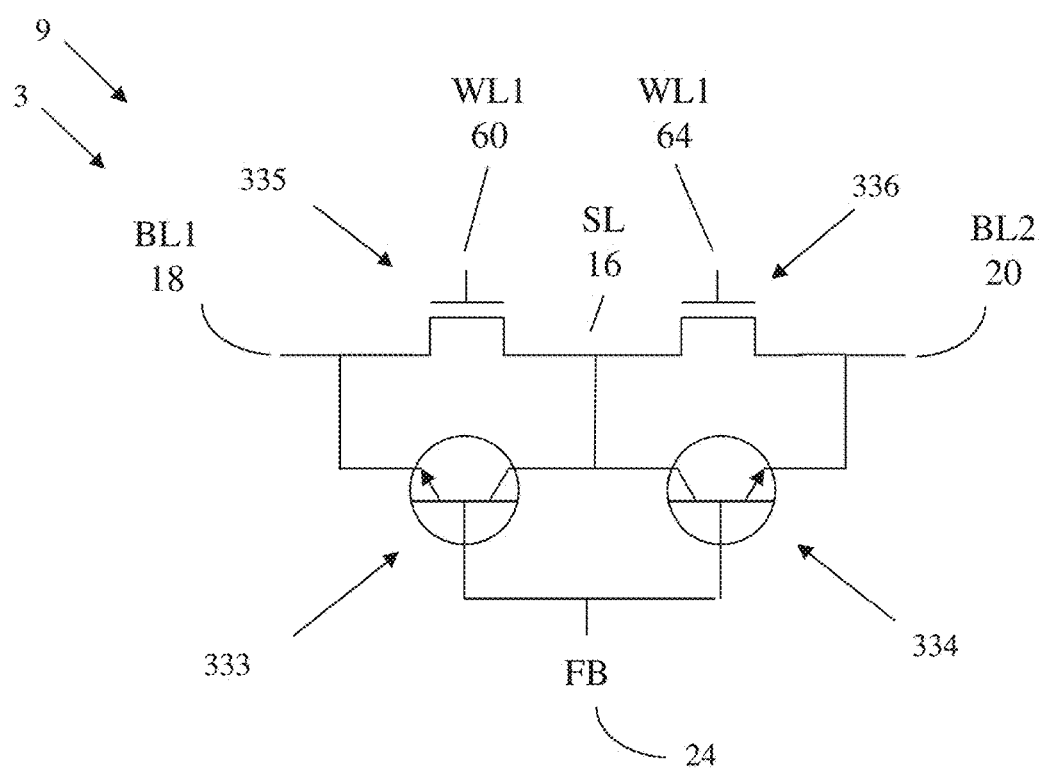
FIG. 31 provides a schematic representation of a second equivalent circuit diagram of the memory cell of FIG. 28.

FIGS. 30 and 31 provide illustrative, non-exclusive examples of an equivalent circuit representation of memory cell 3. As shown in FIG. 30, memory cell 3 includes n-p-n bipolar devices 330, 331, 332. Bipolar device 330 is formed by buried layer 23, floating body 24, and BL1 region 18. Bipolar device 331 is formed by buried layer 23, floating body 24, and SL region 16. Bipolar device 332 is formed by buried layer 23, floating body 24, and BL2 region 20. Bipolar devices 330, 331, and 332 are connected in parallel with a common buried well region 23 and floating body region 24.

In FIG. 31, it can also be seen that memory cell 3 consists of two additional bipolar devices 333 (formed by BL1 region 18, floating body region 24, and SL region 16) and 334 (formed by BL2 region 20, floating body region 24, and SL region 16) connected in series, where the SL region 16 and the floating body 24 is shared between the two bipolar devices. In addition, memory cell 2 also consists of two field effect transistors 335 (formed by BL1 region 18, gate 60 connected to WL1 terminal 70, and SL region 16) and 336 (formed by BL2 region 20, gate 64 connected to WL2 terminal 76, and SL region 16) connected in series, where the SL region 16 and the floating body 24 is shared between the two field effect transistors.

Memory cells 3 of FIG. 28 and/or array 81 of FIG. 29 may be operated in a plurality of states and/or modes and/or may be subject to a plurality of operating conditions, or operations, which may include a plurality of biasing conditions for memory cells 3. The operation of memory cells 3 and/or the response of memory cells 3 to various biasing conditions are substantially similar to the operation of memory cells 2 and/or the response of memory cells 2 to similar biasing conditions. However, in the case of memory cells 3, the bias that was applied to substrate terminal 78 of memory cells 2 is applied to buried well terminal 75 of memory cells 3 and substrate terminal 78 of memory cells 3 is grounded. This reverse biases the p-n junction between substrate 12 and buried well layer 23, thereby decreasing a potential for leakage current between substrate 12 and buried well layer 23.

Thus, the biasing conditions that are discussed in more detail herein with respect to memory cells 2 and FIGS. 16-19 will produce a substantially similar response when applied to memory cells 3 and/or array 81 of FIGS. 28 and 29 with the exception that the bias listed as being applied to substrate terminal 78 of memory cell 2 will be applied to buried well terminal 75 of memory cell 3 and substrate terminal 78 of memory cell 3 will be grounded and/or have a 0.0 V bias applied thereto. Similarly, the circuitry that is discussed in more detail herein with reference to FIGS. 20 and 21 for memory cells 2 may be utilized to perform the holding operation on memory cells 3 with the exception that the back bias voltage may be applied to buried well terminal(s) 75 instead of substrate terminal(s) 78. In addition, the response of memory cells 3 to various buried well potentials, or potentials that may be applied to buried well terminal(s) 75, will be substantially similar to the response of memory cells 2 to various substrate potentials, or potentials that may be applied to substrate terminal(s) 78, as discussed in more detail herein with reference to FIGS. 22-23.

An alternative holding operation may be performed on memory cell 3, as described in US 2010/0034041, "Method of Operating Semiconductor Memory Device with Floating Body Transistor Using Silicon Controlled Rectifier Principle", which is incorporated by reference herein in its entirety. The holding operation may be performed by applying the following bias conditions: zero voltage is applied to WL1 terminal 70 and/or WL2 terminal 76, SL terminal 72, BL1 terminal 74 and/or BL2 terminal 77, a positive voltage is applied to the substrate terminal 78, while the BW terminal 76 is floating. Under these conditions, if memory cell 3 is in memory/data state "1" with positive voltage in floating body 24, the intrinsic silicon controlled rectifier (SCR) device of memory cell 3, formed by the substrate 12, the buried well region 22, the floating body region 24, and the regions 16 or 18 or 20, is turned on, thereby maintaining the state "1" data. Memory cells in state "0" will remain in blocking mode, since the voltage in floating body 24 is not substantially positive and therefore floating body 24 does not turn on the SCR device. Accordingly, current does not flow through the SCR device and these cells maintain the state "0" data.

In this way, an array of memory cells 3 may be refreshed by periodically applying a positive voltage pulse through substrate terminal 78. Those memory cells 3 that are commonly connected to substrate terminal 78 and which have a positive voltage in body region 24 will be refreshed with a "1" data state, while those memory cells 3 that are commonly connected to the substrate terminal 78 and which do not have a positive voltage in body region 24 will remain in blocking mode, since their SCR device will not be turned on, and therefore memory state "0" will be maintained in those cells.

In one particular non-limiting embodiment, a voltage of about 0.0 volts is applied to BL1 terminal 74 and/or BL2 terminal 77, a voltage of about 0.0 volts is applied to WL1 terminal 70 and/or WL2 terminal 76, about 0.0 volts is applied to SL terminal 72, and about +1.2 volts is applied to terminal 78, while the BW terminal 76 is left floating. However, these voltage levels may vary, while maintaining the relative relationships therebetween.

Figure 32:
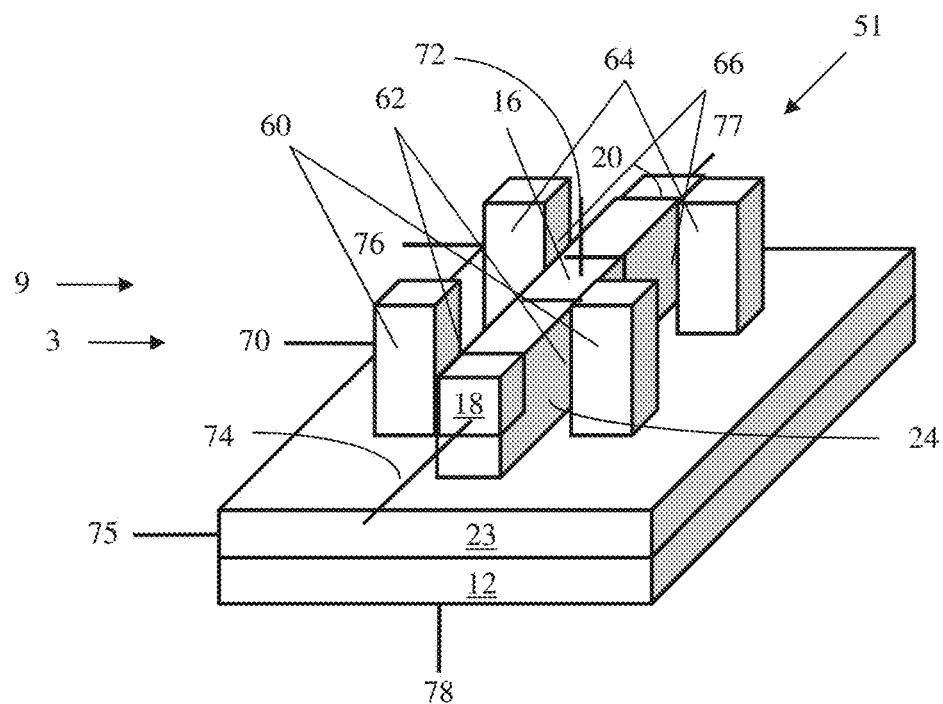
FIGS. 32-33 provide three-dimensional schematic representations of illustrative, non-exclusive examples of the third embodiment of a memory cell according to the present disclosure.
Figure 33:
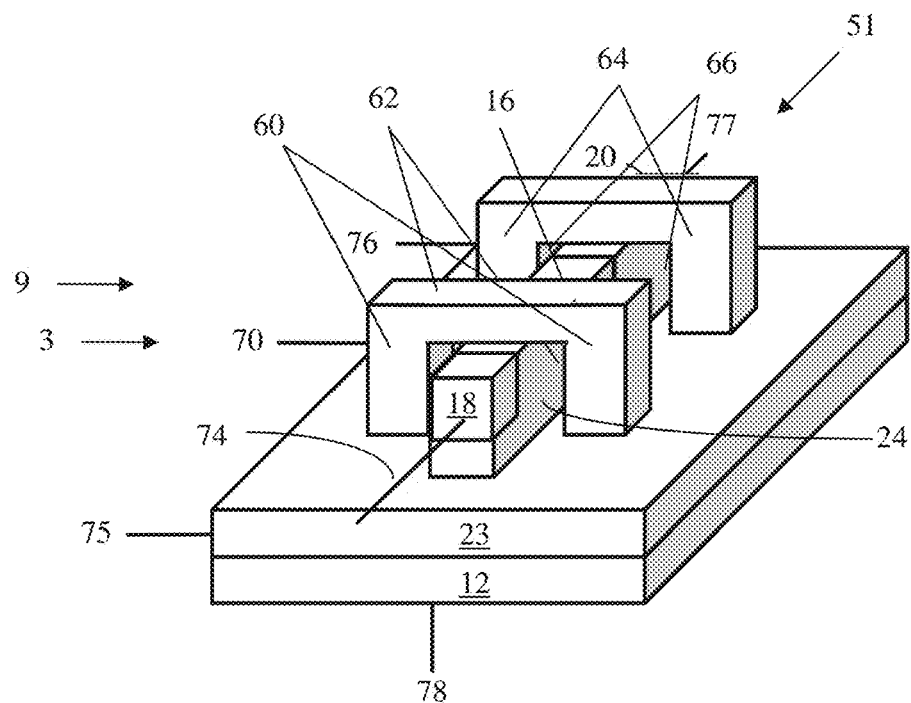
Figure 34:
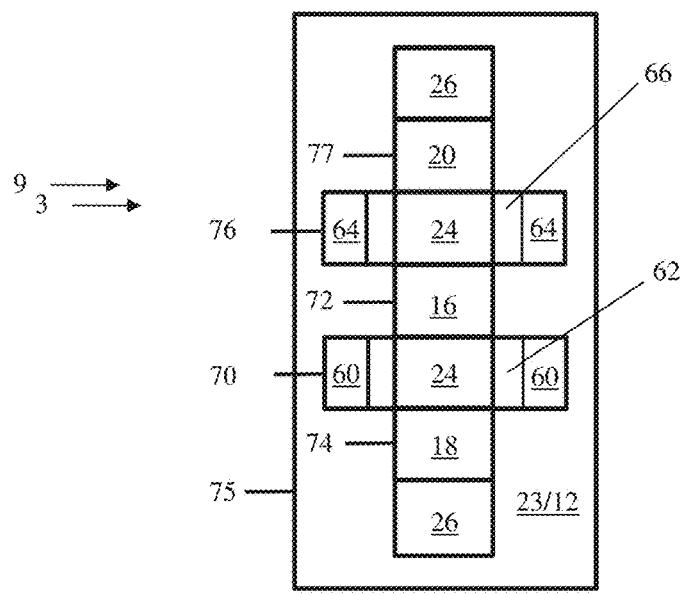
FIG. 34 provides a schematic representation of a top view of the memory cell of FIG. 32.

FIGS. 32-33 provide three-dimensional schematic representations of additional illustrative, non-exclusive examples of memory cells 3 according to the present disclosure, while FIG. 34 is a top view of the memory cell of FIG. 32. Memory cells 3 of FIGS. 32-34 are substantially similar to memory cells 1 of FIGS. 8-10 with the exception that memory cells 3 include well layer 23 instead of buried insulator layer 22 between substrate 12 and fin 51 and/or floating body region 24. In addition, and as discussed in more detail herein, memory cells 3 also include buried well terminal 75 that is in electrical communication with well layer 23 and further include insulating layers 26 between adjacent memory cells 3, as shown in FIG. 34.

Figure 35:
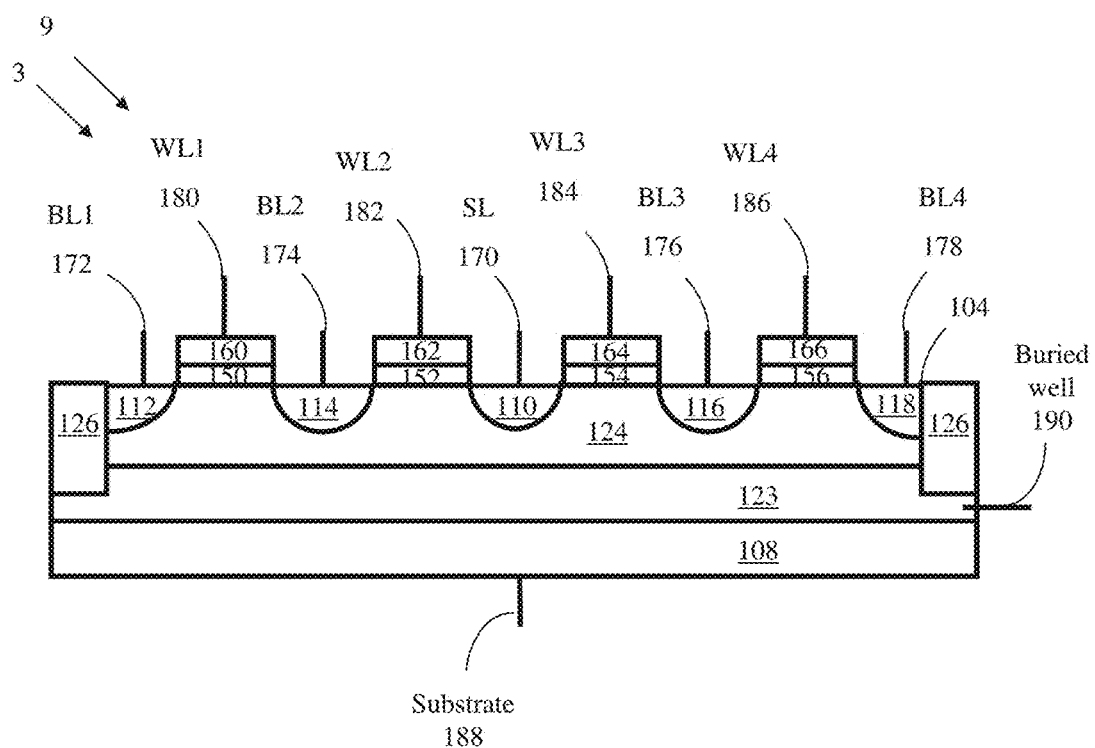
FIG. 35 provides a schematic representation of an illustrative, non-exclusive example of a quad-port memory cell of the third embodiment of a memory cell according to the present disclosure.

Similar to memory cells 1 and 2, and as discussed in more detail herein with reference to FIGS. 11 and 27, memory cells 3 may include any suitable number of ports. An illustrative, non-exclusive example of a multi-port memory cell 3, in the form of a quad-port memory cell 3, is shown in FIG. 35. Multi-port memory cell 3 is substantially similar to multi-port memory cell 1 of FIG. 11 with the exception that multi-port memory cell 3 includes buried well layer 123 between substrate 108 and floating body region 124 instead of buried insulator layer 122. In addition, buried well terminal 190 may be in electrical communication with buried well layer 123 and insulator layers 126 may separate adjacent memory cells 3.

Figure 36:
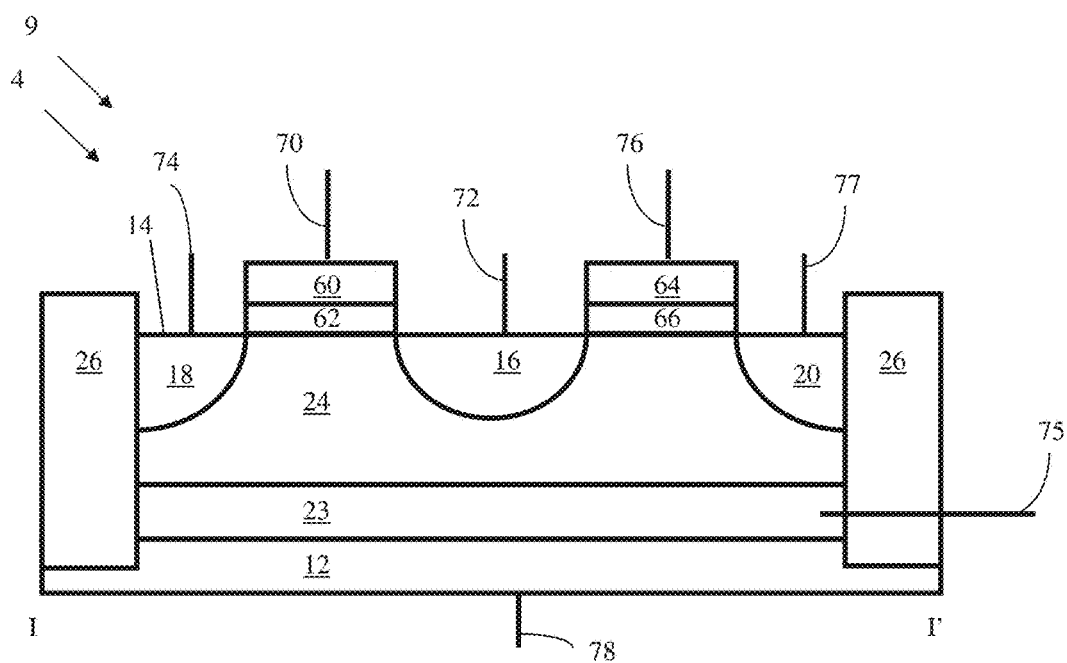
FIG. 36 provides a schematic representation of an illustrative, non-exclusive example of a fourth embodiment of a memory cell according to the present disclosure.
Figure 37:
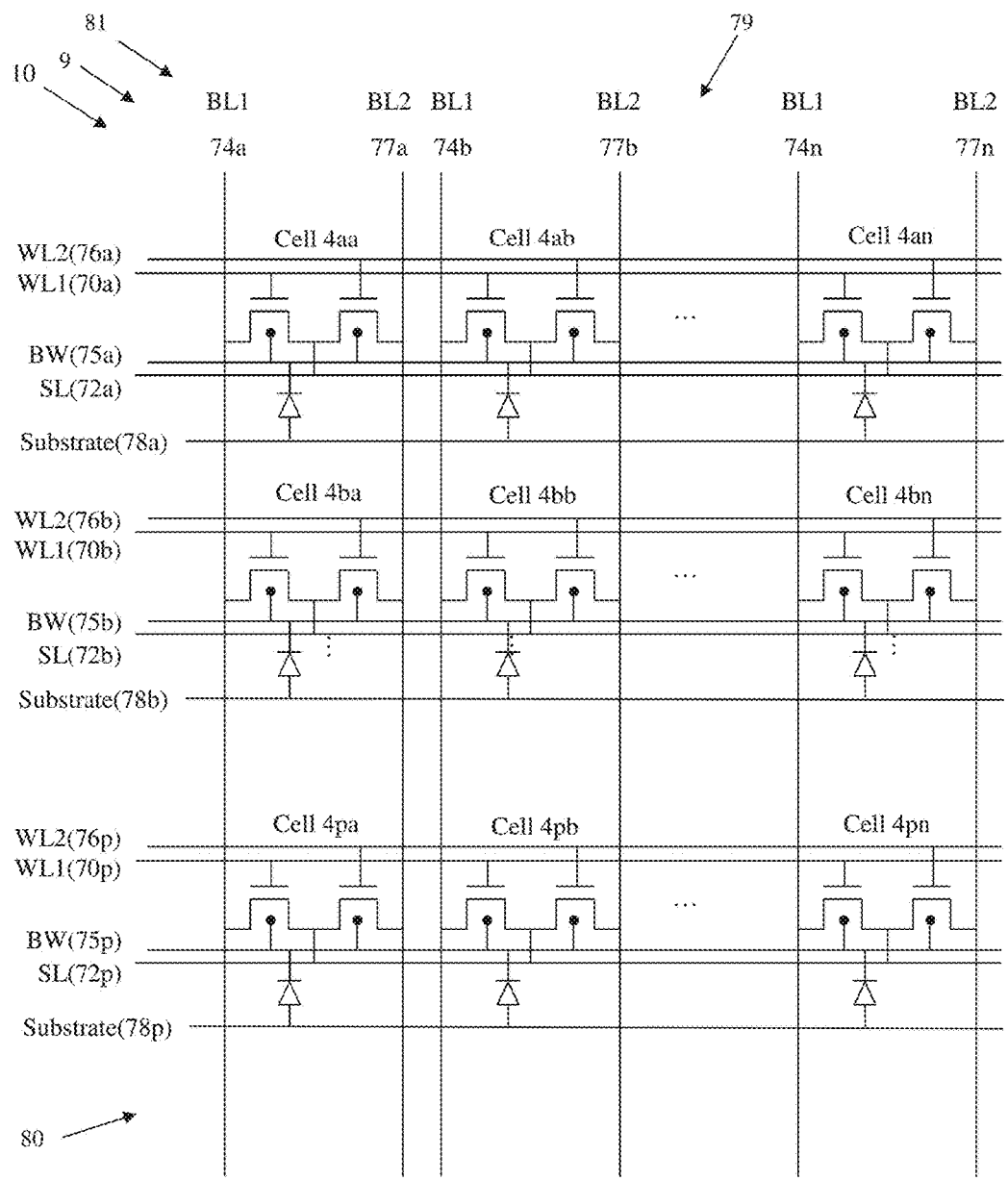
FIG. 37 provides a schematic representation of an illustrative, non-exclusive example of an array of memory cells of the fourth embodiment according to the present disclosure.

FIG. 36 provides a schematic representation of an illustrative, non-exclusive example of a fourth embodiment 4 of a memory cell 9 according to the present disclosure. The embodiment of FIG. 36 may be referred to herein as dual-port memory cell 4, memory cell 4, and/or cell 4. Memory cell 4 is substantially similar to memory cell 3 of FIGS. 28-35 with the exception that insulating layers 26, or trench isolation layers 26, extend through buried layer 23 and into substrate 12, while insulating layers 28, or trench isolation layers 28 (shown in FIGS. 38-40), end in buried well layer 23. Thus, and when memory cells 4 are joined in an array 81 to form a memory device 10 as schematically illustrated in FIG. 37, a buried layer 23 of a first memory cell 4 (such as memory cell "4aa") may not be in electrical communication with a buried layer 23 of a second and/or adjacent memory cell 4 (such as memory cell "4ba") in one dimension of array 81 (such as columns 79). However, buried layer 23 of the first memory cell 4 (such has memory cell "4aa") may be in electrical communication with a buried layer 23 of a third and/or adjacent memory cell 4 (such as memory cell "4ab") that is in a second dimension of array 81.

Figure 38:
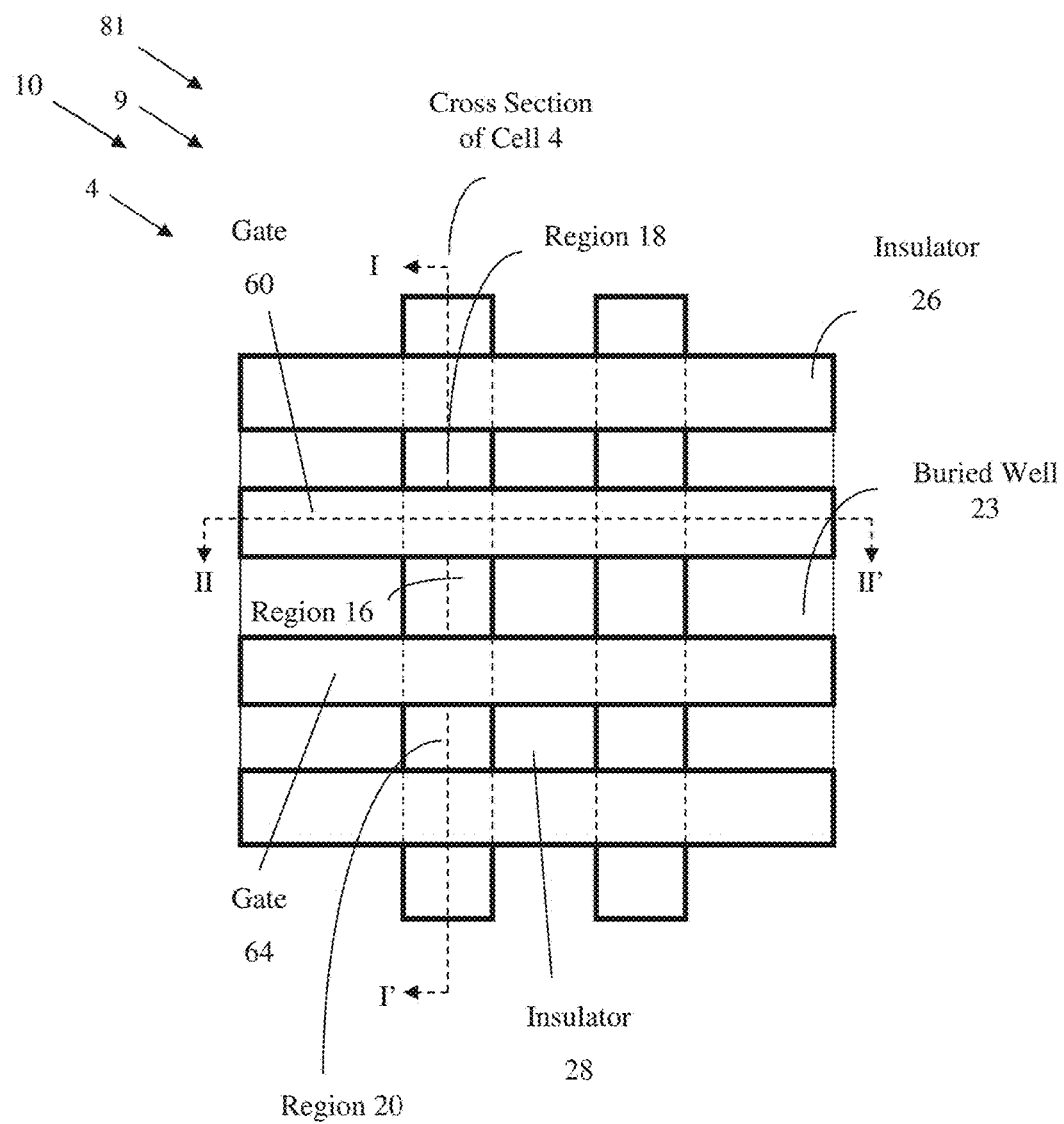
FIG. 38 provides a schematic representation of an illustrative, non-exclusive example of the two-dimensional layout of the array of memory cells of FIG. 37.

FIG. 38 is an illustrative, non-exclusive example of a two-dimensional layout of array 81 of memory cells 4 when viewed from the top. As discussed in more detail herein, the structure of cell 4 is substantially similar to that of cell 3 with the exception of the depth of the trench isolation 26 that is isolating region 18 of one cell 4 from region 20 of the adjacent cell 4 in array 81. Trench isolation 28 in cell 3 ends in buried well layer 23, while the trench isolation 26 in cell 4 breaks buried well layer 23 and ends in substrate 12.

Figure 39:
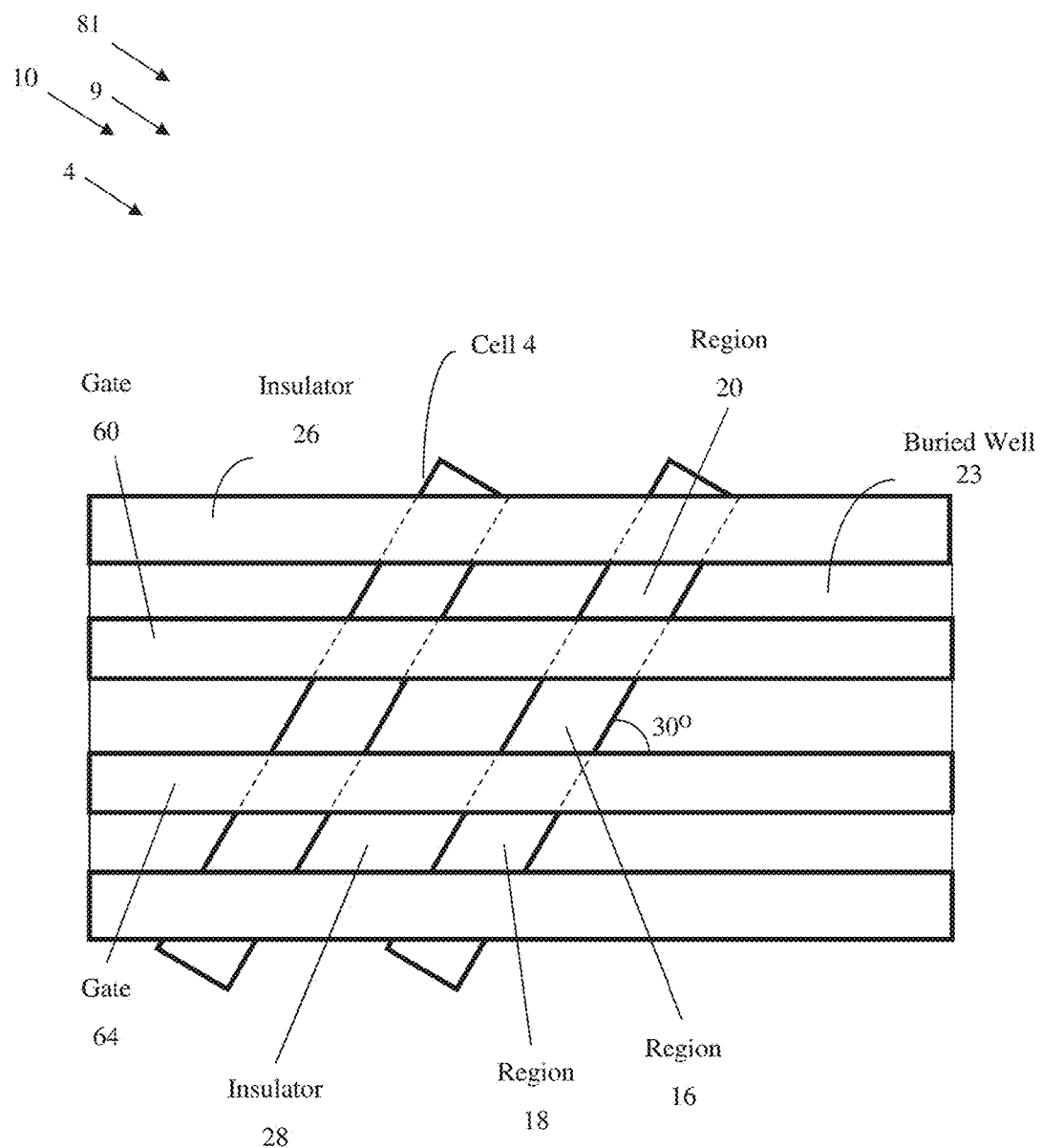
FIG. 39 provides a schematic representation of another illustrative, non-exclusive example of the two-dimensional layout of the array of memory cells of FIG. 37.

FIG. 39 shows another embodiment of the two-dimensional layout of array 81 of memory cells 4 when viewed from the top. The active regions 16, 18, 20 and floating body 24 are formed at an angle other than 90 degrees to the word lines gates 60 and 66 to provide for easier vertical metal connection routing of BL1, BL2 and SL terminals to regions 18, 20, and 16, respectively. FIG. 39 shows a particular non-limiting example of a 30 degree angle between gates 60 and 66 and the device area formed by regions 18, 16, and 20 and floating body 24. However, the angle may vary without departing from the scope of the present disclosure.

Figure 40:
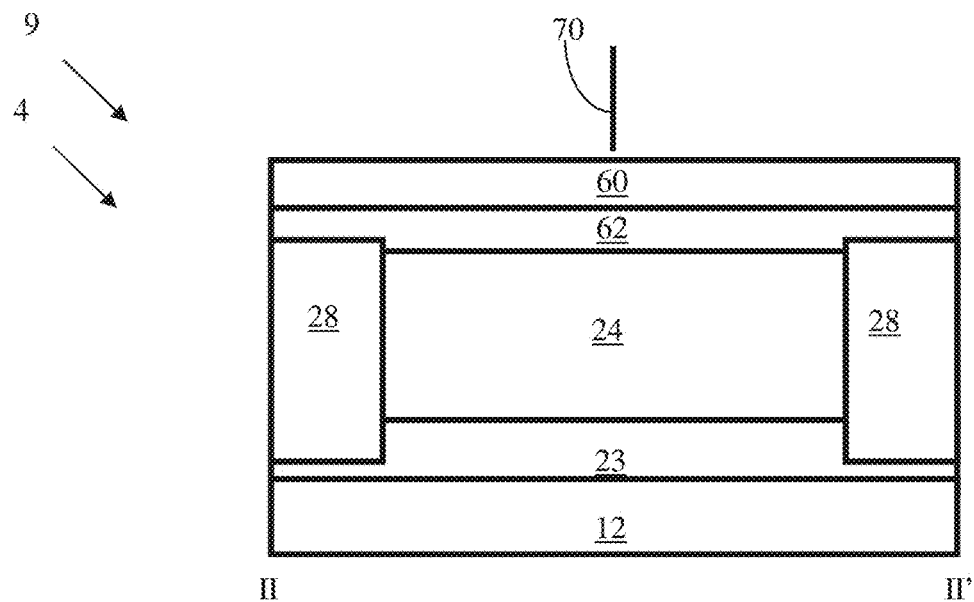
FIG. 40 provides a schematic representation of an illustrative, non-exclusive example of a cross section of the fourth embodiment of a memory cell taken along line II-II' of FIG. 38.

The schematic view of memory cell 4 shown in FIG. 36 is an orthogonal cross section along lines I-I' of FIG. 38, while FIG. 40 show an orthogonal cross section of cell 4 along lines II-II' of FIG. 38. The schematic cross-sections of FIGS. 36 and 40 illustrate that, as discussed in more detail herein, isolation layers 26 may break, and thus isolate, buried well layer 23 in one dimension, or direction, while isolation layers 28 may not break, and thus may not isolate, buried well layer 23 in another dimension, or direction. Thus, buried well terminal 75 may be shared across the entire row/column. Buried well terminal 75 from each row/column may be connected together across the entire array 81 for mass parallel holding operation and/or also may be segmented to provide for independent control of the applied bias on a selected portion of array 81 of memory cells 4. The memory operations (holding, row-wide write '0', bit-selective write '0' and write '1') of memory cell 4 and/or array 81 of FIGS. 36-40 are identical to those of memory cell 3 and/or array 81 of FIGS. 28-35 and are discussed in more detail herein with reference thereto. The alternate holding operation employing silicon rectifier principle as described for example in US 2010/0034041, "Method of Operating Semiconductor Memory Device with Floating Body Transistor Using Silicon Controlled Rectifier Principle", which is incorporated by reference herein in its entirety, may also be employed to memory cell 4.

Figure 41:
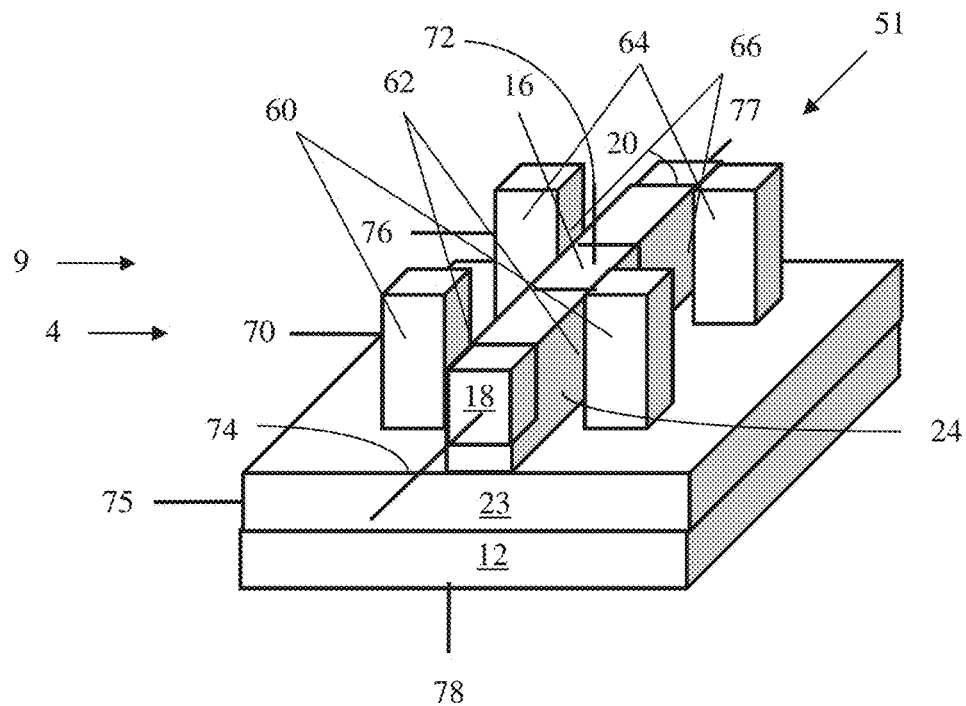
FIGS. 41-42 provide three-dimensional schematic representations of illustrative, non-exclusive examples of the fourth embodiment of a memory cell according to the present disclosure.
Figure 42:
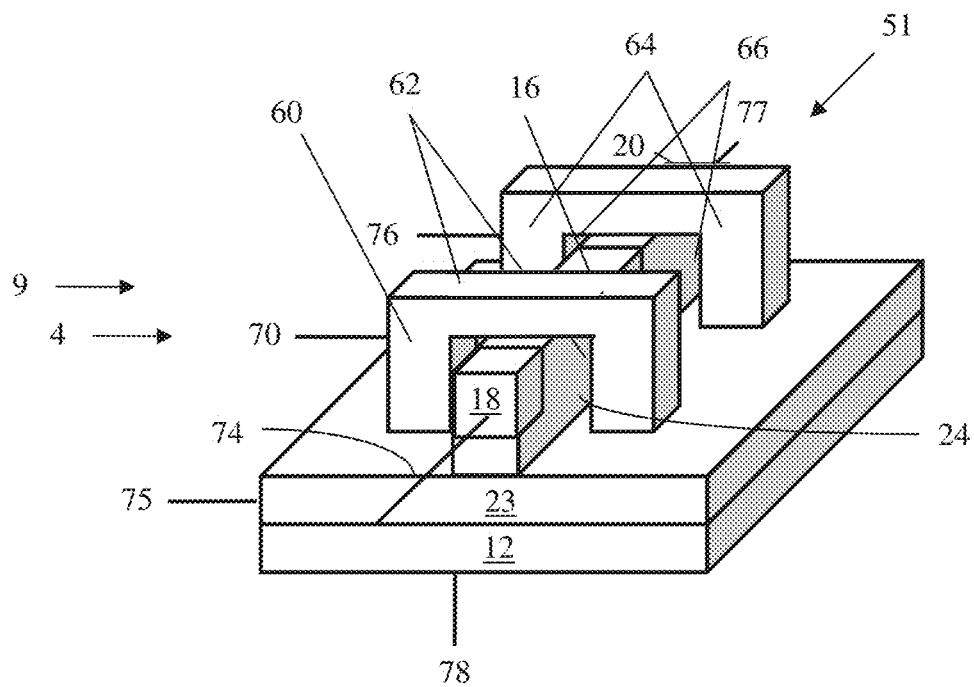
Figure 43:
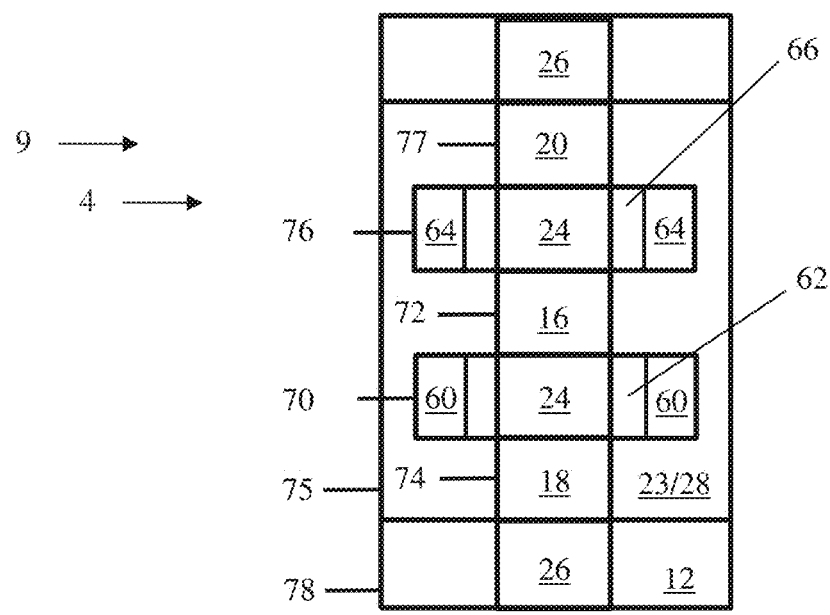
FIG. 43 provides a schematic representation of a top view of the memory cell of FIG. 41.

FIGS. 41-42 provide three-dimensional schematic representations of additional illustrative, non-exclusive examples of memory cells 4 according to the present disclosure, while FIG. 43 is a top view of the memory cell of FIG. 41. In FIGS. 41-43, insulating layers 28 are orthogonal to insulating layers 26. Memory cells 4 of FIGS. 41-43 are substantially similar to memory cells 3 of FIGS. 32-34 with the exception that, as discussed in more detail herein, trench isolation 26 in cell 4 ends in substrate 12. Similar to memory cell 3, the orthogonal trench isolation 28 in cell 4 is shallower and ends in the buried well layer 23.

Figure 44:
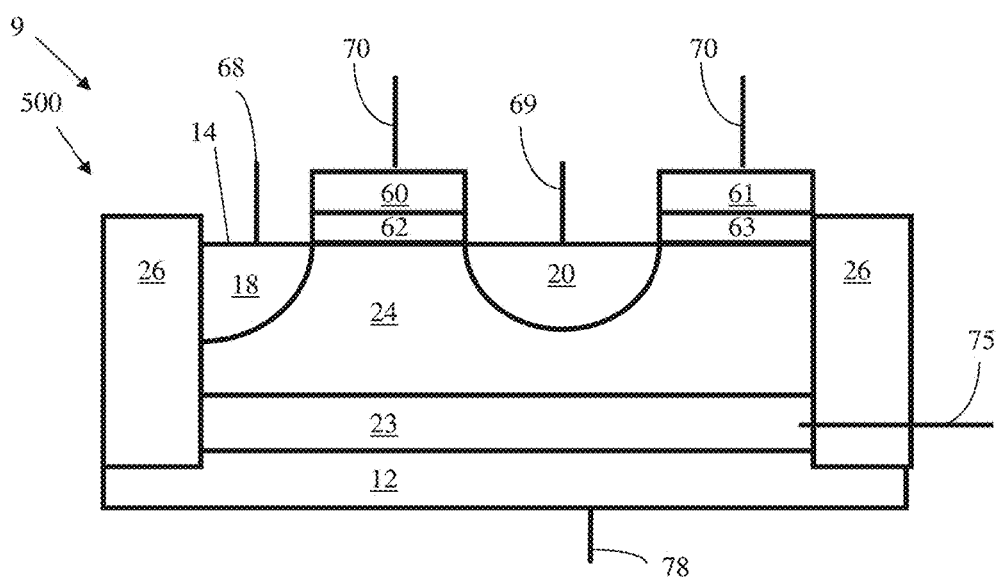
FIG. 44 provides a schematic representation of an illustrative, non-exclusive example of a transistor that may be utilized with a fifth embodiment of a memory cell according to the present disclosure.

FIG. 44 provides a schematic representation of an illustrative, non-exclusive example of a transistor 500 according to the present disclosure that may be included in and/or form a portion of memory cells 9. Transistor 500 includes a substrate 12 of a first conductivity type, such as a p-type conductivity type, for example. Substrate 12 may include any suitable substrate formed from any suitable material, illustrative, non-exclusive examples of which are discussed in more detail herein. Substrate 12 has a surface 14. A first region 18 having a second conductivity type, such as an n-type conductivity type, is provided in substrate 12 and is exposed at surface 14. A second region 20 having the second conductivity type is also provided in substrate 12, which is exposed at surface 14 and which is spaced apart from the first region 18. First and second regions 18 and 20 may be formed using any suitable method and/or process, illustrative, non-exclusive examples of which include ion implantation and/or solid state diffusion, and are discussed in more detail herein.

A buried layer 23 of the second conductivity type is also provided in the substrate 12, as shown. A floating body region 24 having the first conductivity type, such as a p-type conductivity type, is bounded by surface, first and second regions 18, 20, insulating layers 26 and 28, and buried layer 23. Buried layer 23 and/or floating body region 24 may be formed using any suitable process and/or method, illustrative, non-exclusive examples of which include ion implantation and/or epitaxial growth and are discussed in more detail herein.

Insulating layers 26 and 28 (e.g. shallow trench isolation (STI)) may be formed from any suitable dielectric material, illustrative, non-exclusive examples of which are discussed in more detail herein. Insulating layers 26 insulate region 18 of transistor 500 from region 18 of neighboring transistor 500 and insulate buried well 23 of transistor 500 from buried well 23 of neighboring transistor 500 when multiple transistors 500 are joined to form a memory device and/or array of transistors 500. Insulating layers 28 insulate regions 18, 20, and floating body 24 of cell 500 from regions 18, 20, and floating body 24 of neighboring transistor 500 when multiple transistors 500 are joined to form the memory device and/or array of transistors 500.

Similar to memory cells 4, and as discussed in more detail herein with reference to FIGS. 36-40, insulating layers 28 may be orthogonal to insulating layers 26. Trench isolation 26 in transistor 500 ends in substrate 12. The orthogonal trench isolation 28 in transistor 500 is shallower and ends in the buried well layer 23. A gate 60 is positioned in between the regions 20 and 18, and above the surface 14. The gate 60 is insulated from surface 14 by an insulating layer 62. A gate 61 is positioned in between the regions 20 and insulating layer 26, and above the surface 14. The gate 61 is insulated from surface 14 by an insulating layer 63. Insulating layers 62 and 63 may be formed from any suitable dielectric material, illustrative, non-exclusive examples of which are discussed in more detail herein. Similarly, gates 60 and 61 may be formed from any suitable conductive material, illustrative, non-exclusive examples of which are discussed in more detail herein.

Transistor 500 further includes terminal 70 electrically connected to gates 60 and 61, terminal 68 electrically connected to region 18, terminal 69 electrically connected to region 20, buried layer terminal 75 electrically connected to buried well (BW) 23, and substrate terminal 78 electrically connected to substrate 12.

Figure 45:
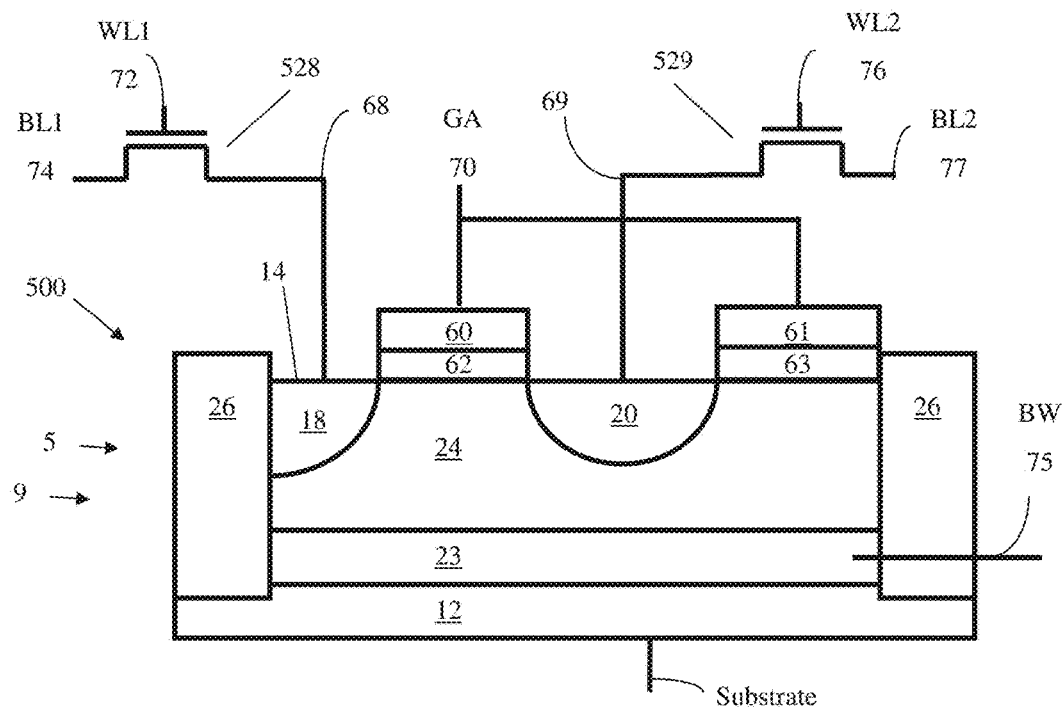
FIG. 45 provides a schematic representation of an illustrative, non-exclusive example of the fifth embodiment of a memory cell according to the present disclosure.

FIG. 45 provides a schematic representation of an illustrative, non-exclusive example of a fifth embodiment 5 of a memory cell 9 according to the present disclosure that includes transistor 500. The embodiment of FIG. 45 may be referred to herein as memory cell 5 and/or cell 5.

Memory cell 5 of FIG. 45 includes transistor 500 and pass transistors 528 and 529, which also may be referred to herein as access transistors 528 and 529. Pass transistors 528 and 529, which also may be referred to herein as a first transistor 528 and a second transistor 529, may include regular field-effect transistors, such as n-type metal oxide semiconductor field-effect transistors (MOSFET). The source terminal of transistor 528 is connected to terminal 68 of transistor 500 and the source terminal of transistor 529 is connected to terminal 69 of transistor 500. Cell 5 consists of bit line #1 (BL1) terminal 74 electrically connected to a drain terminal of first transistor 528, word line #1 (WL1) terminal 72 electrically connected to a gate terminal of first transistor 528, gate assist (GA) terminal 70 electrically connected to gate 60 and gate 61 of transistor 500, word line #2 (WL2) terminal 76 electrically connected to a gate terminal of second transistor 529, bit line #2 (BL2) terminal 77 electrically connected to a drain terminal of second transistor 529, buried well (BW) terminal 75 electrically connected to buried layer 22, and substrate terminal 78 electrically connected to substrate 12. WL1 terminal 72 and BL1 terminal 74 may be referred to herein as 'port #1' and WL2 terminal 76 and BL2 terminal 77 may be referred to herein as 'port #2'.

Figure 46:
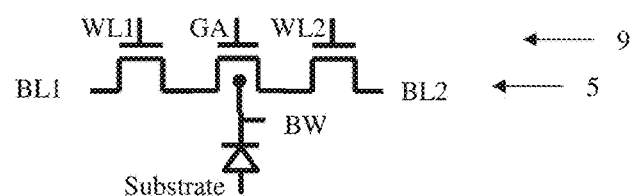
FIG. 46 provides a simplified equivalent circuit diagram of the fifth embodiment of a memory cell according to the present disclosure.
Figure 47:
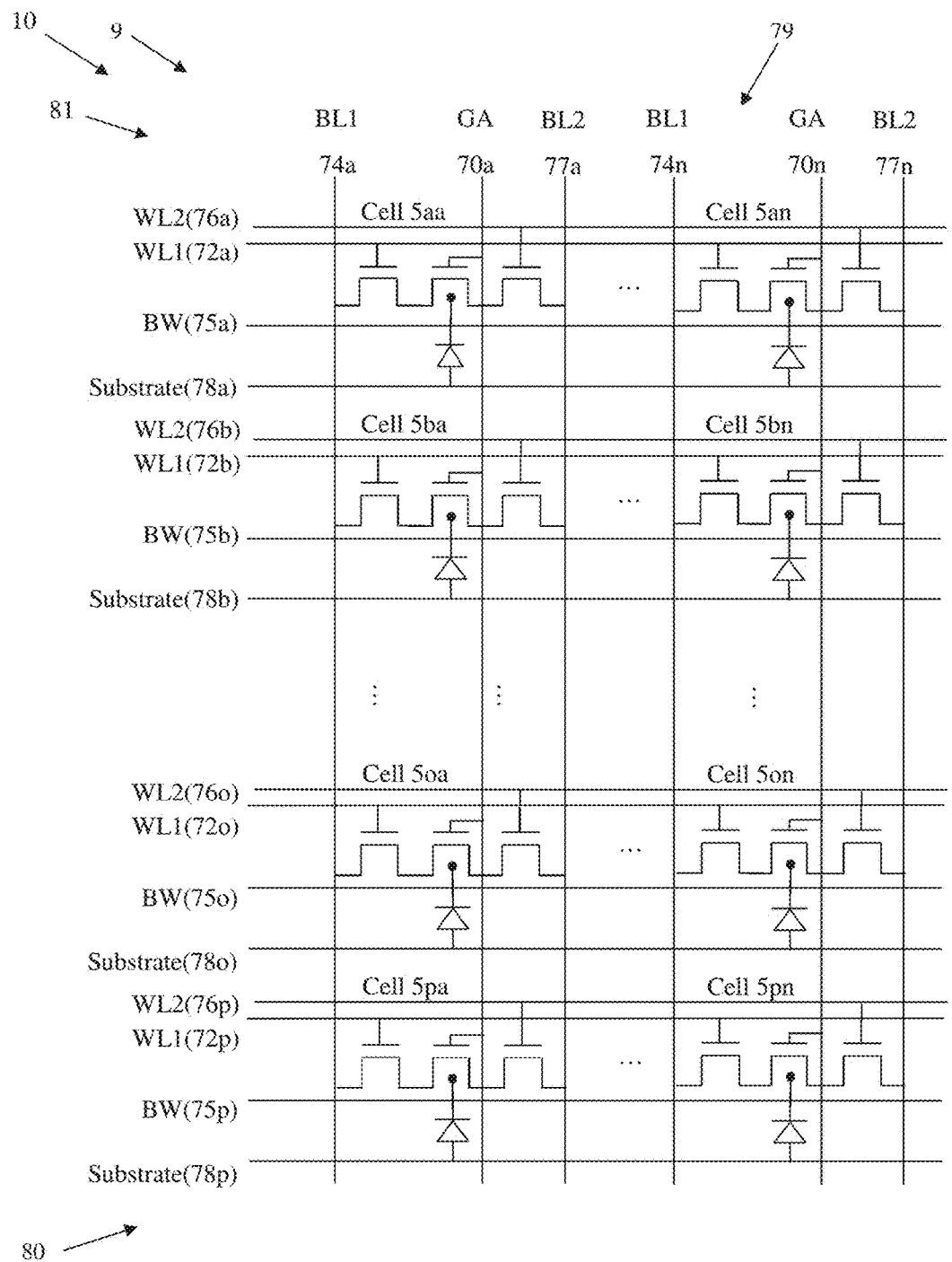
FIG. 47 provides a schematic representation of an illustrative, non-exclusive example of an array of memory cells of the fifth embodiment according to the present disclosure.
Figure 48:
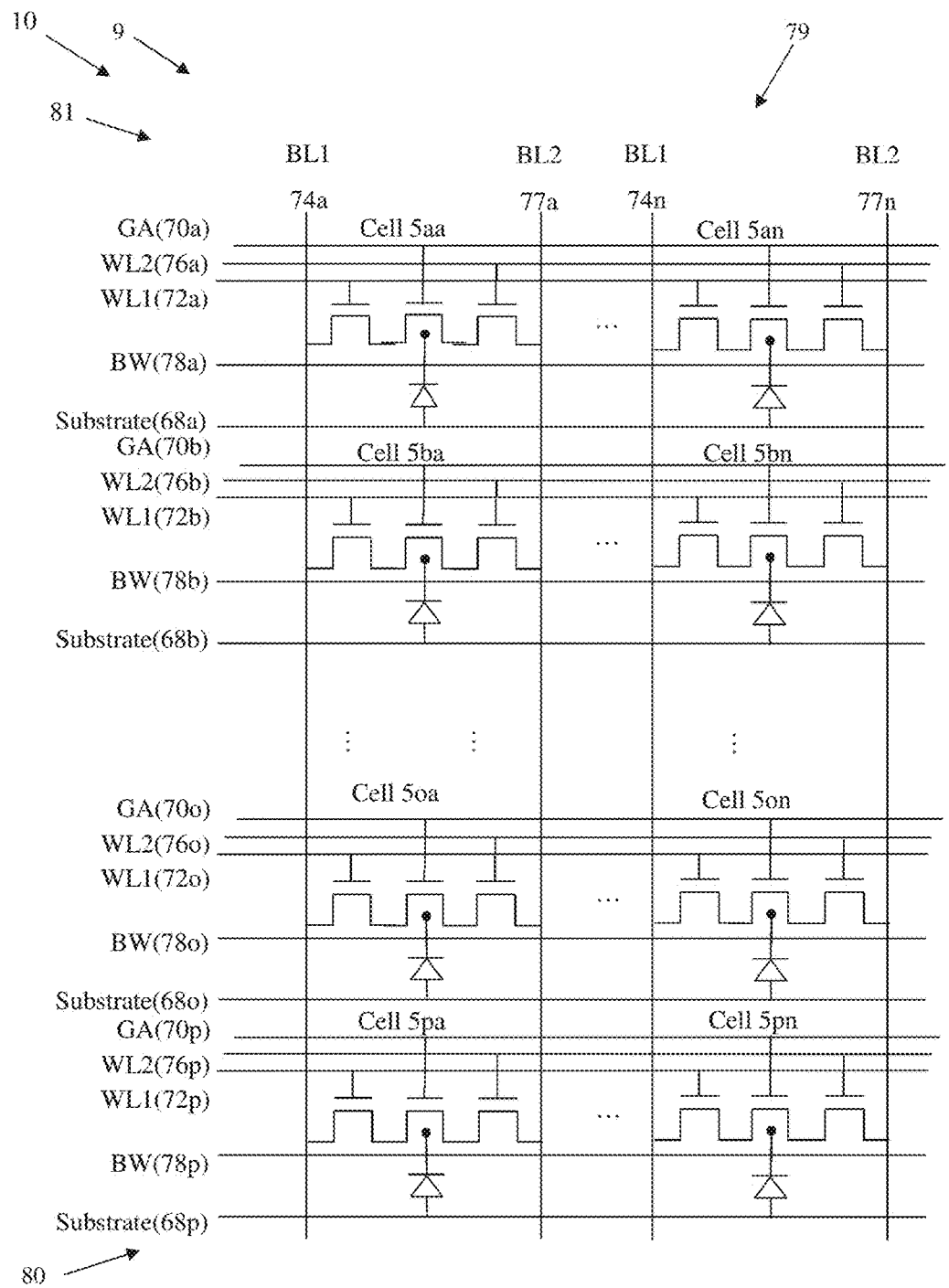
FIG. 48 provides another schematic representation of an illustrative, non-exclusive example of an array of memory cells of the fifth embodiment according to the present disclosure.

FIG. 46 shows a simplified equivalent circuit of cell 5. Multiple memory cells 5 may be joined in an array 81 to form a portion of a memory device 10 as shown in FIGS. 47-48. Array 81 shown in FIG. 47 is configured with the gate assist (GA) terminals 70 parallel to the bit line (BL) terminals 74 and 77 (i.e., in the column 79 direction), while the array 81 shown in FIG. 18 is configured with the gate assist (GA) terminals 70 parallel to the word line (WL) terminals 72 and 76 (i.e., in the row 80 direction). In another embodiment, the transistor 500 has an n-type conductivity type as the first conductivity type and p-type conductivity type as the second conductivity type, as noted above, and pass transistors 528 and 529 are p-type MOSFETs.

Figure 49:
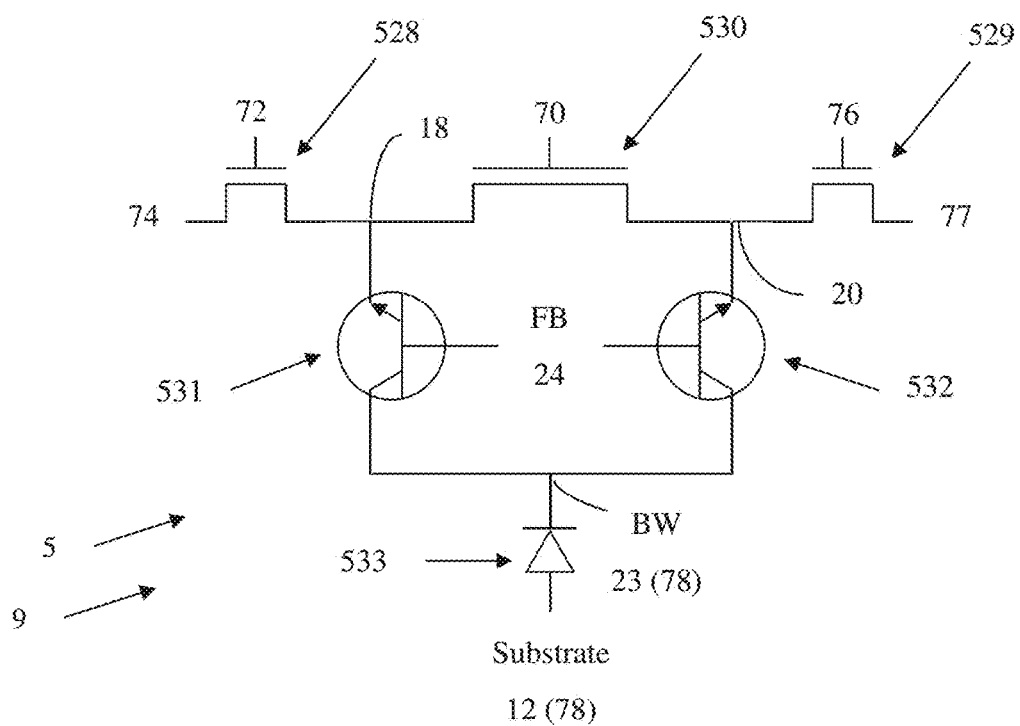
FIG. 49 provides a schematic representation of an equivalent circuit diagram of the memory cell of FIG. 46.

FIG. 49 provides an illustrative, non-exclusive example of an equivalent circuit representation of memory cell 5. Memory cell 5 includes pass transistors 528 and 529, which also may be referred to herein as field-effect transistors 528 and 529. In addition, memory cell 5 also includes field-effect transistors 530, formed by region 18, floating body 24, gate 60 and region 20, n-p-n bipolar devices 531, 532 formed by buried layer 23, floating body 24, regions 18 and 20 and diode 533 formed by substrate 12 and buried layer 23. The p-type substrate 12 of the current embodiment of the memory cell 5 will be grounded, reverse biasing the p-n junction between substrate 12 and buried well layer 23, thereby decreasing a potential for leakage current between substrate 12 and buried well layer 23.

The operation of memory cell 5 is largely determined by the emitter-collector (regions 18/20 and buried well 23) voltage potential of bipolar devices 531, 532 and their operation is the same regardless of the polarity of the applied voltage potential. Hence, the operation of memory cell 5 may be controlled by either active-low bit lines (terminals 74/77) or active-high bit lines. Active-low operation refers to applying a zero voltage level for activating a bit line while maintaining a positive voltage level for unselected bit lines. Active-high operation refers to applying a positive voltage level for activating a bit line while maintaining a zero voltage level for unselected bit lines.

Illustrative, non-exclusive examples of operations for memory cells 5 according to the present disclosure include an idle state and/or operation, a holding/refresh via port #1 operation, a holding/refresh via port #2 operation, a holding/refresh via port #1 and port #2 operation, a read port #1 only operation, a read port #2 only operation, a simultaneous read port #1 and port #2 operation, a row-wide write '0' operation, a bit-selective write '0' port #1 operation, a bit-selective write '0' port #2 operation, a write '1' port #1 with gate assist operation, a write '1' port #2 with gate assist operation, a compact write '1' port #1 operation, and/or a compact write '1' port #2 operation. FIG. 50 provides illustrative, non-exclusive examples of biasing conditions that may be utilized to perform the idle, holding/refresh via port #1, holding/refresh via port #2, and/or holding/refresh via port #1 and port #2 operations when memory cell 5 is operated in the active-high operation. FIG. 51 provides illustrative, non-exclusive examples of biasing conditions that may be utilized to perform the read port #1 only, read port #2 only, and/or simultaneous read ports #1 and #2 operations when memory cell 5 is operated in the active-high state. In addition, FIG. 52 provides illustrative, non-exclusive examples of biasing conditions that may be utilized to perform the row-wide write '0', bit-selective write '0' port #1, and/or bit-selective write '0' port #2 operations when memory cell 5 is operated in the active-high state. FIG. 53 provides illustrative, non-exclusive examples of biasing conditions that may be utilized to perform the write '1' port #1 with gate assist, write '1' port #2 with gate assist, compact write '1' port #1, and/or compact write '1' port #2 operations when memory cell 5 is operated in the active-high state.

Similarly, FIG. 54 provides illustrative, non-exclusive examples of biasing conditions that may be utilized to perform the idle, holding/refresh via port #1, holding/refresh via port #2, and/or holding/refresh via port #1 and port #2 operations when memory cell 5 is operated in the active-low operation. FIG. 55 provides illustrative, non-exclusive examples of biasing conditions that may be utilized to perform the read port #1 only, read port #2 only, and/or simultaneous read ports #1 and #2 operations when memory cell 5 is operated in the active-low state. In addition, FIG. 56 provides illustrative, non-exclusive examples of biasing conditions that may be utilized to perform the row-wide write '0', bit-selective write '0' port #1, and/or bit-selective write '0' port #2 when memory cell 5 is operated in the active-low state, while FIG. 57 provides illustrative, non-exclusive examples of biasing conditions that may be utilized to perform the write '1' port #1 with gat assist, write '1' port #2 with gate assist, compact write '1' port #1, and/or compact write '1' port #2 operations when memory cell 5 is operated in the active-low state.

With reference to FIG. 45 for a single memory cell 5 and FIG. 47 for an array 81 of memory cells 5, FIG. 50 provides illustrative, non-exclusive examples of biasing conditions that may be utilized when array 81 is in the idle state, with memory cells 5 is operated in the active-high state. Memory cells 5 will be in idle mode when gates of both pass transistors 528 and 529 are turned off. The negative voltage applied to the word lines WL1 terminal 72 and WL2 terminal 76 may decrease a potential for column disturb during the bit-selective write '0' operation that will be described below. In the idle mode, a positive charge that may be stored in floating body region 24 will decrease over time due to p-n diode leakage formed by floating body 24 and regions 16, 18, and buried layer region 23 and due to charge recombination, and a periodic holding operation may be utilized to maintain the positive charge stored in the floating body 24 as described below.

FIG. 50 further provides illustrative, non-exclusive examples of biasing conditions that may be utilized to perform the holding operation via port #1, port #2, and/or via port #1 and port #2 simultaneously, with memory cells 5 operated in the active-high state. By applying a positive voltage bias to the word line terminal(s), transistor 528/529 will turn on and provide a voltage potential difference between bit line terminals 74 and/or 77 and BW terminal 75, which are the emitter and collector terminals of bipolar transistors 531/532.

If floating body 24 is positively charged (i.e. in a state '1'), the bipolar transistors 531 and 532 will be turned on. A fraction of the bipolar transistor current will then flow into floating body region 24 (usually referred to as the base current) and maintain the state '1' data. The efficiency of the holding operation can be enhanced by designing the bipolar devices 531, 532 formed by buried well 23, floating body region 24, and regions 18/20 to be a low-gain bipolar device, where the bipolar gain is defined as the ratio of the collector current flowing out of buried well terminal 75 to the base current flowing into the floating body region 24.

For memory cells in state '0' data, the bipolar devices 531, 532 will not be turned on, and consequently no base hole current will flow into floating body region 24. Therefore, memory cells in state '0' will remain in state '0'.

Figure 58:
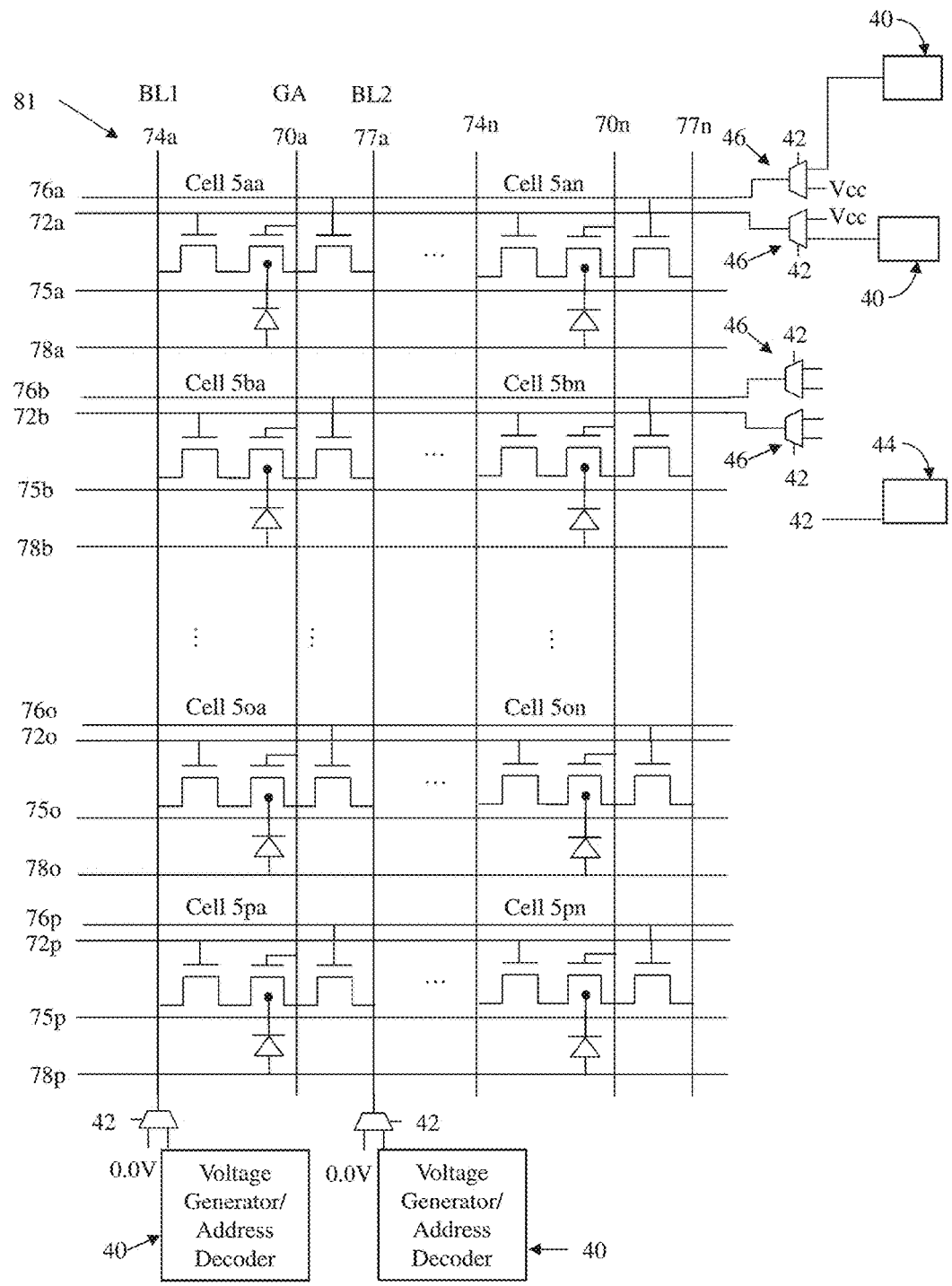
FIG. 58 provides a schematic representation of an illustrative, non-exclusive example of refresh circuitry that may be utilized to maintain a memory state of the fifth embodiment of a memory cell according to the present disclosure.

The state of the memory cell 5 may be maintained by refreshing the charge stored in floating body 24. This holding operation may be performed by applying a periodic positive voltage pulse to the back bias terminal (i.e., BW terminal 75). The refresh cycle may be performed as a mass parallel operation by turning on multiple word line rows and/or bit line columns of array 81, during which a read or write operation must be suspended. FIG. 58 illustrates multiplexers 46 that may determine the bias applied to the word line and/or bit line terminals, where the control signal 42 may be the output of a refresh circuitry 44. One refresh circuitry may control a single, multiple or all word lines and bit lines in array 81. Multiplexers 46 choose whether the word lines and bit lines receive individual voltage biases from Address Decoder Voltage Generator 40 depending on different operating modes as described later or refresh voltage biases as described above.

Figure 59:
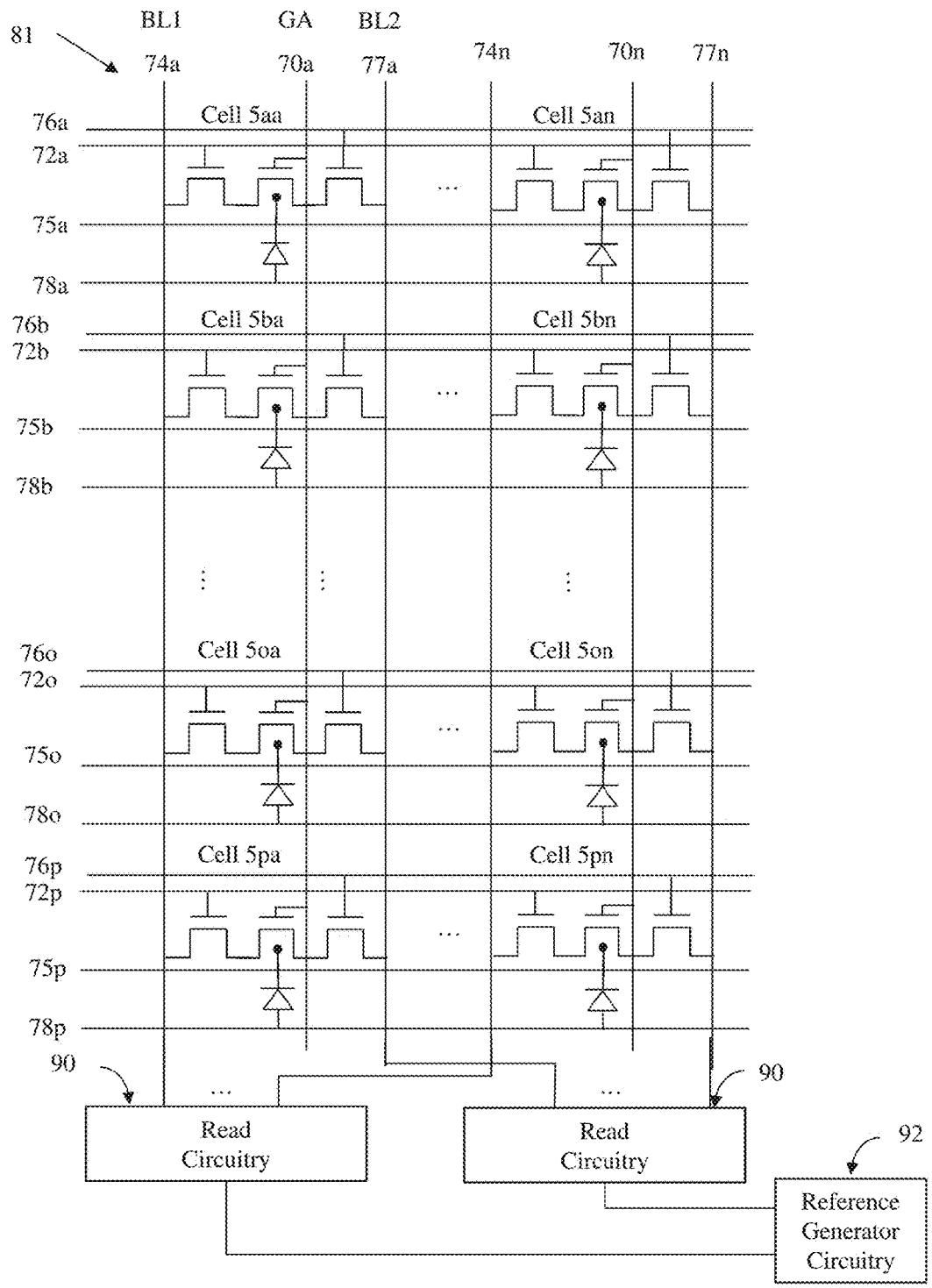
FIG. 59 provides a schematic representation of an illustrative, non-exclusive example of read circuitry that may be utilized with the fifth embodiment of a memory cell according to the present disclosure.

The charge stored in floating body 24 may be sensed by monitoring the cell current of the memory cell 5. If cell 5 is in a state '1' having holes in the floating body region 24, then the bipolar junction transistors 531 and 532 will be turned on and current will flow out of terminals 68 and 69 if there is voltage potential difference between terminals 68 and 69 and buried well 23. If cell 5 is in a state '0' having no holes in the floating body region 24, then the bipolar junction transistors 531 and 532 will be turned off and no current will flow out of terminals 68 and 69. A sensing circuit/read circuitry 90 typically connected to BL1 terminal 74 and/or BL2 terminal 77 of memory array 81 (e.g., see read circuitry 90 in FIG. 59) may then be used to determine the data state of the memory cell. As shown in FIG. 7, reference generator circuitry 92 may also be used during the operation of read circuitry 90.

A read operation on memory cell 5 may be performed independently by port #1 and port #2 irrespective of timing. However, read and write operations cannot occur simultaneously in order to avoid reading incorrect data. See descriptions below for details on the write contention avoidance.

FIG. 51 further provides illustrative, non-exclusive examples of biasing conditions that may be utilized to perform the read operation via port #1, port #2, and/or via port #1 and port #1 simultaneously, with memory cells 5 operated in the active-high state. As a result of the bias conditions applied as described, the unselected memory cells will be at idle mode, maintaining the states of the respective floating bodies 24 thereof.

Writing '0' to cell 5 may be done in a plurality of ways, including: 1) Row-wide write '0', where an entire selected row in a memory array 81 is written with '0's, and 2) Bit-selective write '0', where the write '0' operation may be performed on a specific memory cell without affecting unselected cells in the array. Row-wide write '0' is useful for memory reset or erase for any particular row and/or group of rows in array 81 and may be done via the back bias BW terminal that is common to both ports. Bit-selective write '0' is useful for regular random memory address write operations and may be done via either port #1 or port #2.

FIG. 52 provides illustrative, non-exclusive examples of biasing conditions that may be utilized to perform the row-wide write '0' operation and/or bit-selective write '0' operation via port #1 and/or port #2, with memory cells 5 operated in the active-high operation. When memory cell 5 and/or array 81 is biased for the row-wide write '0' operation, the p-n junctions (junction between 24 and 23) are forward-biased, evacuating any holes from the floating body 24 and writing the '0' data state to the selected memory cells 5. The bias conditions for all the unselected cells are the same since the write '0' operation only involves applying a negative voltage to the BW terminal 75 (thus to the entire row or multiple connected rows). As may be seen, the unselected memory cells will be in idle operation.

Bit-selective write '0' operation to cell 5 can only be done by either port #1 or port #2 at any given time but not by both simultaneously. Furthermore, during a write operation, the other port cannot perform a read operation and vice versa. A write operation has to be completed before a read operation by either port may commence or a read operation must be completed before a write operation by either port can commence. See descriptions below for details on the write contention avoidance.

FIG. 52 further provides illustrative, non-exclusive examples of biasing conditions that may be utilized to perform the bit-selective write '0' on port #1 or port #2, with memory cells 5 operated in the active-high state. When memory cell 5 and/or array 81 is biased for the bit-selective write '0' operation, the p-n junction (junction between 24 and 18) is forward-biased, evacuating any holes from the floating body 24. The unselected cells 5 not sharing the same WL1 or BL1 terminal (for the bit-selective write '0' on port #1) or the same WL2 or BL2 terminal (for the bit-selective write '0' on port #2) as the selected cell 5 will remain at idle state.

The write '1' operation may be performed in a plurality of ways, including: 1) Write '1' with gate assist and 2) compact write '1' where gate assist terminal is not used. As with the write '0' operation, the write '1' operation only may be performed by one of the ports at a given time and during the write process, a read operation cannot be performed.

FIG. 53 provides illustrative, non-exclusive examples of biasing conditions that may be utilized to perform the write '1' with gate assist operation via band-to-band tunneling mechanism to cell 5 by port #1, with memory cells 5 operated in the active-high state. The negative bias on GA terminal 70 and the positive bias on BL1 terminal 74 will result in hole injection to the floating body 24, and the unselected cells 5 will remain at the idle mode.

FIG. 53 also provides illustrative, non-exclusive examples of biasing conditions that may be utilized to perform the write '1' with gate assist operation via band-to-band tunneling mechanism to cell 5 by port #2, with memory cells 5 operated in the active-high state. The negative bias on GA terminal 70 and the positive bias on BL2 terminal 77 will result in hole injection to the floating body 24, and the unselected cells 5 will remain at the idle mode.

For memory cells sharing the same row as the selected memory cell, both the GA terminal 70 and BL1/BL2 terminals 74/77 are at about 0.0 volt. Comparing with the idle mode bias condition, it can be seen that cells sharing the same row (i.e. the same WL1/WL2 terminals 72/76) are in idle mode. As a result, the states of these memory cells will remain unchanged.

For memory cells sharing the same column as the selected memory cell, a zero or negative voltage is applied to the WL1/WL2 terminals 72/76. As a result, the transistors 528/529 connected to transistor 500 will be turned off and memory cell 5 is in idle mode as described above, maintaining the state of the floating body charge. For memory cells not sharing the same row or the same column as the selected memory cell, the WL1/WL2 terminals 72/76 will have a zero or negative applied voltage and GA terminal 70 will be at zero voltage, putting the memory cells at idle mode.

FIG. 53 further provides illustrative, non-exclusive examples of biasing conditions that may be utilized to perform the compact write '1' operation to cell 5 by port #1 via impact ionization mechanism, with memory cells 5 operated in the active-high operation. The large positive bias on BL1 terminal 74 will result in net current flow into the floating body 24, and the unselected cells 5 will remain at the idle mode.

FIG. 53 also provides illustrative, non-exclusive examples of biasing conditions that may be utilized to perform the compact write '1' operation to cell 5 by port #2 via impact ionization mechanism, with memory cells 5 operated in the active-high operation. The large positive bias on BL2 terminal 77 will result in net current flow into the floating body 24, and the unselected cells 5 will remain at the idle mode.

For memory cells sharing the same row as the selected memory cell, both the BL terminals 74/77 are at 0.0 volt. Comparing with the idle mode bias condition, it can be seen that cells sharing the same row (i.e. the same WL1/WL2 terminals 72/76) are in idle mode. As a result, the states of these memory cells will remain unchanged.

For memory cells sharing the same column as the selected memory cell, a zero or negative voltage is applied to the WL1/WL2 terminals 72/76. As a result, the transistors 528/529 connected to transistor 500 will be turned off and memory cell 5 is in idle mode as described above, maintaining the state of the floating body charge. For memory cells not sharing the same row or the same column as the selected memory cell, the WL1/WL2 terminals 72/76 have a zero or negative voltage applied and the BL1/BL2 terminals are at 0.0 volt, putting the memory cells at idle mode.

As discussed in more detail herein, the operation of memory cells 5 also may be controlled by active-low bit lines terminal 74/77. Generally, the polarity between BL1 or BL2 terminals 74 or 77 and buried well terminal 75 is reversed from the active-low bit lines operation, with the exception of when the bit lines are asserted a negative voltage. The biasing conditions that may be utilized to perform the above operations when memory cells 5 are operated in the active-low state are shown in FIGS. 54-57.

As discussed in more detail herein, FIG. 48 shows another embodiment of array 81, where the gate assist GA terminal 70 is laid out on a row parallel to the word line terminals 72 and 76. All operations of memory cell 5 with row gate assist are identical to those with column gate assist as summarized in FIGS. 50-57 with the exception of write '1' operation with gate assist using active-low bit lines. Write '1' operation with gate assist using row GA terminal will write state '1' to the entire row since the word line WL1 or WL2 terminal 72 or 76 is activated and the bit line BL1 or BL2 terminal 74 or 77 is at logic high for the entire row. Consequently, active-low bit line write '1' operation with gate assist will result in a row-wide write '1' operation.

Figures 60, 61:
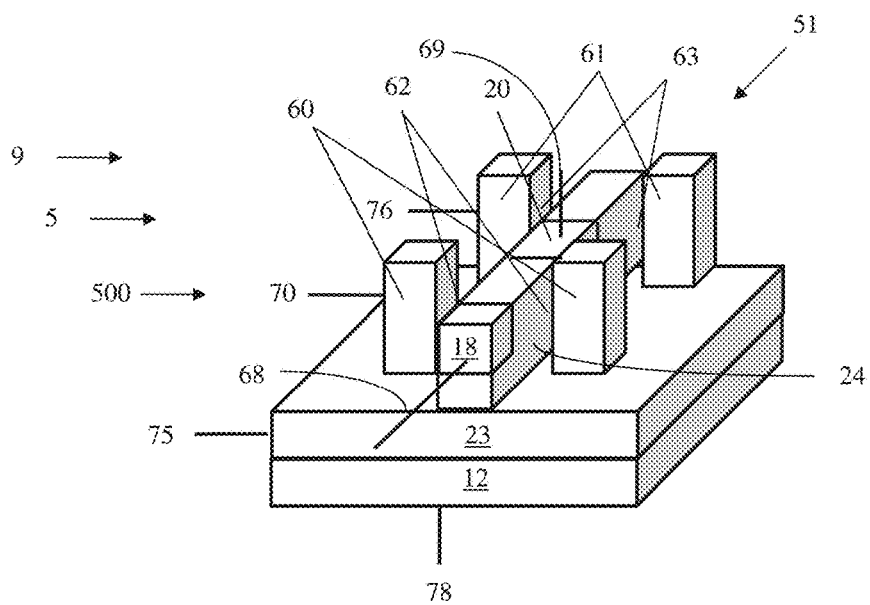
FIG. 60 provides an illustrative, non-exclusive example of biasing conditions that may be utilized during the row-wide write '1' with gate assist operation on the array of FIG. 48.
FIGS. 61-62 provide three-dimensional schematic representations of illustrative, non-exclusive examples of the fifth embodiment of a memory cell according to the present disclosure.

FIG. 60 shows the biasing conditions for the row-wide write '1' with gate assist operation for array 81 of FIG. 48. Active-high bit line operations of array 81 with row gate assist are identical to active-low bit line operations of array 81 with column gate assist.

Figure 62:
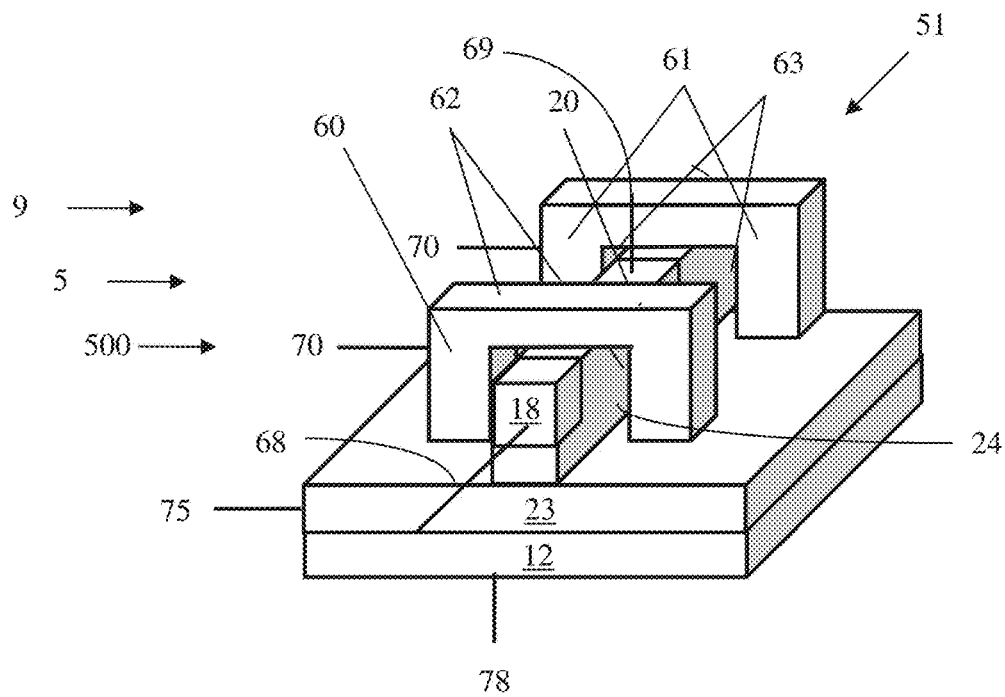
Figure 63:
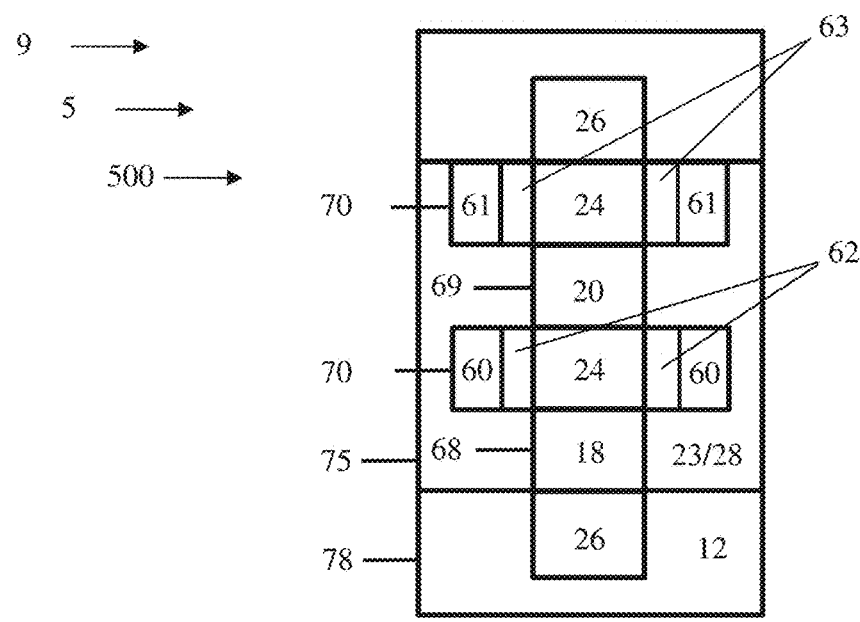
FIG. 63 provides a schematic representation of a top view of the memory cell of FIG. 57.

FIGS. 61-62 provide three-dimensional schematic representations of additional illustrative, non-exclusive examples of transistor 500 according to the present disclosure, while FIG. 63 is a top view of the transistor of FIG. 61. In this embodiment, transistor 500 has a fin structure 51 fabricated on substrate 12 having a first conductivity type (such as p-type conductivity type) so as to extend from the surface of the substrate to form a three-dimensional structure, with fin 51 extending substantially perpendicularly to, and above the top surface of the substrate 12. Fin structure 51 includes first and second regions 18, 20 having the second conductivity type. The floating body region 24 is bounded by the top surface of the fin 51, the first and second regions 18, 20 and insulating layers 26 and 28 (insulating layers 26 and 28 can be seen in the top view of FIG. 63).

Insulating layers 26 insulate region 18 and floating body 24 of transistor 500 from floating body 24 of neighboring transistor 500 and insulate buried well 23 of transistor 500 from buried well 23 of neighboring transistor 500 when multiple transistors 500 are joined to make a memory device (array 81). Insulating layers 28 insulate regions 18, 20 and floating body 24 of transistor 500 from regions 18, 20 and floating body 24 of neighboring transistor 500 when multiple transistors 500 are joined to make a memory device (array 81), but not the buried well region 23. As discussed in more detail herein, insulating layers 28 may be orthogonal to insulating layers 26.

Trench isolation 26 in transistor 500 ends in substrate 12. The orthogonal trench isolation 28 in transistor 500 is shallower and ends in the buried well layer 23. The floating body region 24 is conductive having a first conductivity type (such as p-type conductivity type). Fin 51 may be formed from any suitable material, illustrative, non-exclusive examples of which are discussed in more detail herein. A buried layer 23 of the second conductivity type is also provided in the substrate 12, buried in the substrate 12, as shown.

Transistor 500 further includes gate 60 on two opposite sides of the floating body region 24 as shown in FIG. 61. Alternatively, gate 60 may enclose three sides of the floating substrate region 24 as shown in FIG. 62. Gate 60 is insulated from floating body 24 by insulating layer 62. Gate 60 is positioned between the first and second regions 18, 20, adjacent to the floating body 24. Memory cells 9 including transistor 500 with fin 51 may include several terminals: terminals 68 and 69, gate assist (GA) terminal 70, buried well (BW) terminal 75 and substrate terminal 78.

Figure 64:
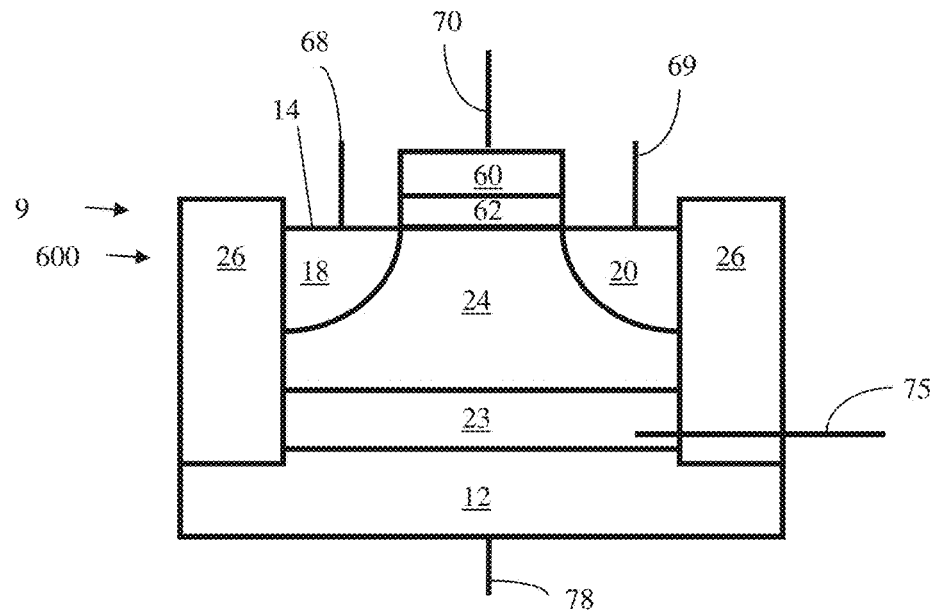
FIG. 64 provides a schematic representation of an illustrative, non-exclusive example of a transistor that may be utilized with a sixth embodiment of a memory cell according to the present disclosure.

FIG. 64 provides a schematic representation of an illustrative, non-exclusive example of a transistor 600 according to the present disclosure that may be included in and/or form a portion of memory cells 9. Transistor 600 includes a substrate 12 of a first conductivity type, such as a p-type conductivity type, for example. The substrate 12 has a surface 14. A first region 18 having a second conductivity type, such as an n-type conductivity type, is provided in substrate 12 and is exposed at surface 14. A second region 20 having the second conductivity type is also provided in substrate 12, which is exposed at surface 14 and which is spaced apart from the first region 18. First and second regions 18 and 20 may be formed using any suitable process and/or method, illustrative, non-exclusive examples of which include ion implantation and/or solid state diffusion.

A buried layer 23 of the second conductivity type is also provided in the substrate 12, buried in the substrate 12, as shown. A floating body region 24 having a first conductivity type, such as a p-type conductivity type, is bounded by surface 14, first and second regions 18, 20, insulating layers 26 and 28, and buried layer 23.

Insulating layers 26 insulate region 18 of transistor 600 from region 20 of neighboring transistor 600 and insulate buried well 23 of transistor 600 from buried well 23 of neighboring transistor 600 when multiple transistors 600 are joined to form a memory device (such as in an array of transistors 600). Insulating layers 28 (shown in FIG. 81) insulate regions 18, 20, and floating body 24 (but not the buried well 23) of transistor 600 from regions 18, 20, and floating body 24 of neighboring transistor 600 when multiple transistors 600 are joined to form the memory device. Insulating layers 28 may be orthogonal to insulating layers 26. The trench isolation 26 in transistor 600 ends in substrate 12. The orthogonal trench isolation 28 in transistor 600 is shallower and ends in the buried well layer 23.

A gate 60 is positioned in between the regions 20 and 18, and above the surface 14. The gate 60 is insulated from surface 14 by an insulating layer 62.

Transistor 600 further includes terminal 70 electrically connected to gate 60, terminal 68 electrically connected to region 18, terminal 69 electrically connected to region 20, buried layer terminal 75 electrically connected to buried well (BW) 23, and substrate terminal 78 electrically connected to substrate 12.

Figure 65:
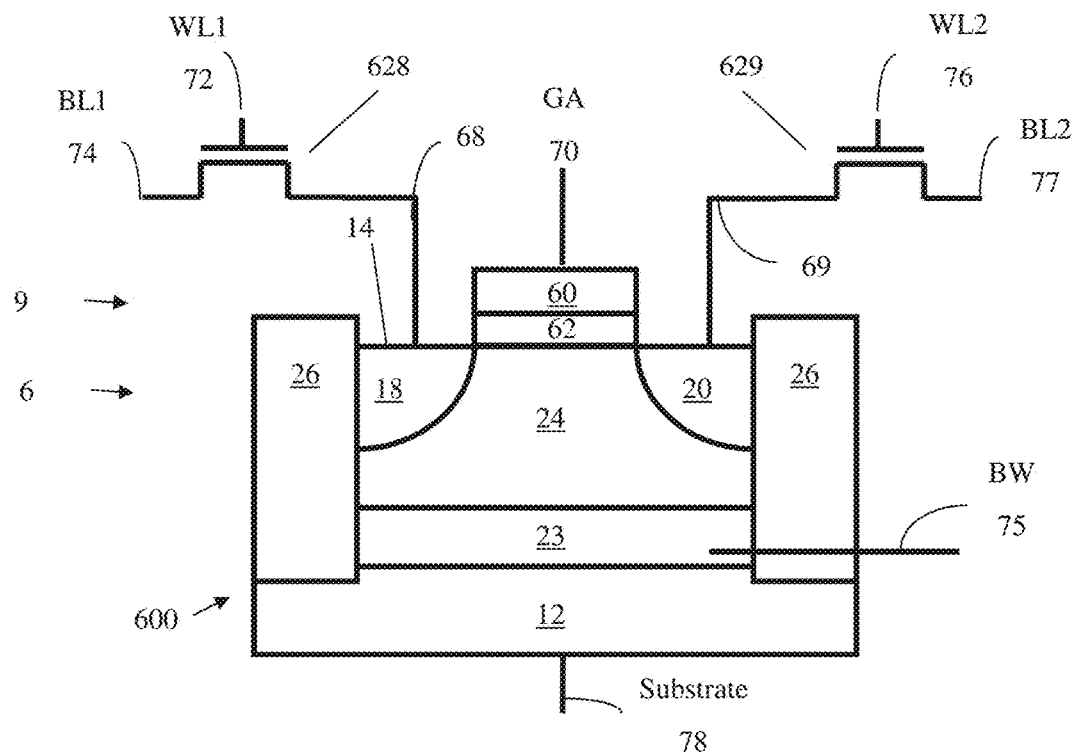
FIG. 65 provides a schematic representation of an illustrative, non-exclusive example of the sixth embodiment of a memory cell according to the present disclosure.

FIG. 65 provides a schematic representation of an illustrative, non-exclusive example of a sixth embodiment 6 of a memory cell 9 according to the present disclosure that includes transistor 600. The embodiment of FIG. 61 may be referred to herein as memory cell 6 and/or cell 6.

Memory cell 6 of FIG. 65 includes pass transistors 628 and 629, which also may be referred to herein as access transistors 628 and 629 and may be substantially similar to pass transistors 528 and 529 of FIG. 45. The source terminal of transistor 628 is connected to terminal 68 of transistor 600 and the source terminal of transistor 629 is connected to terminal 69 of transistor 600. Cell 6 consists of bit line #1 (BL1) terminal 74 electrically connected to drain terminal of first transistor 628, word line #1 (WL1) terminal 72 electrically connected to gate terminal of first transistor 628, gate assist (GA) terminal 70 electrically connected to gate 60 of transistor 600, word line #2 (WL2) terminal 76 electrically connected to gate terminal of transistor 629, bit line #2 (BL2) terminal 77 electrically connected to drain terminal of transistor 629, buried well (BW) terminal 75 electrically connected to buried layer 23, and substrate terminal 78 electrically connected to substrate 12. WL1 terminal 72 and BL1 terminal 74 may be referred to herein as 'port #1' and WL2 terminal 76 and BL2 terminal 77 may be referred to herein as 'port #2'.

Figure 66:
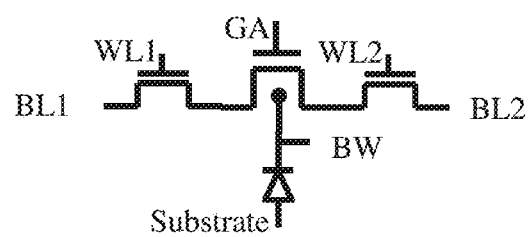
FIG. 66 provides a simplified equivalent circuit diagram of the sixth embodiment of a memory cell according to the present disclosure.
Figure 67:
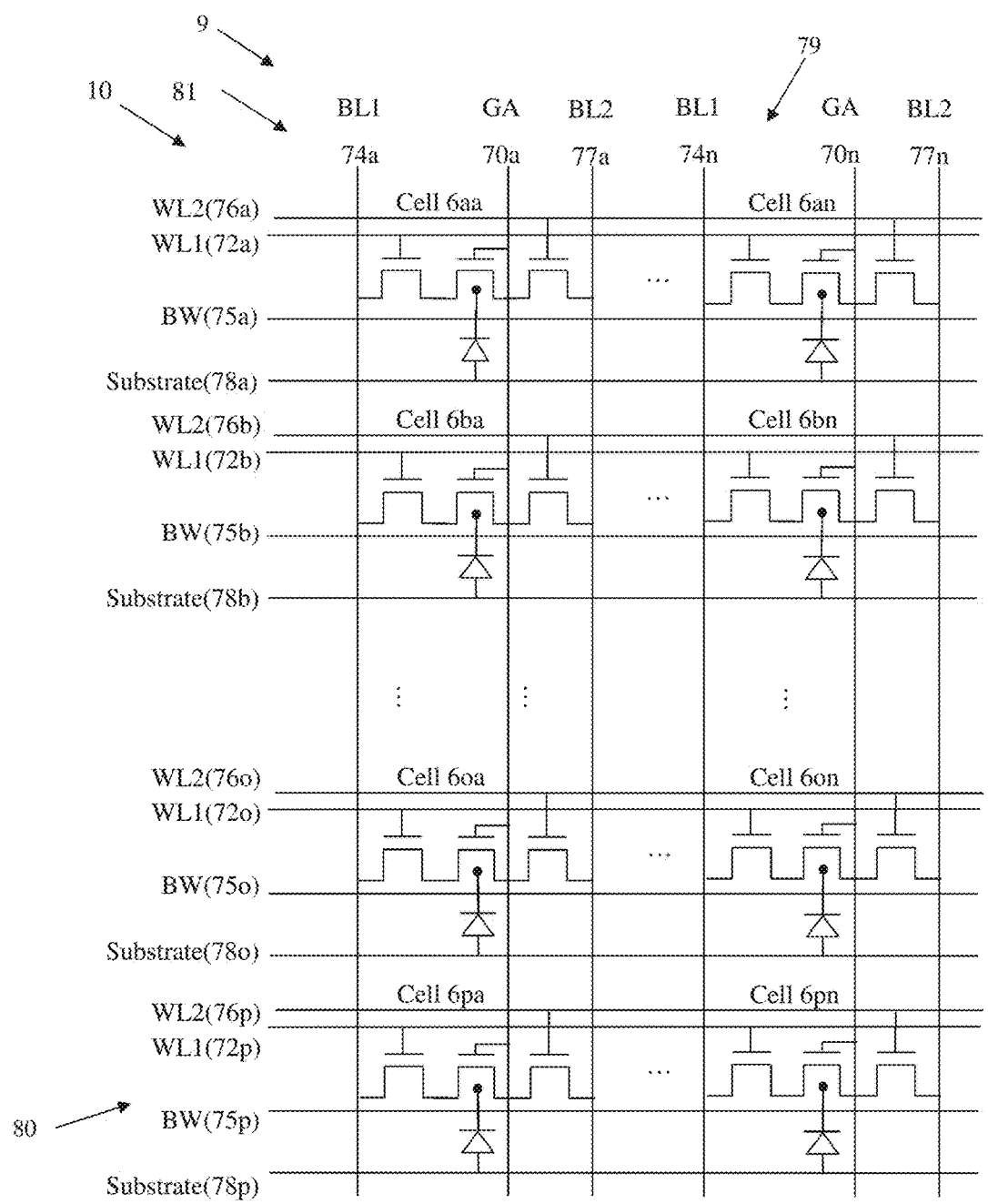
FIG. 67 provides a schematic representation of an illustrative, non-exclusive example of an array of memory cells of the sixth embodiment according to the present disclosure.
Figure 68:
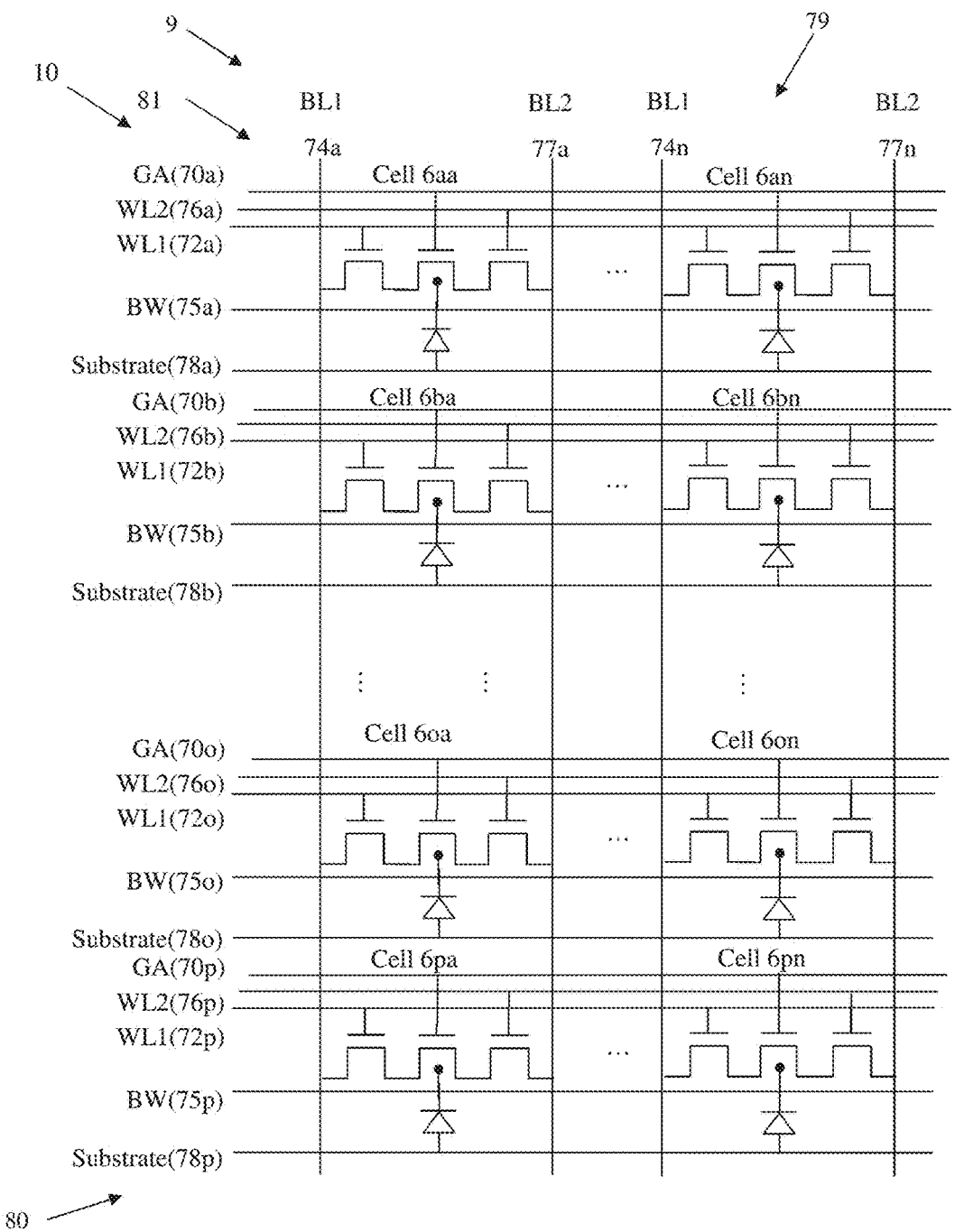
FIG. 68 provides another schematic representation of an illustrative, non-exclusive example of an array of memory cells of the sixth embodiment according to the present disclosure.

FIG. 66 shows a simplified circuit diagram of cell 6. Multiple memory cells 6 may be joined in an array 81 to make a memory device 10, or a portion thereof, as shown in FIGS. 67 and 68. In another embodiment, transistor 600 has an n-type conductivity type as the first conductivity type and p-type conductivity type as the second conductivity type, as noted above, and the transistors 628 and 629 are p-type MOSFETs.

Figure 69:
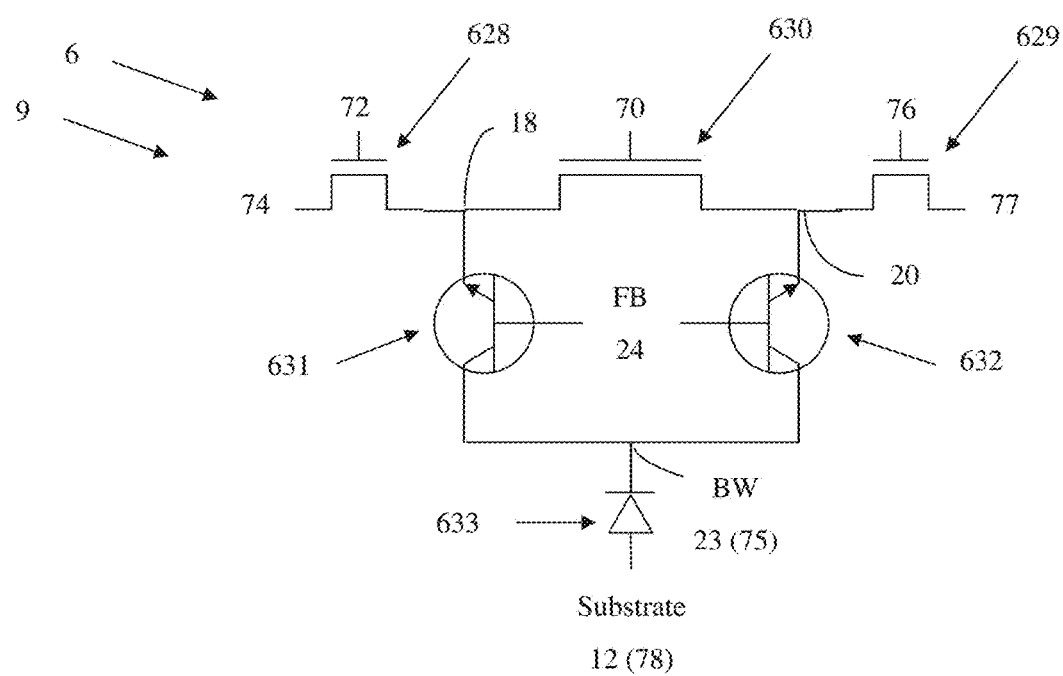
FIG. 69 provides a schematic representation of an equivalent circuit diagram of the memory cell of FIG. 61.

FIG. 69 provides an illustrative, non-exclusive example of an equivalent circuit representation of memory cell 6. Memory cell 6 includes pass transistors 628 and 629, which also may be referred to herein as field-effect transistors 628 and 629. In addition, memory cell 6 also includes field-effect transistors 630, formed by region 18, floating body 24, gate 60 and region 20, n-p-n bipolar devices 631, 632 formed by buried layer 23, floating body 24, regions 18 and 20 and diode 633 formed by substrate 12 and buried layer 23. The p-type substrate 12 of the current embodiment of the memory cell 6 will be grounded, reverse biasing the p-n junction between substrate 12 and buried well layer 23, thereby preventing any leakage current between substrate 12 and buried well layer 23.

The operations for memory cells 6 are substantially similar to the operations for memory cells 5 of FIGS. 49-59 and include operations with active-low and active-high bit lines. With reference to FIG. 65 for a single memory cell 6 and FIG. 67 for an array 81 of memory cells 6, illustrative, non-exclusive examples of operations and/or biasing conditions for memory cells 6 according to the present disclosure are shown in FIGS. 70-77.

FIG. 70 provides illustrative, non-exclusive examples of biasing conditions that may be utilized to perform the various idle and/or holding/refresh operations on memory cells 5, while FIG. 71 provides illustrative, non-exclusive examples of biasing conditions that may be utilized to perform the various read operations on memory cells 6 when memory cells 6 are operated in the active-high operation. FIG. 72 provides illustrative, non-exclusive examples of biasing conditions that may be utilized to perform the various write '0' operations on memory cells 6, while FIG. 73 provides illustrative, non-exclusive examples of biasing conditions that may be utilized to perform the various write '1' operations on memory cells 6 when memory cells 6 are operated in the active-high state.

Similarly, FIG. 74 provides illustrative, non-exclusive examples of biasing conditions that may be utilized to perform the various idle and/or holding/refresh operations on memory cells 6, while FIG. 75 provides illustrative, non-exclusive examples of biasing conditions that may be utilized to perform the various read operations on memory cells 6 when memory cells 6 are operated in the active-low operation. FIG. 76 provides illustrative, non-exclusive examples of biasing conditions that may be utilized to perform the various write '0' operations on memory cells 6, while FIG. 77 provides illustrative, non-exclusive examples of biasing conditions that may be utilized to perform the various write '1' operations on memory cells 6 when memory cells 6 are operated in the active-low operation.

As discussed in more detail herein, FIG. 68 shows another embodiment of array 81 of memory cells 6, where the gate assist GA terminal 70 is laid out in a row parallel to the word line terminals 72 and 76. Similar to memory cells 5, all operations of memory cell 6 with row gate assist are identical to those with column gate assist as summarized in FIGS. 70-77 with the exception of write '1' operation with gate assist using active-low bit lines. The write '1' operation with gate assist using active-low bit lines will write state '1' to the entire row since the word line WL1 or WL2 terminal 72 or 76 is activated and the bit line BL1 or BL2 terminal 74 or 77 is at logic high for the entire row. Consequently, active-low bit line write '1' operation with gate assist will result in a row-wide write '1' operation.

Figures 78, 79:
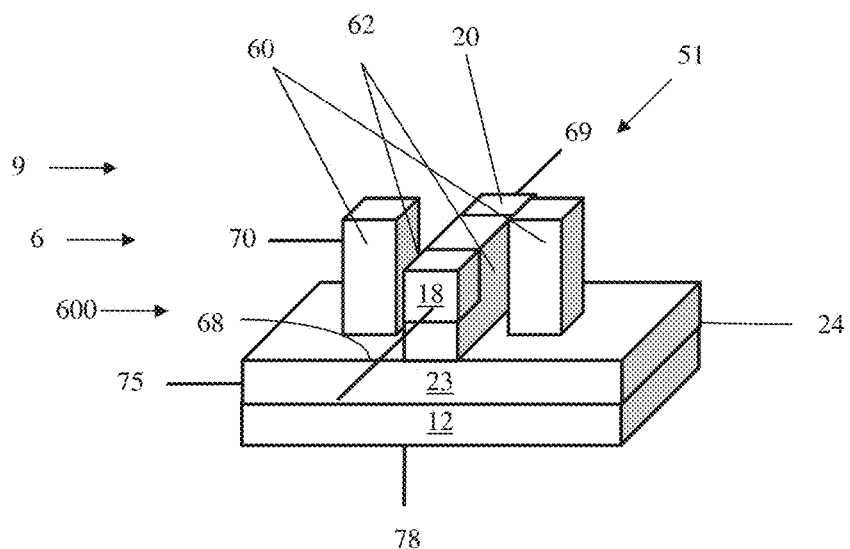
FIG. 78 provides an illustrative, non-exclusive example of biasing conditions that may be utilized during the row-wide write '1' with gate assist operation that may be utilized with the array of FIG. 64.
FIGS. 79-80 provide three-dimensional schematic representations of illustrative, non-exclusive examples of the sixth embodiment of a memory cell according to the present disclosure.

FIG. 78 shows the biasing conditions for the row-wide write '1' with gate assist operation for array 81 of FIG. 68. Active-high bit line operations of array 81 with row gate assist are identical to active-low bit line operations of array 81 with column gate assist.

Figure 80:
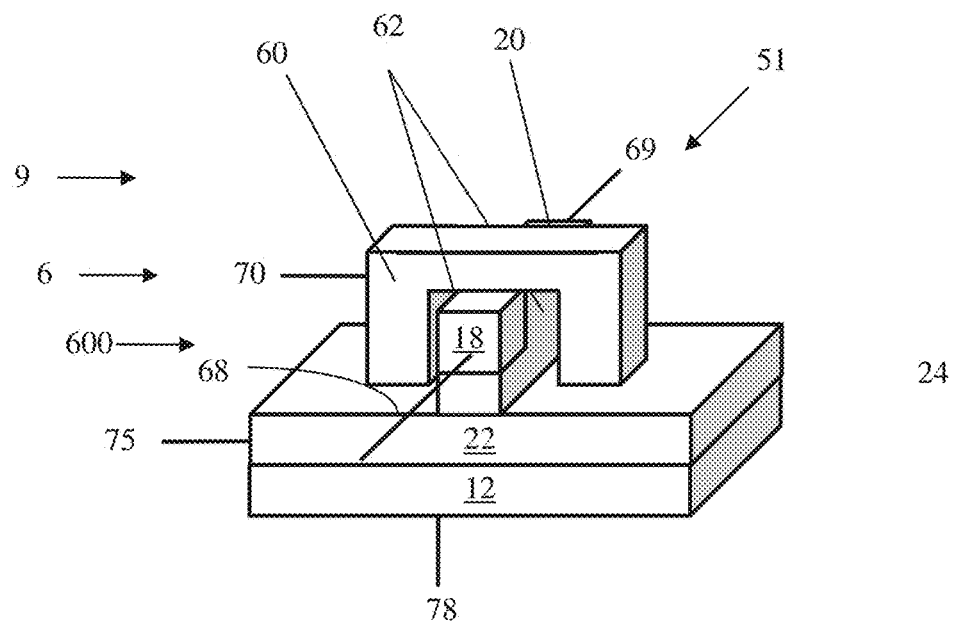
Figure 81:
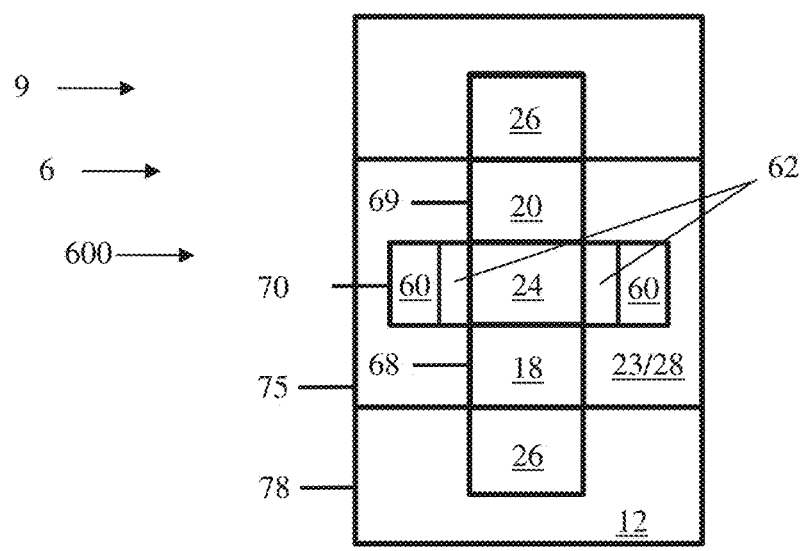
FIG. 81 provides a schematic representation of a top view of the memory cell of FIG. 71.

FIGS. 79-80 provide three-dimensional schematic representations of additional illustrative, non-exclusive examples of transistor 600 according to the present disclosure, while FIG. 81 is a top view of the transistor of FIG. 79. In this embodiment, transistor 600 has a fin structure 51 fabricated on substrate 12 having a first conductivity type (such as p-type conductivity type) so as to extend from the surface of the substrate to form a three-dimensional structure, with fin 51 extending substantially perpendicularly to, and above the top surface of the substrate 12. Fin structure 51 includes first and second regions 18, 20 having the second conductivity type. The floating body region 24 is bounded by the top surface of the fin 51, the first and second regions 18, 20 and insulating layers 26 and 28 (insulating layers 26 and 28 can be seen in the top view of FIG. 81).

Insulating layers 26 insulate region 18 and floating body 24 of transistor 600 from region 20 and floating body 24 of neighboring transistor 600 and insulate buried well 23 of transistor 600 from buried well 23 of neighboring transistor 600 when multiple transistors 600 are joined to make a memory device (array 81). Insulating layers 28 insulate regions 18, 20 and floating body 24 of transistor 600 from regions 18, 20 and floating body 24 of neighboring transistor 600 when multiple transistors 600 are joined to make a memory device (array 81). Insulating layers 28 may be orthogonal to insulating layers 26. The trench isolation 26 in transistor 600 ends in substrate 12.

The orthogonal trench isolation 28 in transistor 600 is shallower and ends in the buried well layer 23. A buried layer 23 of the second conductivity type is also provided in substrate 12, as shown. Transistor 600 further includes gate 60 on two opposite sides of the floating substrate region 24 as shown in FIG. 79. Alternatively, gate 60 may enclose three sides of the floating substrate region 24 as shown in FIG. 80. Gate 60 is insulated from floating body 24 by insulating layer 62. Gate 60 is positioned between the first and second regions 18, 20, adjacent to the floating body 24. Memory cells 9 including transistor 600 with fin 51 may include several terminals: terminals 68 and 69, gate assist (GA) terminal 70, buried well (BW) terminal 75 and substrate terminal 78.

Figure 82:
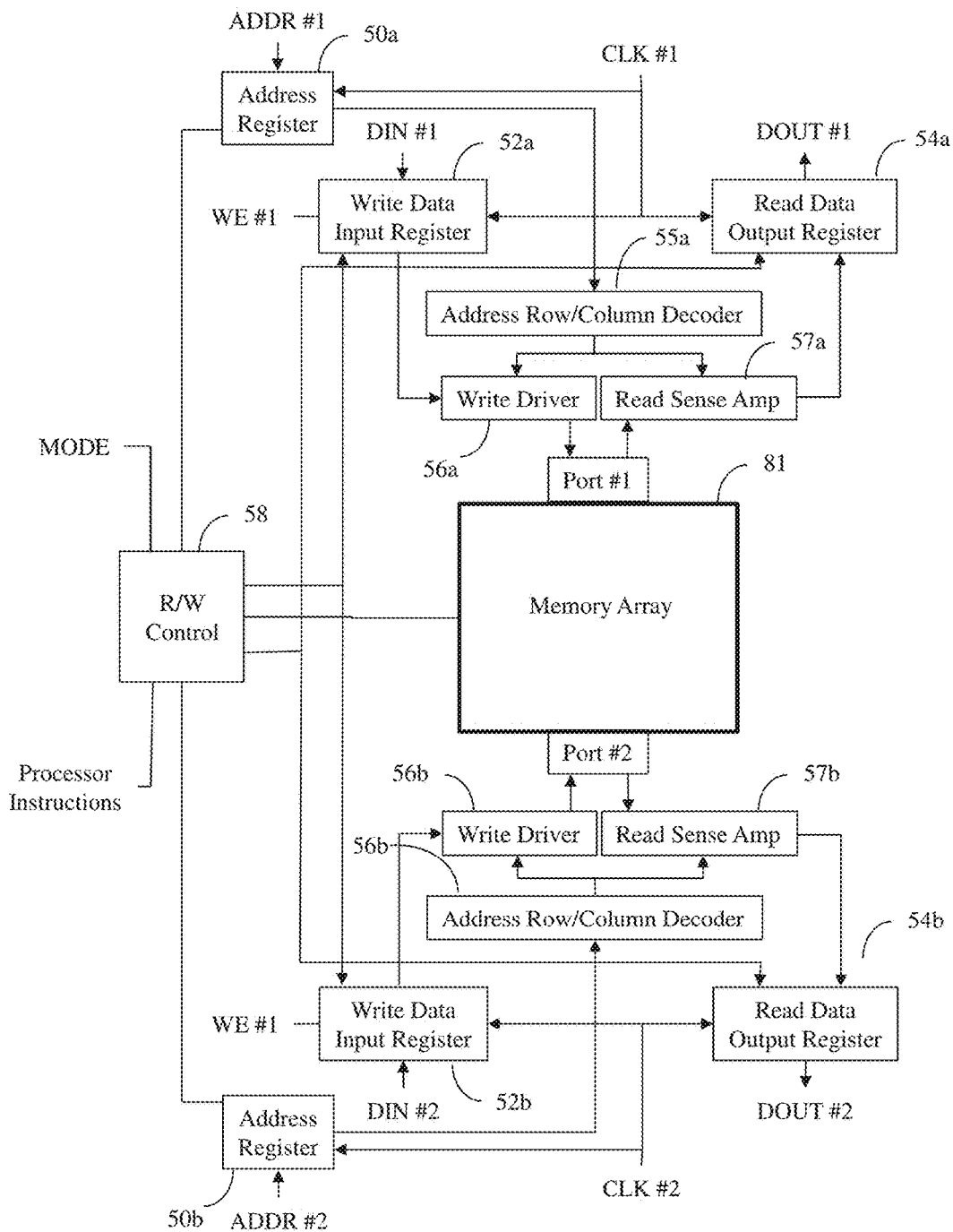
FIG. 82 provides a schematic representation of an illustrative, non-exclusive example of a true dual-port memory that may include the memory cells according to the present disclosure.

FIG. 82 shows an embodiment of a true dual-port memory using memory arrays 81 described above with its control circuitry, where port #1 and port #2 have independent access to the memory array as described above. The memory array block in FIG. 82 may include any of the above described arrays 81 including memory cells 1, 2, 3, 4, 5, and/or 6 of the present disclosure. The Read/Write Control (R/W Control 58) circuitry is responsible for conflict resolution when either port #1 or port #2 is or both port #1 and port #2 are performing write operation to the same memory cell 1, 2, 3, 4, 5, and/or 6 in array 81.

Control 58 regulates the following conflict resolutions: read before write, write before read, write port #1 before write port #2, and write port #2 before write port #1 based on the MODE input signaling. 'Read before write' represents the condition where the read operation by one of port #1 or port #2 takes precedence and must be completed before a write operation from the other port can commence on the same memory cell in the same clock cycle. 'Write before read' represents the condition where the write operation by one of port #1 or port #2 takes precedence and must be completed before a read operation from the other port can commence on the same memory cell in the same clock cycle.

'Write port #1 before write port #2' represents the condition where write operation by port #1 takes precedence and must be completed before write operation by port #2 can commence on the same memory cell in the same clock cycle. 'Write port #2 before write port #1' represents the condition where write operation by port #2 takes precedence and must be completed before write operation by port #1 can commence on the same memory cell in the same clock cycle.

Read operation is performed by asserting the address lines on port #1 and/or port #2 through Address Registers 50a/50b. The Address Row/Column Decoder 55a/55b decodes the Address Registers 50a/50b outputs and selects the intended memory cell by providing the proper voltage biases as described above. The resulting bit line current is sensed by the Read Sense Amp 57a/57b, which is then driven to Read Data Output Registers 54a/54b.

Write operation is performed by asserting the address lines on port #1 and/or port #2 to the Address Registers 50a/50b and the data lines on port #1 and/or port #2 to the Data Input Registers 52a/52b. The Address Row/Column Decoder 55a/55b decodes the Address Registers 50a/50b outputs and selects the intended memory cell by providing the proper voltage biases as described above. When Write Enable signal (WE) is asserted, data from the Data Input Registers 52a/52b are latched into the memory array through the Write Driver 56a/56b.

Figure 83:
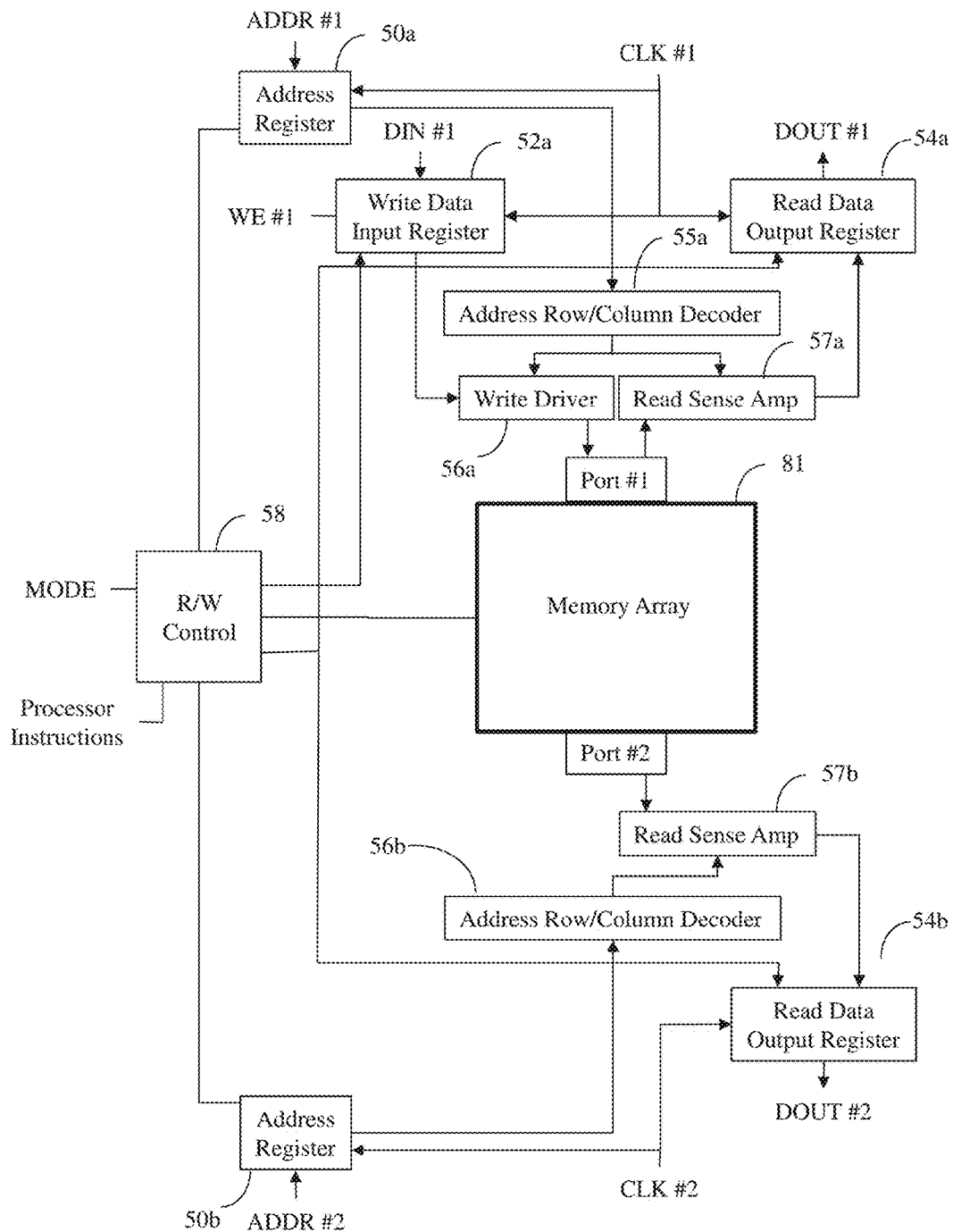
FIG. 83 provides a schematic representation of another illustrative, non-exclusive example of a true deal-port memory that may include the memory cells according to the present disclosure.

Alternatively, FIG. 83 shows another embodiment of a dual-port memory circuitry, where only one of port #1 or port #2 has read and write operation ability and the other port only has read operation ability. FIG. 83 shows an example where port #1 has full read and write control circuitry as described above and port #2 has the read data output circuitry but not the write data input circuitry. Read, write and conflict resolution operations are the same as described above with the exception of the 'write port #1 before write port #2' and 'write port #2 before write port #1' modes, where they become unnecessary.

Figure 84:
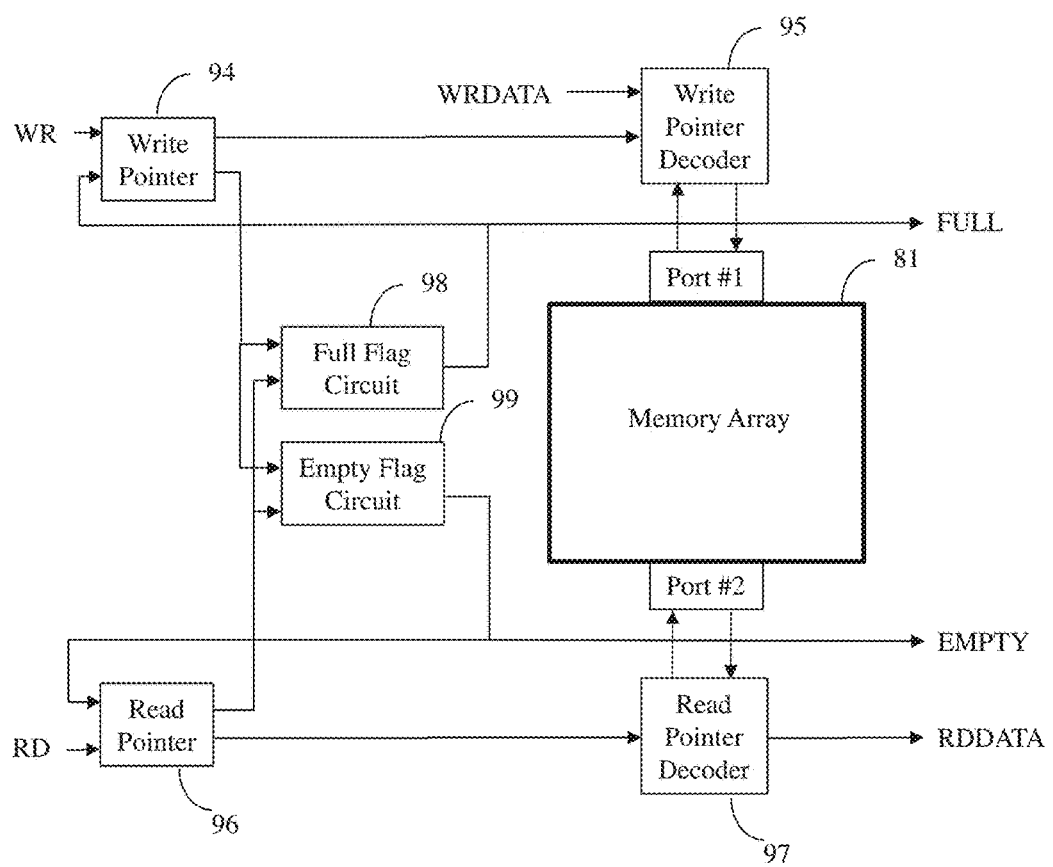
FIG. 84 provides a schematic representation of an illustrative, non-exclusive example of a first-in-first-out memory circuitry that may include the memory cells according to the present disclosure.

FIG. 84 shows an embodiment of a First-In-First-Out (FIFO) memory circuitry using the memory arrays 81 described above with port #1 serving as write port and port #2 operating as read port. The memory array block in FIG. 81 may be any array 81. Similar asynchronous FIFO circuits were described in "Asynchronous FIFO Circuit and Method of Reading and Writing Data Through Asynchronous FIFO Circuit" U.S. Pat. No. 6,810,468 B2 by Miyamoto et al. In our present disclosure, the memory array uses the dual port memory array 81 as discussed in more detail herein.

The write operation to the FIFO circuit is initiated by asserting the WR signal to the Write Pointer circuit 94 along with its write data value to the Write Pointer Decoder circuit 95 into port #1 of array 81. The Write Pointer circuit 94 includes a counter that increments the memory address location within array 81 for each write operation performed. Write Pointer Decoder circuit 95 determines the memory cell location to write to within the array 81 and provides the proper write voltage biases to memory cell 1, 2, 3, 4, 5, and/or 6 terminals as described above. The read operation from the FIFO circuit is initiated by asserting the RD signal to the Read Pointer circuit 96. The Read Pointer Decoder circuit 97 then determines the memory cell location within array 81 to be read out. The Read Pointer circuit 96 includes a counter that increments the memory address location within the array 81 for each read operation performed. The Read Pointer Decoder circuit 97 determines the memory cell location to read from within the array 81 and provides the proper write voltage biases to memory cell 1, 2, 3, 4, 5, and/or 6 terminals as described above.

Full Flag circuit 98 provides the flag signals necessary to indicate the external controlling entity when the FIFO memory is full or nearing full based on the pace of read and write counter increments. When the FIFO buffer is full, the Full Flag circuit 98 also stops further write operations to the memory array 81 to avoid buffer overflow. Empty Flag circuit 99 provides the flag signals necessary to indicate the external controlling entity when the FIFO memory is empty or nearing empty based on the pace of read and write counter increments. When the FIFO buffer is empty, the Empty Flag circuit 99 also stops further read operations to the memory array 81 to avoid invalid data read. In another embodiment of the FIFO circuit above, port #1 of array 81 may be used for read operation and port #2 of array 81 may be used for write operation.

As discussed in more detail herein, the specific biasing conditions, or voltages, that are presented herein for the various embodiments of memory cells 9 and/or arrays 81 of memory cells 9 are illustrative, non-exclusive examples and their magnitudes may vary based upon a variety of factors. Thus, other biasing conditions are also within the scope of the present disclosure.

Memory cells 9, arrays 81, and/or memory devices 10 according to the present disclosure may be utilized for any suitable purpose and/or may form a portion of any suitable electronic device. These electronic devices may include additional hardware, illustrative, non-exclusive examples of which include one or more microprocessors, logic circuits, user interfaces, displays, input devices, output devices, storage devices, and/or power supply devices. Illustrative, non-exclusive examples of electronic devices according to the present disclosure include any suitable printed circuit board, computer, personal computer, laptop computer, and/or cellular telephone.

As used herein, the term "configured" means that the element, component, and/or subject matter is designed and/or intended to perform a given function. This, the term "configured" should not be construed to mean that a given element, component, or other subject matter is simply "capable of" performing a given function but that the element, component, or other subject matter is specifically selected, created, implemented, utilized, programmed and/or designed for the purpose of performing the function.

Illustrative, non-exclusive examples of systems and methods according to the present disclosure are presented in the following enumerated paragraphs.

A1. A semiconductor memory cell comprising: a plurality of gates; and a common body region that is configured to store a charge that is indicative of a memory state of the semiconductor memory cell.

A2. The semiconductor memory cell of paragraph A1, the common body region comprises a first conductivity type, and further wherein the semiconductor memory cell includes a plurality of conductive regions of a second conductivity type.

B1. A semiconductor memory cell comprising: a plurality of transistors, wherein each of the plurality of transistors includes a common body region that is configured to store a charge that is indicative of a memory state of said semiconductor memory cell.

B2. The semiconductor memory cell of paragraph B1, wherein common body region is shared among the plurality of transistors.

B3. The semiconductor memory cell of any of paragraphs B1-B2, wherein at least two of the plurality of transistors is electrically connected in series.

B4. The semiconductor memory cell of any of paragraphs B1-B3, wherein the plurality of transistors comprises a plurality of field effect transistors, and optionally wherein the plurality of transistors includes a plurality of metal oxide semiconductor field effect transistors.

B5. The semiconductor memory cell of any of paragraphs B1-B4, wherein the plurality of transistors includes a plurality of bipolar devices.

B6. The semiconductor memory cell of any of paragraphs B1-B5, wherein the plurality of transistors comprises a plurality of gates.

B7. The semiconductor memory cell of any of paragraphs B1-B6, wherein said common body region comprises a first conductivity type, and thither wherein the semiconductor memory cell includes a plurality of conductive regions of a second conductivity type.

B8. The semiconductor memory cell of paragraph B7, wherein at least one of the plurality of conductive regions of the second conductivity type is shared between at least two, and optionally between two, of the plurality of transistors.

C1. A semiconductor memory cell comprising: a common body region; and a plurality of bipolar devices electrically connected in series, wherein the common body region is shared among the plurality of bipolar devices and configured to store a charge that is indicative of a memory state of the semiconductor memory cell.

C2. The semiconductor memory cell of paragraph C1, wherein the semiconductor memory cell further includes a plurality of gates.

C3. The semiconductor memory cell of any of paragraphs C1-C2, wherein the common body region includes a common body region of a first conductivity type, and thither wherein the semiconductor memory cell includes a plurality of conductive regions of a second conductivity type.

D1. The semiconductor memory cell of any of paragraphs A1-C3, wherein the semiconductor memory cell further includes a plurality of ports.

E1. A semiconductor memory cell comprising: a plurality of ports; a common body region of a first conductivity type that is configured to store a charge that is indicative of a memory state of the semiconductor memory cell; and a plurality of conductive regions of a second conductivity type.

E2. The semiconductor memory cell of paragraph E1, wherein the semiconductor memory cell further includes a plurality of gates.

F1. The semiconductor memory cell of any of paragraphs A1-A2, B6-B8, C2-C3, or E2.

F2. The semiconductor memory cell of paragraph F1, wherein each of the plurality of gates is capacitively coupled to the common body region.

F3. The semiconductor memory cell of any of paragraphs F1-F2, wherein the each of the plurality of gates is electrically insulated from the common body region by a dielectric material.

F4. The semiconductor memory cell of paragraph F3, wherein the dielectric material includes at least one of an electrically insulating material, silicon oxide, a high-K dielectric material, tantalum peroxide, titanium oxide, zirconium oxide, hafnium oxide, and aluminum oxide.

F5. The semiconductor memory cell of any of paragraphs F1-F4, wherein each of the plurality of gates is configured to provide at least one, and optionally both, of read access from and write access to the semiconductor memory cell.

F6. The semiconductor memory cell of any of paragraphs F1-F5, wherein each of the plurality of gates is configured to provide at least one, and optionally both, of read access from and write access to the semiconductor memory cell independent of the other of the plurality of gates.

F7. The semiconductor memory cell of any of paragraphs F1-F6, wherein all of the plurality of gates are configured to provide read access from the semiconductor memory cell simultaneously.

F8. The semiconductor memory cell of any of paragraphs A2, B8-B9, C3, or E1-E2.

F9. The semiconductor memory cell of paragraph F8, wherein the plurality of regions of the second conductivity type are electrically coupled to the common body region.

F10. The semiconductor memory cell of any of paragraphs A2, B8-B9, C3, or E2.

F11. The semiconductor memory cell of paragraph F10, wherein the plurality of gates is spaced apart on a surface of the semiconductor memory cell, wherein the plurality of regions of the second conductivity type are exposed at the surface of the semiconductor memory cell, and further wherein one of the plurality of regions of the second conductivity type separates each of the plurality of gates from the other of the plurality of gates.

F12. The semiconductor memory cell of any of paragraphs F10-F11, wherein the semiconductor memory cell includes an even number of gates, and further wherein a number of regions of the second conductivity type is one more than the number of gates.

F13. The semiconductor memory cell of any of paragraphs A1-F12, wherein the semiconductor memory cell includes a fin structure, and optionally wherein the fin structure extends from a substrate.

F14. The semiconductor memory cell of paragraph F13 when dependent from any of paragraphs F1-F7, wherein the plurality of gates extends from the substrate.

F15. The semiconductor memory cell of paragraph F14, wherein the fin structure includes a plurality of sides, and further wherein each of the plurality of gates is present on at least two, and optionally three, of the plurality of sides.

F16. The semiconductor memory cell of any of paragraphs F14-F15, wherein the fin structure includes a longitudinal axis, and further wherein the plurality of gates is spaced apart along the longitudinal axis of the fin structure.

F17. The semiconductor memory cell of any of paragraphs F1-F16, wherein the plurality of gates is coplanar, and optionally wherein a cross-section of the semiconductor memory cell passes through the common body region and each of the plurality of gates.

G1. A semiconductor memory cell comprising: a plurality of ports; a floating body transistor, wherein the floating body transistor includes a floating body region that is configured to store a charge that is indicative of a memory state of the semiconductor memory cell; and a plurality of access transistors, wherein each of the plurality of access transistors corresponds to a respective one of the plurality of ports.

G2. The semiconductor memory cell of paragraph G1, wherein a number of the plurality of access transistors is equal to a number of the plurality of ports.

G3. The semiconductor memory cell of any of paragraphs G1-G2, wherein the plurality of access transistors and the floating body transistor are electrically connected in series.

G4. The semiconductor memory cell of any of paragraphs G1-G3, wherein the floating body transistor is configured to receive an electric signal from a first access transistor of the plurality of access transistors and to provide the electric signal to a second access transistor of the plurality of access transistors.

G5. The semiconductor memory cell of any of paragraphs G1-G4, wherein the floating body transistor electrically separates a first access transistor of the plurality of access transistors from a second access transistor of the plurality of access transistors.

G6. The semiconductor memory cell of any of paragraphs G1-G5, wherein the semiconductor memory cell further includes a gate.

G7. The semiconductor memory cell of paragraph G6, wherein the gate is capacitively coupled to the floating body region.

G8. The semiconductor memory cell of any of paragraphs G6-G7, wherein the gate is electrically insulated from the floating body region by a dielectric material.

G9. The semiconductor memory cell of paragraph G8, wherein the dielectric material includes at least one of an electrically insulating material, silicon oxide, a high-K dielectric material, tantalum peroxide, titanium oxide, zirconium oxide, hafnium oxide, and aluminum oxide.

G10. The semiconductor memory cell of any of paragraphs G1-G9, wherein the floating body region includes a floating body region of a first conductivity type, and further wherein the semiconductor memory cell includes a plurality of conductive regions of a second conductivity type.

G11. The semiconductor memory cell of any of paragraphs G1-G10, wherein the semiconductor memory cell includes a fin structure, and optionally wherein the fin structure extends from a substrate.

G12. The semiconductor memory cell of any of paragraphs G1-G11, wherein the gate extends from the substrate.

G13. The semiconductor memory cell of paragraph G12, wherein the fin structure includes a plurality of sides, and further wherein the gate is present on at least two, and optionally three, of the plurality of sides.

H1. The semiconductor memory cell of any of paragraphs A1-G13, wherein the common body region is electrically floating, and optionally wherein the common body region is a floating body region.

H2. The semiconductor memory cell of any of paragraphs A1-H1, wherein the semiconductor memory cell is formed on a/the substrate.

H3. The semiconductor memory cell of paragraph H2, wherein the substrate includes at least one of a bulk silicon subs hate and a silicon on insulator substrate.

H4. The semiconductor memory cell of any of paragraphs H2-H3, wherein the substrate includes at least one of a substrate of a/the first conductivity type and a subs hate of a/the second conductivity type.

H5. The semiconductor memory cell of any of paragraphs H2-H4, wherein the common body region is configured to retain a charge, wherein the substrate includes a substrate terminal configured to receive a substrate bias voltage, and further wherein the substrate terminal is configured to at least one of inject a charge into and extract the charge out of the common body region to maintain said memory state of the semiconductor memory cell.

H6. The semiconductor memory cell of any of paragraphs A1-H5, wherein the semiconductor memory cell further includes a buried layer region.

H7. The semiconductor memory cell of paragraph H6 when dependent from any of paragraphs H2-H5, wherein the buried layer region is located between the common body region and the substrate.

H8. The semiconductor memory cell of any of paragraphs H6-H7 when dependent from any of paragraphs H2-H5, wherein the buried layer region separates the common body region from the substrate.

H9. The semiconductor memory cell of any of paragraphs H6-H8 when dependent from any of paragraphs H2-H5, wherein the buried layer region includes a dielectric layer, and optionally wherein the buried layer region is configured to electrically isolate the common body region from the substrate.

H10. The semiconductor memory cell of any of paragraphs A6-H9, wherein the buried layer region includes a conductive buried layer.

H11. The semiconductor memory cell of paragraph H10 when dependent from any of paragraphs H2-H9, wherein the buried layer region includes a conductive buried layer region of the second conductivity type, and further wherein the substrate includes a substrate of the first conductivity type.

H12. The semiconductor memory cell of paragraph H11, wherein the buried layer region, the substrate, and the common body region form a bipolar device.

H13. The semiconductor memory cell of any of paragraphs H11-H12 when dependent from any of paragraphs H2-H5, wherein the buried layer region and the subs hate form a diode.

H14. The semiconductor memory cell of any of paragraphs H11-H13, wherein the buried layer region and the common body region form a diode.

H15. The semiconductor memory cell of any of paragraphs H11-H14, wherein the common body region is configured to retain a charge, wherein the conductive buried layer region includes a conductive buried layer region terminal configured to receive a buried layer bias voltage, and further wherein the conductive buried layer region terminal is configured to at least one of inject a charge into and extract the charge out of said common body region to maintain said memory state of the semiconductor memory cell.

H16. The semiconductor memory cell of any of paragraphs A1-H15, wherein the first conductivity type is one of p-type and n-type, and further wherein the second conductivity type is the other of p-type and n-type.

H17. The semiconductor memory cell of any of paragraphs A1-H16, wherein the semiconductor memory cell includes a/the fin structure, and optionally wherein the fin structure extends from a/the subs hate.

H18. The semiconductor memory cell of paragraph H17, wherein the fin structure includes the common body region.

H19. The semiconductor memory cell of any of paragraphs H17-H18, wherein the fin structure includes a/the plurality of conductive regions.

H20. The semiconductor memory cell of any of paragraphs H17-H19, wherein the fin structure is formed on a/the substrate.

H21. The semiconductor memory cell of paragraph H20, wherein the fin structure includes an elongate fin structure that includes a plurality of surfaces, and thither wherein a selected one of the plurality of surfaces is defined by the substrate.

H22. The semiconductor memory cell of any of paragraphs A1-H21, wherein a/the plurality of conductive regions interfaces with the common body region.

H23. The semiconductor memory cell of any of paragraphs A1-H22, wherein a/the plurality of conductive regions is in electrical communication with the common body region, and optionally wherein the plurality of conductive regions is in direct electrical communication with the common body region.

H24. The semiconductor memory cell of any of paragraphs A1-H23, wherein a/the plurality of conductive regions forms a plurality of P—N diodes with the common body region.

H25. The semiconductor memory cell of any of paragraphs A1-H24, wherein each of a/the plurality of conductive regions is spaced apart from the other of the plurality of conductive regions.

H26. The semiconductor memory cell of paragraph H25, wherein at least a portion of the common body region separates each of the plurality of conductive regions from the other of the plurality of conductive regions.

H27. The semiconductor memory cell of any of paragraphs H22-H26, wherein each of the plurality of conductive regions is not in direct electrical communication with the other of the plurality of conductive regions.

H28. The semiconductor memory cell of any of paragraphs H22-H27, wherein at least a first conductive region of the plurality of conductive regions is exposed at a/the surface of a/the substrate.

H29. The semiconductor memory cell of paragraph H28, wherein the buried layer region, the common body region, and the at least a first conductive region of the plurality of conductive regions that is exposed at the surface of the substrate form a bipolar device.

H30. The semiconductor memory cell of any of paragraphs H28-H29, wherein the substrate, the buried layer region, the common body region, and the at least a first conductive region of the plurality of conductive regions that is exposed at the surface of the substrate form a silicon controlled rectifier device.

H31. The semiconductor memory cell of any of paragraphs H22-H27, wherein at least a first conductive region of the plurality of conductive regions is beneath a/the surface of a/the substrate.

H32. The semiconductor memory cell of any of paragraphs A1-H31, wherein a/the plurality of conductive regions is coplanar, and optionally wherein a cross-section of the semiconductor memory cell passes through the common body region and each of the plurality of conductive regions.

I1. A multi-port semiconductor memory cell comprising: the semiconductor memory cell of any of paragraphs A1-H32.

I2. The multi-port semiconductor memory cell of paragraph I1, wherein the multi-port semiconductor memory cell includes a number of ports, wherein the multi-port semiconductor memory cell includes a number of gates, and thither wherein the number of ports is equal to the number of gates.

I3. The multi-port semiconductor memory cell of paragraph I2, wherein the multi-port semiconductor memory cell includes an even number of gates and an even number of ports.

I4. The multi-port semiconductor memory cell of any of paragraphs I1-I3, wherein the multi-port semiconductor memory cell includes a/the plurality of conductive regions of a/the second conductivity type, and further wherein a number of conductive regions of the second conductivity type is one more than a number of ports.

I5. The multi-port semiconductor memory cell of any of paragraphs I1-I4, wherein the multi-port semiconductor memory cell includes a/the plurality of ports, and further wherein the plurality of ports is coplanar, and optionally wherein a cross-section of the multi-port semiconductor memory cell passes through the common body region and each of the plurality of ports J1. A memory device comprising: a plurality of memory cells, wherein the plurality of memory cells includes the semiconductor memory cell of any of paragraphs A1-I5; a write circuit that is configured to write a desired memory state to the plurality of memory cells; a read circuit that is configured to determine a current memory state of the plurality of memory cells; and an input output interface that is configured to receive the desired memory state from an external device and to provide the current memory state to the external device.

J2. An electronic device comprising: the memory device of paragraph J1; and a logic circuit.

J3. The electronic device of paragraph J2, wherein the logic circuit forms a portion of a microprocessor.

J4. The electronic device of any of paragraphs J2-J3, wherein the electronic device further includes at least one of a user interface, a display, an input device, an output device, a storage device, and a power supply.

J5. The electronic device of any of paragraphs J2-J4, wherein the electronic device includes at least one of a printed circuit board, a computer, a personal computer, a laptop computer, and a cellular telephone.

INDUSTRIAL APPLICABILITY

The systems and methods disclosed herein are applicable to the electronics industry.

That which is claimed is:
1. An integrated circuit comprising:
a semiconductor memory array comprising a plurality of multi-port semiconductor memory cells arranged in a matrix of rows and columns, wherein each said multi-port semiconductor memory cell comprises:
a plurality of gates;
a common body region of a first conductivity type configured to store a charge that is indicative of a memory state of said memory cell;
a plurality of conductive regions of a second conductivity type,
wherein adjacent ones of each of said plurality of gates are separated by a respective one of the plurality of conductive regions, and wherein the common body region extends continuously beneath at least one of the plurality of conductive regions;
at least one of said plurality of conductive regions electrically connected to a back bias terminal,
wherein applying a voltage to said back bias terminal results in at least two stable common body region charge levels;
wherein said back bias terminal is commonly connected to at least two of said multi-port semiconductor memory cells; and
a control circuit configured to apply a voltage to said back bias terminal.

2. The integrated circuit of claim 1, wherein each of the plurality of gates is configured to provide at least one of read access from and write access to the multi-port semiconductor memory cell independently of all other of the plurality of gates.

3. The integrated circuit of claim 1, wherein each said multi-port semiconductor memory cell includes a total number of ports, said plurality of conductive regions comprises a total number of conductive regions, and said plurality of gates comprises a total number of gates, wherein the total number of ports is equal to the total number of gates, and further wherein the total number of conductive regions is one more than the total number of gates.

4. The integrated circuit of claim 1, wherein the plurality of conductive regions is in electrical communication with the common body region, and further wherein each of the plurality of conductive regions is spaced apart from all others of the plurality of conductive regions.

5. The integrated circuit of claim 1, wherein at least a portion of the common body region separates each of the plurality of conductive regions from all others of the plurality of conductive regions.

6. The integrated circuit of claim 1, wherein the plurality of conductive regions and the common body region form a plurality of diodes.

7. The integrated circuit of claim 1, wherein the multi-port semiconductor memory cell includes a fin structure, and further wherein the fin structure includes the common body region.

8. The integrated circuit of claim 7, wherein the fin structure is an elongate fin structure that includes a longitudinal axis, and further wherein the plurality of gates is spaced apart along the longitudinal axis.

9. The integrated circuit of claim 7, wherein the fin structure further includes the plurality of conductive regions.

10. The integrated circuit of claim 1, wherein said voltage applied to said back bias terminal is a constant positive voltage bias.

11. The integrated circuit of claim 1, wherein said voltage applied to said back bias terminal is a periodic pulse of positive voltage.

12. An integrated circuit comprising:
a semiconductor memory array comprising a plurality of multi-port semiconductor memory cells arranged in a matrix of rows and columns, wherein each said multi-port semiconductor memory cell comprises:
a plurality of transistors, each of the plurality of transistors comprising:
a common body region configured to store a charge that is indicative of a memory state of said multi-port semiconductor memory cell; and
a plurality of gates,
wherein said common body region is shared among the plurality of transistors;
a layer beneath said common body region wherein said common body region is positioned between said plurality of gates and said layer;
a back bias terminal connected to said layer and configured to perform at least one of injecting a charge into and extracting the charge out of the common body region to maintain said memory state of the multi-port semiconductor memory cell resulting in at least two stable common body region charge levels, wherein said back bias terminal is commonly connected to at least two of said multi-port semiconductor memory cells; and
a control circuit configured to apply a voltage to said back bias terminal.

13. The integrated circuit of claim 12, wherein each of the plurality of gates is configured to provide at least one of read access from and write access to the multi-port semiconductor memory cell independently of all other of the plurality of gates.

14. The integrated circuit of claim 12, wherein each said multi-port semiconductor memory cell includes a total number of ports and wherein said plurality of gates consists of a total number of gates, wherein the total number of ports is equal to the total number of gates.

15. The integrated circuit of claim 14, wherein each said multi-port semiconductor memory cell further comprises a total number of conductive regions, wherein said total number of conductive regions is one more than said total number of gates.

16. The integrated circuit of claim 12, wherein the multi-port semiconductor memory cell includes a fin structure, and further wherein the fin structure includes the common body region.

17. The integrated circuit of claim 16, wherein the fin structure is an elongate fin structure that includes a longitudinal axis, and further wherein the plurality of gates is spaced apart along the longitudinal axis.

18. The integrated circuit of claim 16, wherein the fin structure further includes a plurality of conductive regions.

19. The integrated circuit of claim 12, wherein said voltage applied to said back bias terminal is a constant positive voltage bias.

20. The integrated circuit of claim 12, wherein said voltage applied to said back bias terminal is a periodic pulse of positive voltage.

* * * * *